(12) United States Patent
Yamazaki et al.

(10) Patent No.: US 8,182,863 B2
(45) Date of Patent: May 22, 2012

(54) DEPOSITION METHOD AND MANUFACTURING METHOD OF LIGHT-EMITTING DEVICE

(75) Inventors: Shunpei Yamazaki, Tokyo (JP); Tomoya Aoyama, Kanagawa (JP); Takuya Tsurume, Kanagawa (JP); Takao Hamada, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 476 days.

(21) Appl. No.: 12/402,971

(22) Filed: Mar. 12, 2009

(65) Prior Publication Data

US 2009/0233006 A1    Sep. 17, 2009

(30) Foreign Application Priority Data

Mar. 17, 2008    (JP) .................................. 2008-068542

(51) Int. Cl.
 *B05D 5/12*    (2006.01)
(52) U.S. Cl. .......... 427/66; 427/146; 427/595; 427/596; 438/29; 438/22; 438/587
(58) Field of Classification Search .................. None
See application file for complete search history.

(56) References Cited

U.S. PATENT DOCUMENTS

| | | |
|---|---|---|
| 5,851,709 A | 12/1998 | Grande et al. |
| 5,937,272 A | 8/1999 | Tang |
| 6,165,543 A | 12/2000 | Otsuki et al. |
| 6,283,060 B1 | 9/2001 | Yamazaki et al. |
| 6,566,032 B1 | 5/2003 | Boroson et al. |
| 6,610,455 B1 | 8/2003 | Burberry et al. |
| 6,689,492 B1 | 2/2004 | Yamazaki et al. |
| 6,695,029 B2 | 2/2004 | Phillips et al. |
| 6,699,597 B2 | 3/2004 | Bellmann et al. |
| 6,703,179 B2 | 3/2004 | Tyan |
| 6,776,847 B2 | 8/2004 | Yamazaki et al. |

(Continued)

FOREIGN PATENT DOCUMENTS

EP    1 003 354 A1    5/2000

(Continued)

OTHER PUBLICATIONS

Urabe, T. et al, "13.1: Invited Paper: Technological Evolution for Large Screen Size Active Matrix OLED Display," SID '07 Digest: SID International Symposium Digest of Technical Papers, vol. 38, 2007, pp. 161-164.

*Primary Examiner* — Monica A Huson
(74) *Attorney, Agent, or Firm* — Husch Blackwell LLP

(57) ABSTRACT

A first substrate including, on one of surfaces, a light absorption layer having metal nitride and a material layer which is formed so as to be in contact with the light absorption layer is provided; the surface of the first substrate on which the material layer is formed and a deposition target surface of a second substrate are disposed to face each other; and part of the material layer is deposited on the deposition target surface of the second substrate in such a manner that irradiation with laser light having a repetition rate of greater than or equal to 10 MHz and a pulse width of greater than or equal to 100 fs and less than or equal to 10 ns is performed from the other surface side of the first substrate to selectively heat part of the material layer which overlaps with the light absorption layer.

23 Claims, 21 Drawing Sheets

U.S. PATENT DOCUMENTS

| | | |
|---|---|---|
| 6,811,938 B2 | 11/2004 | Tutt et al. |
| 6,844,128 B2 | 1/2005 | Hsu et al. |
| 7,014,978 B2 | 3/2006 | Bellmann et al. |
| 7,223,514 B2 | 5/2007 | Kang et al. |
| 7,265,489 B2 | 9/2007 | Yamasaki et al. |
| 7,276,322 B2 | 10/2007 | Bellmann et al. |
| 7,316,983 B2 | 1/2008 | Yamazaki et al. |
| 7,378,711 B2 | 5/2008 | Suh et al. |
| 7,399,993 B2 | 7/2008 | Matsuda |
| 7,445,825 B2 | 11/2008 | Wolk et al. |
| 7,579,224 B2 | 8/2009 | Kuwabara et al. |
| 7,611,965 B2 | 11/2009 | Suzuki et al. |
| 7,651,896 B2 | 1/2010 | Honda et al. |
| 7,674,749 B2 | 3/2010 | Kang et al. |
| 7,887,987 B2 | 2/2011 | Matsuo |
| 7,927,991 B2 | 4/2011 | Miyairi et al. |
| 7,943,287 B2 | 5/2011 | Yamazaki et al. |
| 7,977,864 B2 | 7/2011 | Bellmann et al. |
| 7,994,021 B2 | 8/2011 | Miyairi et al. |
| 2003/0162108 A1 | 8/2003 | Burberry et al. |
| 2004/0065902 A1 | 4/2004 | Yamazaki et al. |
| 2004/0191564 A1 | 9/2004 | Kim et al. |
| 2004/0217695 A1 | 11/2004 | Yoneda et al. |
| 2005/0005848 A1 | 1/2005 | Yamazaki et al. |
| 2005/0145326 A1 | 7/2005 | Hatwar |
| 2005/0157157 A1 | 7/2005 | Tsukamoto et al. |
| 2006/0008577 A1 | 1/2006 | Wolk et al. |
| 2006/0233950 A1 | 10/2006 | Kim et al. |
| 2006/0243377 A1 | 11/2006 | Matsuo et al. |
| 2006/0246240 A1 | 11/2006 | Matsuda et al. |
| 2006/0246693 A1 | 11/2006 | Tanaka et al. |
| 2007/0080634 A1 | 4/2007 | Wolk |
| 2007/0267953 A1 * | 11/2007 | Seki ............................ 313/292 |
| 2008/0050851 A1 | 2/2008 | Tanaka et al. |
| 2008/0050895 A1 | 2/2008 | Miyairi et al. |
| 2008/0057632 A1 | 3/2008 | Arai et al. |
| 2008/0069980 A1 | 3/2008 | Bellmann et al. |
| 2008/0081115 A1 | 4/2008 | Yamazaki et al. |
| 2008/0124850 A1 | 5/2008 | Takayama et al. |
| 2008/0182349 A1 | 7/2008 | Yamazaki et al. |
| 2008/0227232 A1 | 9/2008 | Yamazaki et al. |
| 2008/0299496 A1 | 12/2008 | Hirakata et al. |
| 2008/0305287 A1 | 12/2008 | Ohata et al. |
| 2009/0073325 A1 | 3/2009 | Kuwabara et al. |
| 2009/0075214 A1 | 3/2009 | Hirakata et al. |
| 2009/0104403 A1 | 4/2009 | Aoyama et al. |
| 2009/0104721 A1 | 4/2009 | Hirakata et al. |
| 2009/0104835 A1 | 4/2009 | Aoyama et al. |
| 2009/0142510 A1 | 6/2009 | Takahashi et al. |
| 2009/0153762 A1 | 6/2009 | Kuwabara et al. |
| 2009/0166563 A1 | 7/2009 | Yokoyama et al. |
| 2009/0169809 A1 | 7/2009 | Yokoyama et al. |
| 2009/0197017 A1 | 8/2009 | Tanaka et al. |
| 2009/0221107 A1 | 9/2009 | Yamazaki et al. |

FOREIGN PATENT DOCUMENTS

| | | |
|---|---|---|
| EP | 1 176 642 A2 | 1/2002 |
| EP | 1 624 485 A2 | 2/2006 |
| JP | 2000-256877 | 9/2000 |
| JP | 2004-103406 | 4/2004 |
| JP | 2006-309995 | 11/2006 |

* cited by examiner

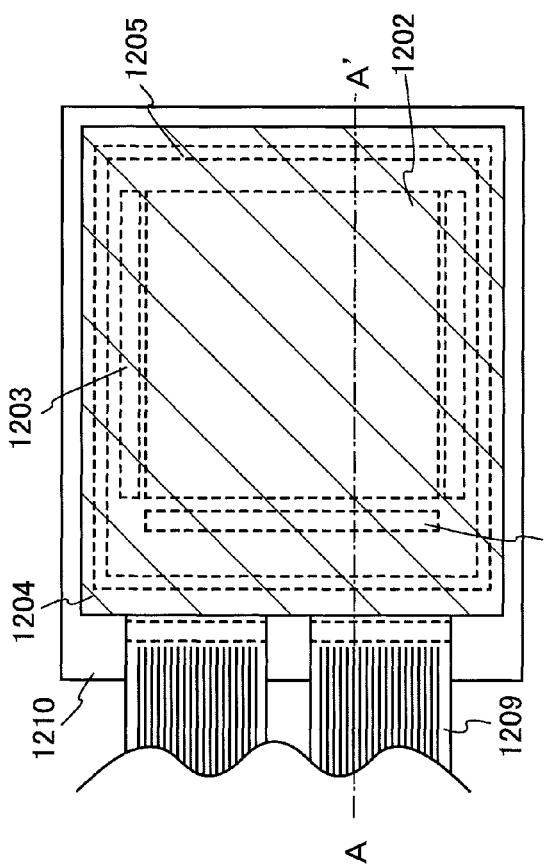
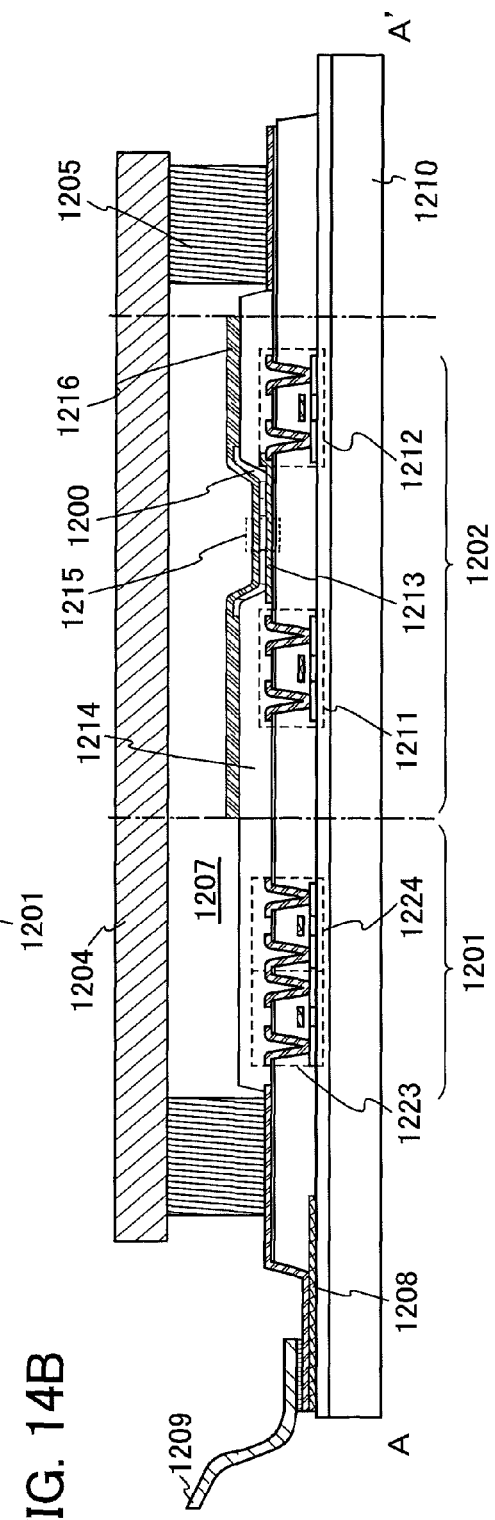
FIG. 14A
FIG. 14B

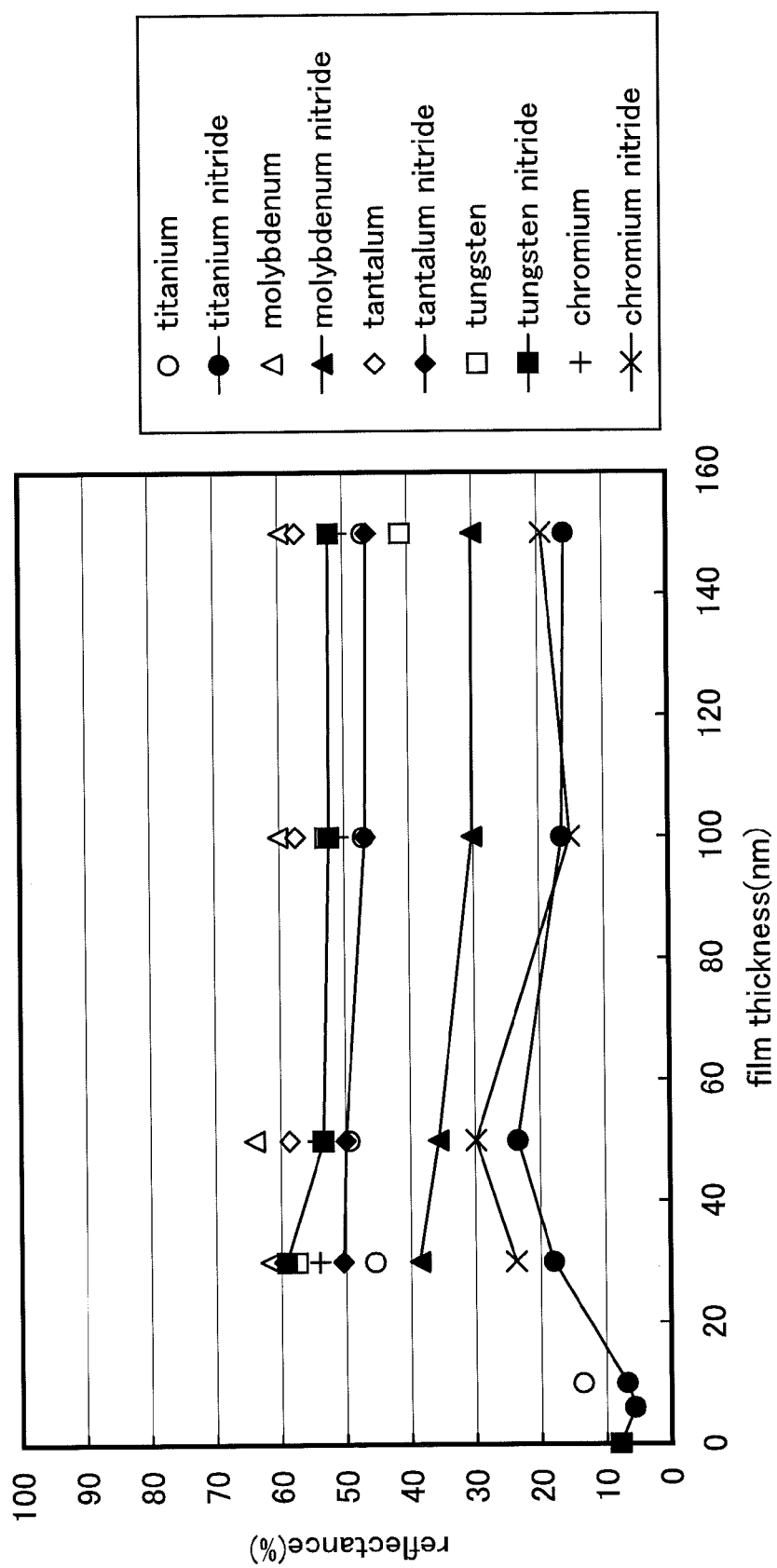

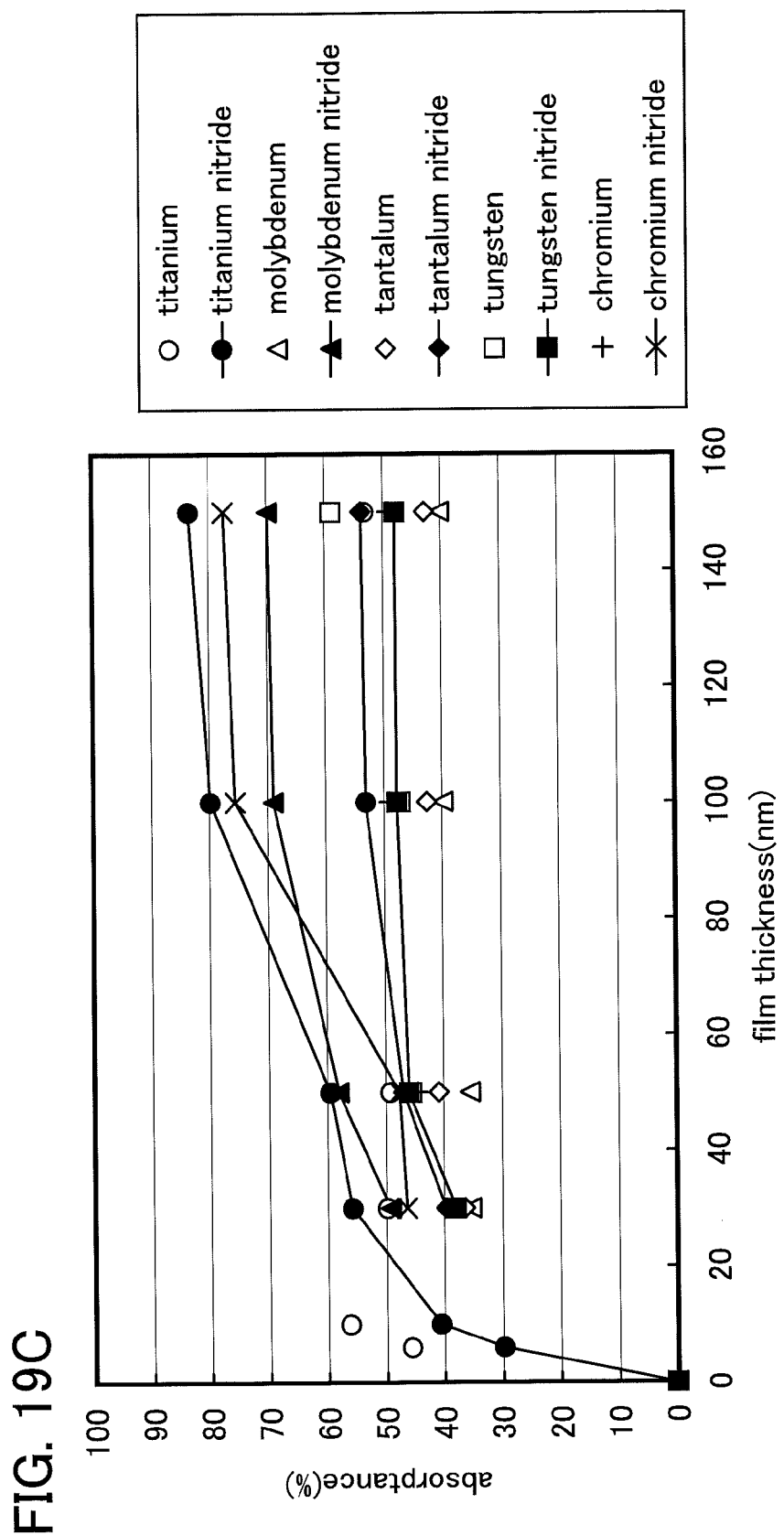

DEPOSITION METHOD AND MANUFACTURING METHOD OF LIGHT-EMITTING DEVICE

BACKGROUND OF THE INVENTION

1. Field of the Invention

The present invention relates to a deposition method and a manufacturing method of a light-emitting device using the deposition method.

2. Description of the Related Art

A light-emitting element using an organic compound as a light-emitting body, which has features such as thinness, lightness, high-speed response, and DC drive at low voltage, is expected to be applied to a next-generation flat panel display. In particular, a display device in which light-emitting elements are arranged in matrix is considered to have advantages in a wide viewing angle and excellent visibility over a conventional liquid crystal display device.

It is said that, as for a light-emitting mechanism of a light-emitting element, an EL layer is interposed between a pair of electrodes and voltage is applied to the EL layer, so that electrons injected from a cathode and holes injected from an anode are recombined in an emission center of the EL layer to form molecular excitons, and the molecular excitons release energy when returning to a ground state; thus, light is emitted. Singlet excitation and triplet excitation are known as excitation states, and it is considered that light can be emitted through either of the two excitation states.

An EL layer included in a light-emitting element includes at least a light-emitting layer. In addition, the EL layer can have a stacked structure including a hole-injecting layer, a hole-transporting layer, an electron-transporting layer, an electron-injecting layer, and/or the like, in addition to the light-emitting layer.

EL materials for forming an EL layer are broadly classified into a low molecular (monomer) material and a macromolecular (polymer) material. In general, a low molecular material is often deposited by an evaporation method and a macromolecular material is often deposited by an ink-jet method, a spin coating method, or the like.

An evaporation apparatus which is used for an evaporation method has a substrate holder to which a substrate is mounted; a crucible (or an evaporation boat) containing an EL material, that is, an evaporation material; a heater for heating the EL material in the crucible; and a shutter for preventing the EL material from being scattered during sublimation. The EL material which is heated by the heater is sublimed and deposited on the substrate. At this time, in order to achieve uniform deposition, a deposition target substrate needs to be rotated and the distance between the substrate and the crucible needs to be about 1 m even when the substrate has a size of 300 mm×360 mm. Accordingly, when the size of a substrate to be processed is increased, the size of an evaporation apparatus needs to be increased further; therefore, it can be thought that there is practically a limitation on the size of a substrate on which deposition can be performed by an evaporation method.

When an evaporation method is employed to manufacture a full-color display device using light-emitting elements having emission colors of red, green, and blue, a shadow mask is provided between the substrate and an evaporation source so as to be in contact with the substrate, and selective coloring can be achieved with this shadow mask.

However, the shadow mask which is used for manufacturing the full-color display device is extremely thin because it is necessary to precisely manufacture an opening. Therefore, when the shadow mask size is increased in accordance with increase in substrate size, there have been problems of bending of the shadow mask, changing of the size of the opening, and the like. Furthermore, since it is difficult to introduce a means which reinforces the strength of the shadow mask in a region which corresponds to a pixel portion of the shadow mask, application of the reinforcing means is also difficult in the case of manufacturing a display region having a large area.

Further, miniaturization of each display pixel pitch is increasingly demanded with high definition of a display device (increase in the number of pixels), and further the shadow mask tends to be thin.

On the other hand, a wet process such as an ink-jet method or a spin coating method can be used even when the size of a substrate is increased; however, it is difficult to form an even film. Further, when a wet process is used, after application of a composition or a solution including an EL material, a baked solvent needs to be removed. Accordingly, when a layer including an EL material is stacked, repetition of an application step and a baking step is needed, which takes much time. Further, when a layer is stacked by a wet process such as an ink-jet method, deposition has to be performed using a solvent which does not dissolve a layer which has already been formed, and the selection range of materials to be used or stacked structures is limited. When the selection range of materials to be used or stacked structures is limited, performance of a light-emitting element (luminous efficiency, lifetime, or the like) is extremely limited. Accordingly, a large defect is caused in improvement in performance of a light-emitting device, such as being unable to apply even a light-emitting element having an excellent structure to a light-emitting device.

Thus, a method for forming an EL layer of a light-emitting element through laser thermal transfer has been proposed (see Patent Document 1: Japanese Published Patent Application No. 2006-309995). Patent Document 1 discloses a transfer substrate which has, over a supporting substrate, a photothermal conversion layer including a low reflective layer and a high reflective layer and a transfer layer. Irradiation of such a transfer substrate with laser light allows the transfer layer to be transferred to an element forming substrate.

SUMMARY OF THE INVENTION

However, the high reflective layer and the low reflective layer of the transfer substrate of Patent Document 1 are stacked on one side of the substrate. Therefore, even with the use of the high reflective layer, a certain degree of heat absorption is conceivable. Thus, when the energy power of laser light is large, not only a portion of the transfer layer over the low reflective layer but also a portion of the transfer layer over the high reflective layer might be transferred.

Further, in the structure illustrated in FIG. 3 of Patent Document 1, a gap should not be generated between the low reflective layer and the high reflective layer, and thus high-accuracy patterning is needed.

Further, in the structure illustrated in FIG. 7 of Patent Document 1, the low reflective layer is patterned, the high reflective layer is then formed over the entire surface, and the transfer layer is then formed. In this structure, heat from the low reflective layer which is heated by absorption of laser light is transferred to the transfer layer through the high reflective layer. Thus, not only a desired portion of the transfer layer but also the transfer layer around the desired portion might be transferred.

Thus, it is an object of the present invention to enable deposition of only a material in a desired region and to enable formation of a minute pattern.

It is another object of the present invention to increase productivity by reduction in time taken for deposition.

According to one aspect of the present invention, a deposition method includes the steps of providing a first substrate including, on one of surfaces, a light absorption layer having metal nitride and a material layer which is formed so as to be in contact with the light absorption layer; disposing the surface of the first substrate on which the material layer is formed and a deposition target surface of a second substrate to face each other; and depositing part of the material layer on the deposition target surface of the second substrate in such a manner that irradiation with laser light having a repetition rate of greater than or equal to 10 MHz and a pulse width of greater than or equal to 100 fs and less than or equal to 10 ns is performed from the other surface side of the first substrate to selectively heat part of the material layer which overlaps with the light absorption layer.

Further, another aspect of the present invention is a method for manufacturing a light-emitting device using the above deposition method. Thus, the method for manufacturing a light-emitting device includes the steps of providing a first substrate including, on one of surfaces, a light absorption layer having metal nitride and a material layer which is formed so as to be in contact with the light absorption layer; disposing the surface of the first substrate on which the material layer is formed and one of surfaces of a second substrate on which a first electrode is formed to face each other; and depositing part of the material layer on the first electrode of the second substrate in such a manner that irradiation with laser light having a repetition rate of greater than or equal to 10 MHz and a pulse width of greater than or equal to 100 fs and less than or equal to 10 ns is performed from the other surface side of the first substrate to selectively heat part of the material layer which overlaps with the light absorption layer.

Moreover, the light absorption layer in any of the above structures has a reflectance of less than or equal to 70% with respect to light. Note that the thickness of the light absorption layer is greater than or equal to 10 nm and less than or equal to 600 nm.

In addition, as the metal nitride in any of the above structures, titanium nitride, tantalum nitride, molybdenum nitride, tungsten nitride, chromium nitride, and the like can be given.

In addition, in any of the above structures, the ratio of the content of nitrogen atoms in the light absorption layer is preferably greater than or equal to 0.1 and less than or equal to 1.3, when the number of metal atoms is considered to be 1. More preferably, the content of nitrogen atoms in the light absorption layer is greater than or equal to 0.8 and less than or equal to 1.2.

Note that in any of the above structures, the light absorption layer is formed in an island-like shape. Alternatively, the light absorption layer is formed in stripes.

Furthermore, in any of the above structures, the material layer preferably includes an organic compound. Note that the case where the material layer includes one of or both a light-emitting material and a carrier-transporting material is also included in the present invention. Further, the material layer is preferably formed by a wet process.

Furthermore, in any of the above structures, the laser light is preferably shaped into linear or rectangular light.

Further, the present invention includes, in its category, an electronic device having a light-emitting device as well as a light-emitting device having a light-emitting element. Therefore, a light-emitting device in this specification refers to an image display device, a light-emitting device, or a light source (including an illumination device in its category). Further, the light-emitting device includes any of the following modules in its category: a module in which a connector such as a flexible printed circuit (FPC), a tape automated bonding (TAB) tape, or a tape carrier package (TCP) is attached to a light-emitting device; a module having a TAB tape or a TCP provided with a printed wiring board at the end thereof; and a module having an integrated circuit (IC) directly mounted on a light-emitting element by a chip on glass (COG) method.

Application of the present invention makes it possible to form a flat even film. In addition, such a film can be deposited on only a desired region, and thus a minute pattern can be formed.

Application of the present invention makes it possible to form a minute pattern, and thus high-definition light-emitting device can be manufactured.

Application of the present invention also makes it possible to reduce the time taken for deposition, which can lead to increase in productivity.

BRIEF DESCRIPTION OF THE DRAWINGS

In the accompanying drawings:

FIGS. 14A and 14B are views illustrating an active matrix light-emitting device;

FIGS. 19A to 19C are graphs each showing a light absorption layer of a deposition substrate in accordance with an embodiment mode of the present invention.

DETAILED DESCRIPTION OF THE INVENTION

Figure 1A:
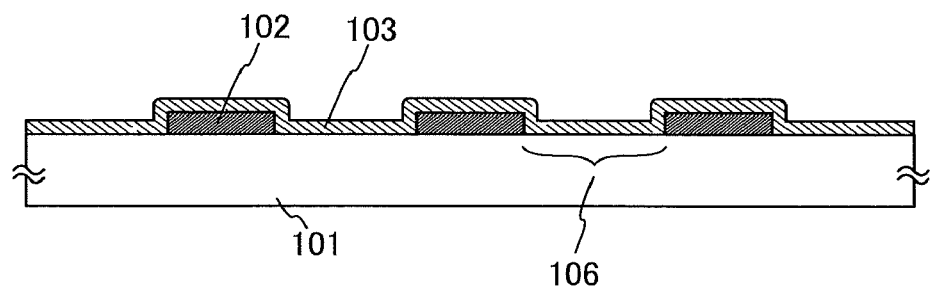
FIGS. 1A to 1C are views illustrating a deposition substrate and a deposition method in accordance with an embodiment mode of the present invention.

Embodiment Modes of the present invention will be hereinafter described in detail with reference to the accompanying drawings. Note that the present invention is not limited to the description below and the modes and details of the present invention can be modified in various ways without departing from the purpose and scope of the present invention. Therefore, the present invention should not be interpreted as being limited to the description below of Embodiment Modes. In the structure of the present invention hereinafter described, reference numerals indicating the same portions are used in common in different drawings.

Embodiment Mode 1

In this embodiment mode, a deposition substrate of the present invention and a deposition method using the deposition substrate will be described. Note that the case where an EL layer of a light-emitting element is formed using a deposition substrate will be described in this embodiment mode. In this specification, a substrate in which a material that is desired to be deposited is provided and which is used for deposition on a deposition target substrate is hereinafter denoted as a "deposition substrate".

FIG. 1A illustrates an example of a deposition substrate. As illustrated in FIG. 1A, a light absorption layer 102 is formed over a first substrate 101 which is a supporting substrate. The light absorption layer 102 is patterned so as to correspond to a region of the deposition target substrate on which deposition is desired to be performed. In FIG. 1A, the light absorption layer 102 is formed so as to have an opening 106. A material layer 103 including a material to be deposited on the deposition target substrate is formed over the light absorption layer 102. In FIG. 1A, the material layer 103 is formed over the entire surface of the first substrate 101.

Note that in the present invention, since light with which the first substrate 101 is irradiated at the time of deposition of the material included in the material layer 103 should be transmitted through the first substrate 101, the first substrate 101 preferably has high light transmittance. That is, in the case of using laser light as the irradiation light, a substrate which transmits laser light is preferably used as the first substrate 101. In addition, the first substrate 101 is preferably formed using a material having low thermal conductivity. With the first substrate 101 having low thermal conductivity, heat obtained from the irradiation light can be efficiently used for the deposition. As the first substrate 101, for example, a glass substrate, a quartz substrate, or the like can be used. Impurities (moisture or the like) are not likely to be adsorbed or attached to a glass substrate, a quarts substrate, or the like, as compared to a film substrate or the like. Accordingly, at the time of the deposition, an impurity can be prevented from entering.

The light absorption layer 102 absorbs the irradiation light at the time of the deposition. Therefore, it is preferable that the light absorption layer 102 be formed using a material which has low reflectance and high absorptance with respect to the irradiation light. Specifically, it is preferable that the light absorption layer 102 have a reflectance of less than or equal to 70% with respect to the irradiation light.

It is preferable to use metal nitride such as titanium nitride, tantalum nitride, molybdenum nitride, tungsten nitride, or chromium nitride for the light absorption layer 102. The irradiation light can be efficiently absorbed and converted into heat by using the metal nitride as the light absorption layer. Note that the content of nitrogen atoms in the light absorption layer may be definite or may have a concentration gradient. Note that when there is the presence of a concentration gradient, it is preferable that there be a larger number of nitrogen atoms on the side of the light absorption layer which is irradiated with light. In addition, it is preferable that the ratio of the content of nitrogen atoms in the light absorption layer be greater than or equal to 0.1 and less than or equal to 1.3, when the number of metal atoms is considered to be 1. More preferably, the content of nitrogen atoms in the light absorption layer is greater than or equal to 0.8 and less than or equal to 1.2.

Next, the reflectance, the transmittance, and the light absorptance of the metal nitride are described.

Figure 17:
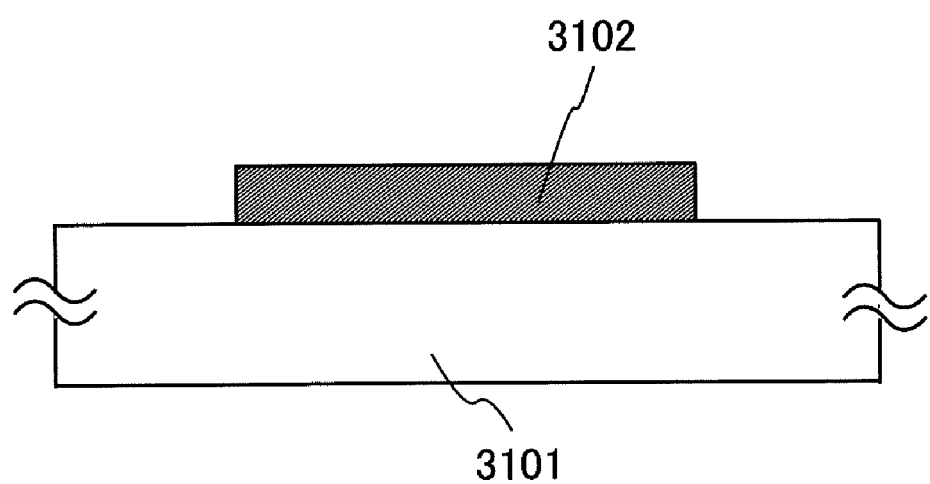
FIG. 17 is a view illustrating a light absorption layer of a deposition substrate in accordance with an embodiment mode of the present invention.

As illustrated in FIG. 17, a metal nitride film 3102 was deposited over a glass substrate 3101 (0.7 mm thick) by a sputtering method. As the metal nitride film 3102, a titanium nitride film, a tantalum nitride film, a tungsten nitride film, a molybdenum nitride film, or a chromium nitride film was used. The metal nitride film 3102 was deposited to have a thickness of 30 nm, 50 nm, 100 nm, or 150 nm. Note that the titanium nitride film was deposited also to have a thickness of 6 nm or 10 nm.

In addition, as a comparison, a titanium film, a tantalum film, a tungsten film, a molybdenum film, or a chromium film was deposited instead of the metal nitride film 3102. The metal film was deposited to have a thickness of 30 nm, 50 nm, 100 nm, or 150 nm. Note that the titanium film was deposited also to have a thickness of 6 nm or 10 nm.

Figure 19A:
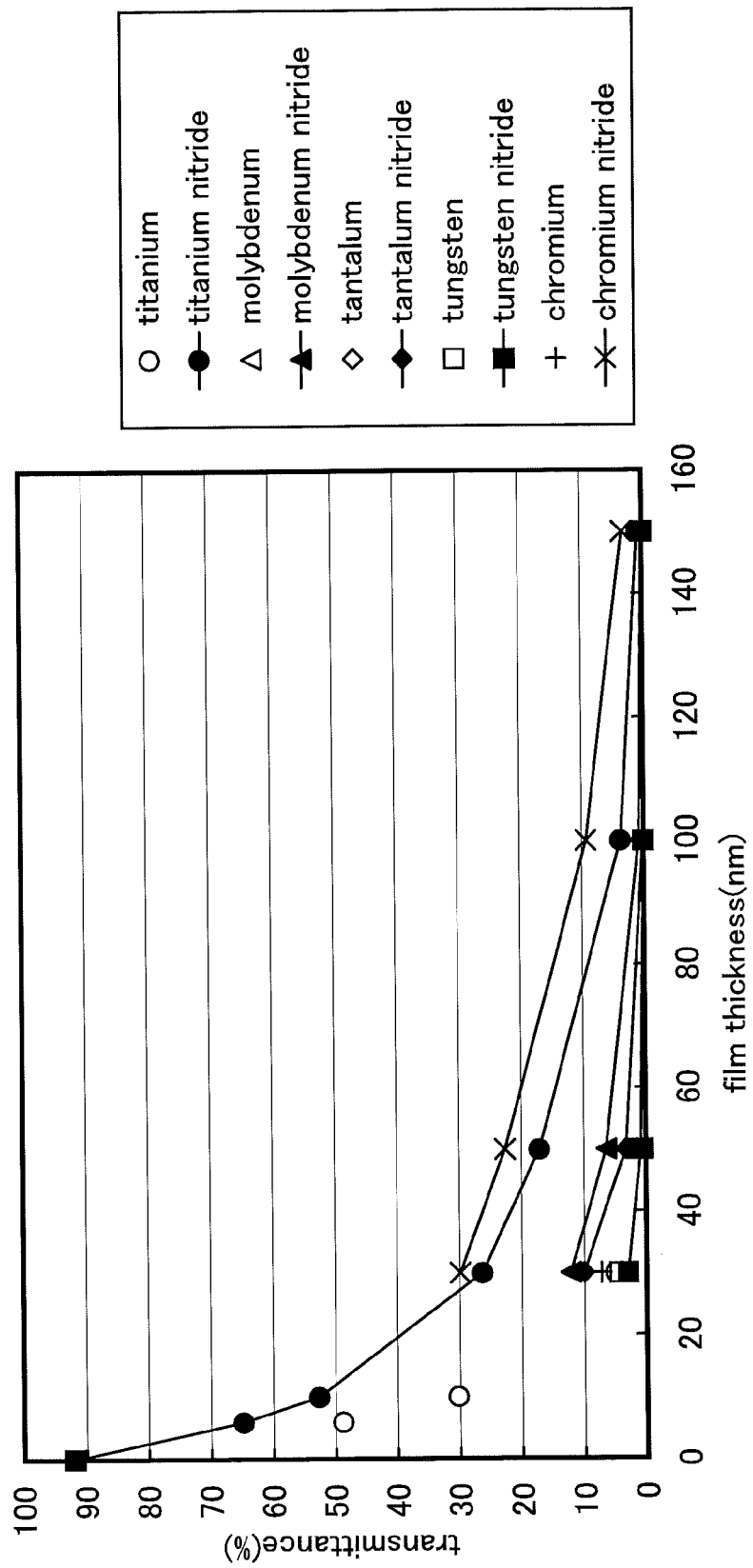

These films were irradiated with light having a 532 nm wavelength to measure the reflectance, the transmittance, and the light absorptance of each film. The measurements were performed using a spectrophotometer U-4000 manufactured by HITACHI under room temperature and atmospheric pressure. The results are shown in FIGS. 19A to 19C. Note that the transmittance, reflectance, and light absorptance were shown in FIG. 19A, FIG. 19B, and FIG. 19C, respectively.

As apparent from FIG. 19C, the metal nitride films have respective high light absorptances as compared to the metal films. Thus, it is apparent that the metal nitride has higher light absorptance than the metal, and the metal nitride is a material which is appropriate to absorb irradiation light to convert into heat as the light absorption layer of the deposition substrate. In particular, both the titanium nitride film and the chromium nitride film have a light absorptance of greater than or equal to 70%, which is preferable as the light absorption layer of the deposition substrate.

In addition, these metal nitride films and metal films are irradiated with light having a wavelength of 532 m and light having a wavelength of 1064 nm, respectively, to measure the reflectance, the transmittance, and the absorptance of each film. The measurements were performed using a spectrophotometer U-4000 manufactured by HITACHI under room temperature and atmospheric pressure. The results are shown in Table 1. The thicknesses of these metal nitride films were each set to 150 nm so as to hardly transmit irradiation light (a wavelength of 532 nm) (so that the transmittances thereof are each less than or equal to 2%) at the time of measurement. In a similar manner, the thicknesses of the metal films were each set to 100 nm so as to hardly transmit irradiation light (a wavelength of 532 nm) (so that the transmittances thereof are each less than or equal to 2%) at the time of measurement.

TABLE 1

|  |  | wavelength 532 nm | | | wavelength 1064 nm | | |
|---|---|---|---|---|---|---|---|
| optical data | | reflectance [%] | transmittance [%] | absorptance [%] | reflectance [%] | transmittance [%] | absorptance [%] |
| metal | titanium | 46.933 | 0.019 | 53.048 | — | — | — |
|  | tantalum | 57.400 | 0.014 | 42.586 | — | — | — |
|  | tungsten | 52.809 | 0.044 | 47.147 | — | — | — |
|  | molybdenum | 60.103 | 0.01 | 39.887 | — | — | — |
|  | chromium | 50.883 | 0.042 | 49.075 | — | — | — |
| metal nitride | titanium nitride | 16.379 | 1.027 | 82.594 | 51.968 | 0.146 | 47.886 |
|  | tantalum nitride | 21.132 | 2.526 | 76.342 | 6.254 | 58.347 | 35.399 |
|  | tungsten nitride | 28.774 | 0.792 | 70.434 | 25.035 | 8.224 | 66.741 |
|  | molybdenum nitride | 30.655 | 0.148 | 69.197 | 31.641 | 2.286 | 66.073 |
|  | chromium nitride | 19.683 | 2.763 | 77.554 | 16.855 | 19.584 | 63.561 |

As apparent from Table 1, when attention is focused on the 532 nm wavelength of the irradiation light, the reflectance of the metal nitride is equal to or less than about 30% and the light absorptance thereof is equal to or greater than about 70%, whereas the reflectance of the metal is greater than 40% and the absorptance thereof is less than 60%. It is apparent that the metal nitride has higher light absorptance than the metal, and the metal nitride is a material which is appropriate to absorb irradiation light to convert into heat as the light absorption layer of the deposition substrate.

In addition, with values of these light absorptances, heat which is generated in the case where the metal nitride is irradiated with light was calculated. Physical properties of the used materials are shown in Table 2.

TABLE 2

| material | thermal conductivity [J/smK] | specific heat [J/gK] | density [g/cm$^3$] | heat diffusivity[1] [m$^2$/s] | ratio of heat diffusivity[2] [—] | absorptance [%] |
|---|---|---|---|---|---|---|
| tungsten | 174 | 0.130 | 19.3 | 6.94e$^{-5}$ | 7.48 | 59.0 |
| chromium | 93.7 | 0.450 | 7.20 | 2.89e$^{-5}$ | 3.12 | 49.1 |
| tantalum | 57.5 | 0.140 | 16.7 | 2.46e$^{-5}$ | 2.65 | 42.8 |
| titanium | 21.9 | 0.520 | 4.54 | 9.28e$^{-6}$ | 1.00 | 53.2 |
| titanium nitride | 19.0 | 0.599 | 5.44 | 5.83e$^{-6}$ | 0.63 | 82.6 |
| tantalum nitride | 5.50 | 0.214 | 14.4 | 1.79e$^{-6}$ | 0.19 | 76.3 |

[1]Heat diffusivity is the value of (thermal conductivity $\lambda$)/(density $\rho$ · specific heat c). This is because the diffusion equation is described as $dT/dt = (\lambda/\rho c)d^2T/dx^2$.
[2]Comparison on the basis of titanium In a manner similar to that of the conditions under which the measurements were actually performed, a 2D model in which the metal nitride film was formed with a thickness of 150 nm over the glass substrate 3101 (0.7 mm thick) as the light absorption layer 3102 was employed as the calculation model. Note that the width of the metal nitride film was set to 21.5 μm. As a comparison, the 2D model in which the metal film was formed with a thickness of 150 nm over the glass substrate 3101 (0.7 mm thick) as the light absorption layer 3102 was employed. Note that the width of the metal film was set to 21.5 μm.

Figure 18:
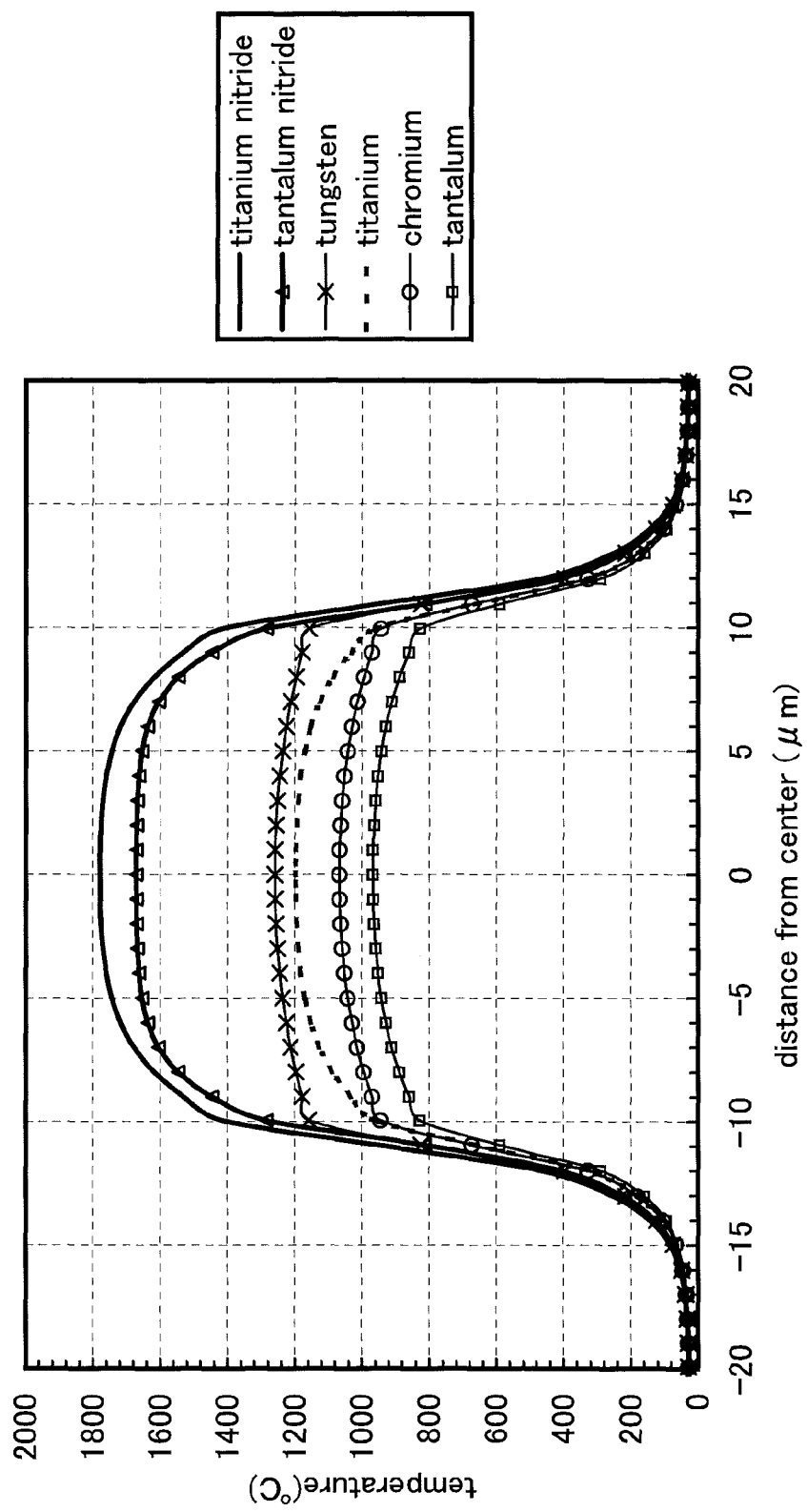
FIG. 18 is a graph showing a light absorption layer of a deposition substrate of in accordance with an embodiment mode the present invention.

The calculation conditions are as follows:
calculation tool: ANSYS
mesh to be used: three-node triangular free mesh, minimum mesh length: 0.05 μm the use of Nonlinear analysis (Newton's method) due to dependence of thermal conduction characteristics on temperature
tolerance for nonlinear convergence: L2 norm, less than or equal to 1.0 e$^{-4}$
movement speed of substrate: 1000 mm/sec
laser power: 12.4 W
size of laser spot: 10 μm×1000 μm
laser wavelength: 532 nm
time interval in nonstationary analysis: 0.125 μs The temperature distribution of a surface which has undergone laser irradiation for 10 μs is shown in FIG. 18. In the calculation in consideration of the absorptance of each material, the magnitude relation of the absorptance accords with the magnitude relation of the calculation value of the surface temperature. From the results in FIG. 18, in the case where laser irradiation is performed under the same conditions, the light absorptance of the metal nitride is higher, which results in higher heat generating temperature than that of the metal material. In particular, titanium nitride having a light absorptance as high as 82.6% has high heat generating temperature, which is a preferable result. In other words, using the metal nitride as the light absorption layer of the deposition substrate means that irradiation light can be efficiently converted into heat to heat the material layer. In addition, since the metal nitride has high light absorptance, the energy of light which is necessary to heat the light absorption layer up to a desired temperature can be reduced by using the metal nitride for the light absorption layer. That is, as compared to the case where the metal is used for the light absorption layer, the energy of light with which the light absorption layer is irradiated can be reduced. Thus, in the case where light sources having the same output are used, the area irradiated with the light can be increased, the time taken for deposition (takt time) can be reduced, which leads to increase in productivity.

Here, the 2D model was used for the verification, and it can be considered that the results well reflect the tendency of the heat generation between the materials exemplified here and other parameters do not have a great influence. Thus, it is preferable to use the metal nitride having high light absorptance for the light absorption layer of the deposition substrate.

Since the metal nitride has lower reflectance than the metal, the light absorptance can be increased by optimizing the thickness so as not to transmit irradiation light. That is, the metal nitride can efficiently absorb irradiation light. In addition, since the metal nitride can efficiently absorb irradiation light, the energy of light which is necessary to heat the light absorption layer up to a desired temperature can be reduced by using the metal nitride for the light absorption layer. That is, as compared to the case where the metal is used for the light absorption layer, the energy of light with which the light absorption layer is irradiated can be reduced. Thus, in the case where light sources having the same output are used, the area irradiated with the light can be increased, the time taken for deposition (takt time) can be reduced, which leads to increase in productivity.

Note that since a kind of material which is suitable for the light absorption layer 102 varies depending on the wavelength of the irradiation light, the material of the light absorption layer 102 should be selected as appropriate. In addition, the light absorption layer 102 is not limited to a single layer and may include a plurality of layers.

Note that the light absorption layer 102 can be formed by any of a variety of kinds of methods. For example, the light absorption layer 102 can be formed by a sputtering method, an electron beam evaporation method, a vacuum evaporation method, or the like.

The thickness of the light absorption layer 102, although it depends on a material, is set so as not to transmit the irradiation light, so that the irradiation light can be converted into heat without being wasted. Accordingly, the light absorption layer 102 preferably has a thickness of greater than or equal to 10 nm and less than or equal to 2 μm. When the thickness of the light absorption layer 102 is smaller, the entire light absorption layer 102 can be heated with light having smaller energy. Accordingly, it is more preferable that the light absorption layer 102 have a thickness of greater than or equal to 10 nm and less than or equal to 600 nm. For example, in the case of performing irradiation with light having a wavelength of 532 nm, the light absorption layer 102 with a thickness of greater than or equal to 50 nm and less than or equal to 200 nm can efficiently absorb the irradiation light to generate heat.

Note that the light absorption layer 102 may transmit part of the irradiation light as long as a material included in the material layer 103 can be heated up to the temperature at which the material can be deposited (the temperature at which at least part of the material included in the material layer 103 is deposited on the deposition target substrate).

The material layer 103 includes a material which is deposited on the deposition target substrate. When the deposition substrate is irradiated with light, the material included in the material layer 103 is heated, so that at least part of the material included in the material layer 103 is deposited on the deposition target substrate. It is considered that when the material layer 103 is heated, at least part of the material included in the material layer 103 is vaporized, or at least part of the material layer 103 is deformed due to heat, and accordingly a film comes off due to change in stress to be deposited on the deposition target substrate.

Note that various kinds of materials can be used as the material included in the material layer 103 regardless of whether they are organic compounds or inorganic compounds as long as the material can be deposited. In the case of forming an EL layer of a light-emitting element as described in this embodiment mode, a material which can be deposited to form an EL layer is used. For example, in addition to an organic compound such as a light-emitting material, a carrier-transporting material, or a carrier-injecting material which forms an EL layer, an inorganic compound which is used for a carrier-injecting layer or an electrode or the like of a light-emitting element, such as metal oxide, metal nitride, metal halide, or an elementary substance of metal, can be used. Note that details of the materials which can be deposited to form an EL layer are given not here but in Embodiment Mode 4; therefore, Embodiment Mode 4 is referred to for the details, and the description is omitted here.

The material layer 103 may contain a plurality of materials. In addition, the material layer 103 may be a single layer or a stack of a plurality of layers. Accordingly, stacking a plurality of layers each including a material enables co-evaporation. Note that in the case where the material layer 103 has a stacked structure, it is preferable that the layers in the material layer 103 be stacked so that a material which can be deposited at a low temperature is included on the first substrate side. Such a structure makes it possible to efficiently perform evaporation using the material layer 103 which has a stacked structure.

Note that as the material layer 103, a material having low absorptance of light whose irradiation is performed at the time of deposition is preferably used. Low absorptance of the irradiation light can suppress heating of the material layer except a desired region due to the irradiation light. Further, low absorptance of the irradiation light can suppress decomposition of a material included in the material layer due to absorption of the light. Further, a material included in the material layer 103 is preferably a material which is not decomposed by the irradiation light.

Further, the material layer 103 is formed by any of a variety of methods. For example, a wet process such as a spin coating method, a spray coating method, an ink-jet method, a dip coating method, a casting method, a die coating method, a roll coating method, a blade coating method, a bar coating method, a gravure coating method, a printing method, or the like can be used. Alternatively, a dry method such as a vacuum evaporation method or a sputtering method can be used.

In the case of forming the material layer 103 by a wet process, a desired material may be dissolved or dispersed in a solvent, and a solution or a dispersion liquid may be adjusted. There is no particular limitation on the solvent as long as it can dissolve the material or the material can disperse in the solvent and it does not react with the material. Examples of the solvent are as follows: halogen solvents such as chloroform, tetrachloromethane, dichloromethane, 1,2-dichloroethane, and chlorobenzene; ketone solvents such as acetone, methyl ethyl ketone, diethyl ketone, n-propyl methyl ketone, and cyclohexanone; aromatic solvents such as benzene, toluene, and xylene; ester solvents such as ethyl acetate, n-propyl acetate, n-butyl acetate, ethyl propionate, γ-butyrolactone, and diethyl carbonate; ether solvents such as tetrahydrofuran and dioxane; amide solvents such as dimethylformamide and dimethylacetamide; dimethyl sulfoxide; hexane; water; and the like. A mixture of plural kinds of these solvents may also be used. By using a wet process, it is possible to increase material use efficiency, which leads to reduction in manufacturing cost.

Note that in the case where the thickness and uniformity of a film which is formed on the deposition target substrate are controlled using the material layer 103, the thickness and uniformity of the material layer 103 do not need to be controlled. However, the material layer 103 does not need to be a uniform layer as long as it does not affect the thickness and uniformity of a film which is formed on the deposition target substrate. For example, the material layer 103 may be formed in a minute island shape or may have unevenness.

Figure 1B:
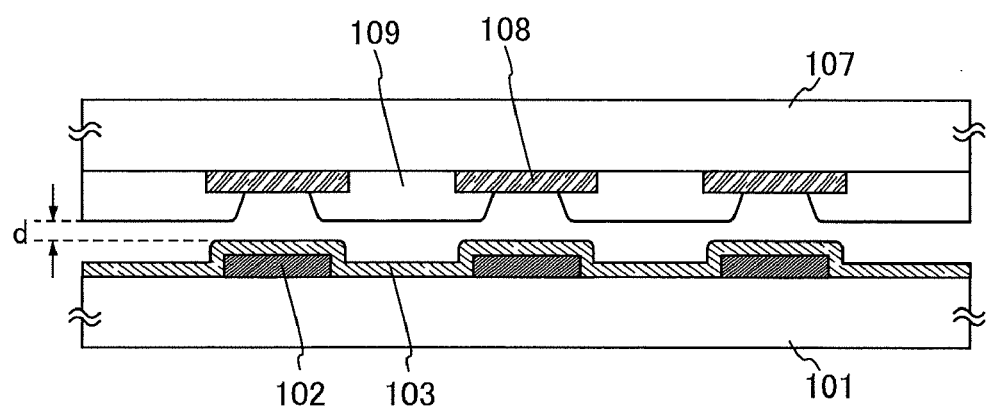

Next, as illustrated in FIG. 1B, a second substrate 107 which is a deposition target substrate is disposed at a position facing a surface which is one of surfaces of the first substrate 101 over which the light absorption layer 102 and the material layer 103 are formed. The second substrate 107 is a deposition target substrate on which a desired layer is deposited through a deposition process. Note that since the case where an EL layer of a light-emitting element is formed using the deposition substrate is described here, a first electrode 108 which serves as one of electrodes of the light-emitting element and an insulator 109 are formed on the second substrate 107. Then, the first substrate 101 and the second substrate 107 are disposed to face each other in proximity; specifically, they are disposed close to face each other so that the distance d between the surface of the material layer 103 over the first substrate 101 and the surface of the second substrate 107 is greater than or equal to 0 mm and less than or equal to 2 mm, preferably greater than or equal to 0 mm and less than or equal to 0.05 mm, and more preferably greater than or equal to 0 mm and less than or equal to 0.03 mm.

Note that the distance d is defined as the distance between the surface of the material layer 103 over the first substrate 101 and the surface of the second substrate 107. Therefore, in the case where some sort of layer (e.g., a conductive layer which functions as an electrode or an insulator which functions as a partition wall) is formed on the second substrate 107, the distance d is defined as the distance between the surface of the material layer 103 over the first substrate 101 and the outermost surface of the layer formed on the second substrate 107. Note that if the surface of the material layer 103 over the first substrate 101 or the outermost surface of the layer on the second substrate 107 has unevenness, the distance d is defined as the shortest distance between the surface of the material layer 103 over the first substrate 101 and the outermost surface of the layer formed on the second substrate 107.

Figure 1C:
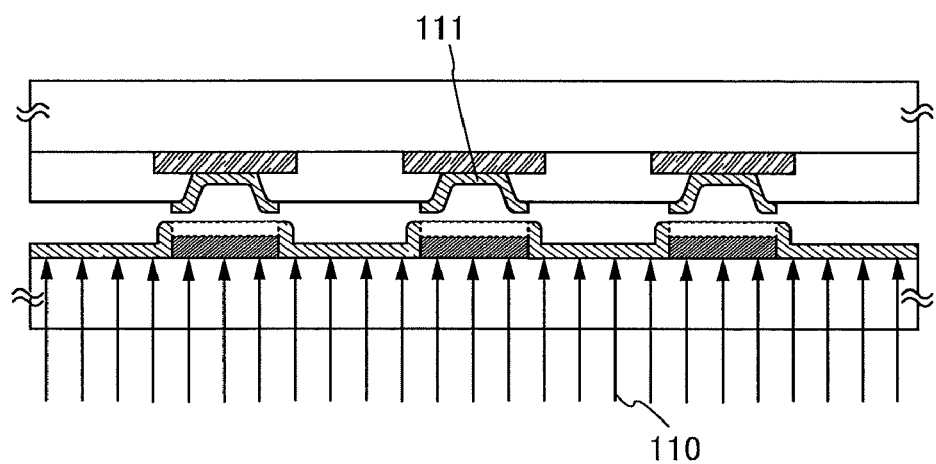

Next, as illustrated in FIG. 1C, irradiation with light 110 is performed from a rear surface (the surface on which the light absorption layer 102 and the material layer 103 are not formed) side of the first substrate 101. At this time, light with which the light absorption layer 102 which is formed over the first substrate 101 is irradiated is absorbed, whereas light with which the material layer 103 is irradiated is transmitted. Then, the light absorption layer 102 converts the absorbed light into heat and the heat is delivered to the material included in a region of the material layer 103 which is in contact with the light absorption layer 102, so that at least part of the material included in the material layer 103 is deposited on the first electrode 108 which is formed on the second substrate 107. Accordingly, an EL layer 111 of a light-emitting element is formed on the second substrate 107.

As the irradiation light, laser light having a repetition rate of greater than or equal to 10 MHz and a pulse width of greater than or equal to 100 fs and less than or equal to 10 ns is used. With the use of such laser light having a very high repetition rate and a very small pulse width, thermal conversion in the light absorption layer 102 is efficiently performed, and thus the material can be efficiently heated.

Further, the wavelength of the laser light is not particularly limited and laser light having a variety of wavelengths can be used. For example, laser light having a wavelength of 355 nm, 515 nm, 532 nm, 1030 nm, 1064 nm, or the like can be used.

As the laser light, it is possible to use light emitted from one or more of a gas laser such as an Ar laser, a Kr laser, or an excimer laser; or a solid-state laser such as a laser using, as a medium, single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$, to which one or more of Nd, Yb, Cr, Ti, Ho, Er, Tm, or Ta is added as a dopant, a glass laser, a ruby laser, an alexandrite laser, a Ti:sapphire laser, or a fiber laser. Alternatively, a second harmonic, a third harmonic, or higher harmonics emitted from the above-described solid-state laser can be used. Note that when a solid-state laser whose laser medium is solid is used, there are advantages that a maintenance-free condition can be maintained for a long time and output is relatively stable.

The shape of a laser spot is preferably linear or rectangular. With a linear or rectangular laser spot, a substrate to be processed can be efficiently scanned with laser light. Thus, time taken for deposition (takt time) is shortened, which leads to increase in productivity.

In the present invention, the material layer 103 is heated not with radiant heat from light from a light source with which irradiation is performed but with the light absorption layer 102 which absorbs light from a light source. Accordingly, it is preferable to shorten light irradiation time so that the area of the material layer 103 is not enlarged except a desired region due to conduction of the heat in a plane direction from part of the light absorption layer 102 which is irradiated with light through the substrate or the like. Further, it is preferable to reduce the light irradiation time in order to suppress decomposition of the material by irradiation of the material layer 103 with the light.

It is preferable that deposition by light irradiation be performed in a reduced-pressure atmosphere. Accordingly, the pressure in the deposition chamber is preferably less than or equal to $5 \times 10^{-3}$ Pa, more preferably $10^{-4}$ Pa to $10^{-6}$ Pa.

Since the laser light having a repetition rate of greater than or equal to 10 MHz and a pulse width of greater than or equal to 100 fs and less than or equal to 10 ns which is used in the present invention is capable of short-time irradiation, diffusion of heat can be suppressed, and thus a minute pattern can be deposited. In addition, since the laser light having a repetition rate of greater than or equal to 10 MHz and a pulse width of greater than or equal to 100 fs and less than or equal to 10 ns is capable of high output, a large area can be processed at a time, and thus time taken for deposition can be reduced. Accordingly, productivity can be increased.

Figure 2A:
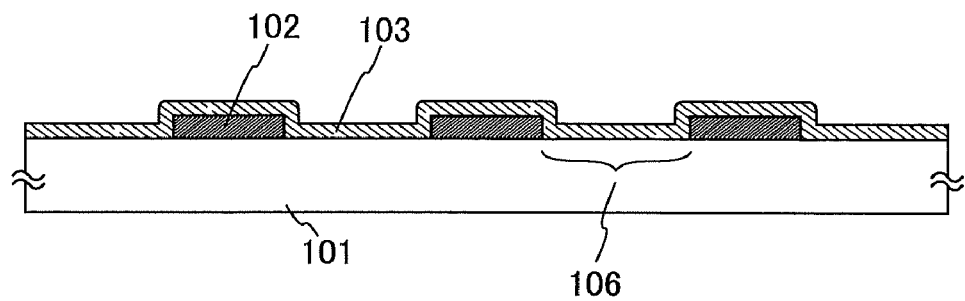
FIGS. 2A to 2C are views illustrating a deposition substrate and a deposition method in accordance with an embodiment mode of the present invention.
Figure 2B:
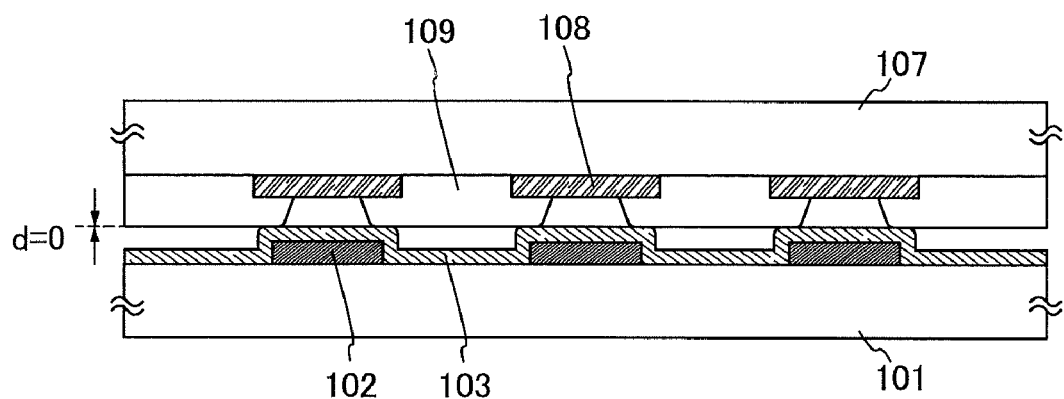
Figure 2C:
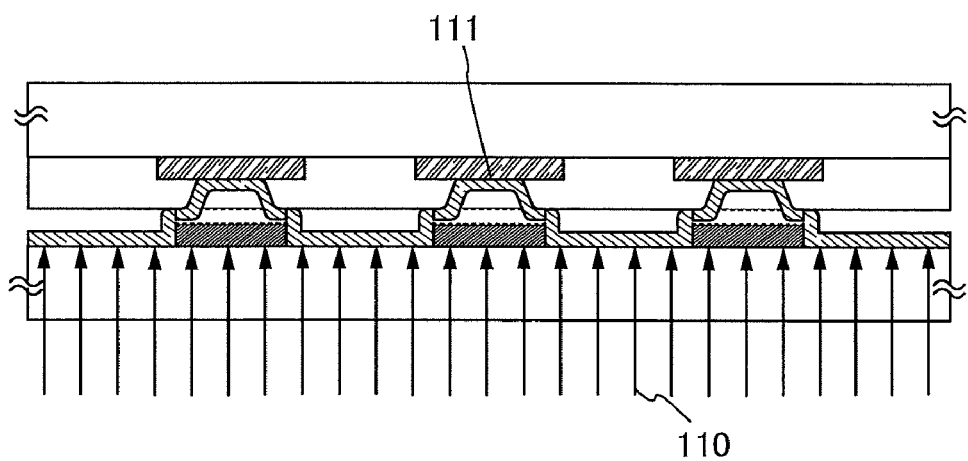

FIG. 2A illustrates the case where the distance d between the first substrate 101 and the second substrate 107 is 0 mm. That is, the case is described where the material layer 103 which is formed over the first substrate 101 and the insulator 109 which is the outermost layer of the layers formed on the second substrate 107 are in contact with each other. By reduction in the distance d as described above, at the time of the light irradiation as illustrated in FIG. 2B, the shape of a film which is deposited on the second substrate 107 can be formed with high accuracy.

Further, in this embodiment mode, the case where the first electrode 108 is formed on the second substrate 107 which is a deposition target substrate and a film is deposited on the first electrode 108 is described. The present invention can also be applied to the case where part of an EL layer is already formed on the first electrode 108. For example, a light-emitting layer can be formed using the second substrate 107 in which part of an EL layer (e.g., a hole-injecting layer or a hole-transporting layer) is formed on the first electrode 108, by applying the deposition method of the present invention. In the case of manufacturing a full-color light-emitting device, light-emitting layers should be separately formed, and the use of the deposition method of the present invention makes it possible to separately form the light-emitting layers easily. In addition, the light-emitting layers can be separately formed with high accuracy.

Note that when a material with low thermal stability, such as an organic compound, has been deposited on the deposition target substrate, it is preferable that the material layer 103 formed over the first substrate 101 be not in contact with a deposition target surface of the second substrate 107 so that heat is not conducted to the film which has been deposited.

In this embodiment mode, the case where the second substrate 107 is positioned over the first substrate 101 is described; however, the present invention is not limited thereto. The orientation of the substrates can be set as appropriate. Note that when the first substrate 101 is formed by a wet process, it is not necessary to invert the first substrate 101 after the formation by a wet process; therefore, it is preferable to provide the second substrate 107 over the first substrate 101.

Application of the present invention makes it possible to form a flat even film. In addition, such a film can be deposited on only a desired region, and thus a minute pattern can be formed.

Further, application of the present invention makes it possible to form a minute pattern, and thus a high-definition light-emitting device can be manufactured.

Since only the light absorption layer and the material layer may be provided for the deposition substrate of the present invention, the deposition substrate is manufactured easily. Further, since the structure thereof is simple, the cost spent on manufacturing the deposition substrate can be reduced.

In the deposition substrate of the present invention, the material layer and the supporting substrate are in contact with the light absorption layer; therefore, at the time of the irradiation of the deposition substrate with light, diffusion of heat from the light absorption layer in the plane direction can be prevented. Accordingly, deformation which is pattern deposition except a desired pattern can be suppressed. In particular, a material having low thermal conductivity is used for the supporting substrate, so that deformation of a deposition pattern can be further suppressed.

In the deposition method of the present invention, deposition substrates in each of which the material layer is formed are prepared in advance and the deposition substrates are replaced, so that deposition can be performed on the deposition target substrate one after another. Accordingly, application of the present invention makes it possible to reduce the time taken for manufacture or the like of the light-emitting device (takt time), which can lead to increase in productivity.

The material layer of the deposition substrate which has been used for deposition once is removed and a new material layer is formed again, so that the deposition substrate can be used plural times. Accordingly, the cost spent on manufacturing a light-emitting device can be reduced. A glass substrate or a quartz substrate is used as a supporting substrate of the deposition substrate of the present invention. An impurity (moisture or the like) is not likely to be adsorbed or attached to these substrates, as compared to a film substrate or the like. Accordingly, the deposition substrate of the present invention is suitable for reuse.

In the present invention, unlike the case where the EL layer is formed by a wet process, it is not necessary to take into consideration solubility of the layer which has been formed, or the like; therefore, a material to be deposited can be chosen from a wider range. Further, the number of layers to be stacked can be set freely. Accordingly, a light-emitting device having a desired stacked structure can be manufactured using a desired material. It is important that a kind of a material to be used or a stacked structure can be set freely in terms of improvement in performance of the light-emitting device particularly when the size of a substrate is increased.

In the present invention, deposition is performed in a state where the distance between the deposition substrate and the deposition target substrate is short. Accordingly, most of the material layer which is formed over the deposition substrate is deposited on the deposition target substrate; therefore, the use efficiency of the material is high. Thus, reduction in manufacturing cost can be achieved. Further, since deposition is performed in a state where the distance between the deposition substrate and the deposition target substrate is short, the material can be prevented from being attached to the inner wall of the deposition chamber, and maintenance of a deposition apparatus can be facilitated.

Further, in the present invention, laser light having a high output can be used as a light source, and thus deposition on a large area can be performed at a time. Thus, time taken for manufacturing the light-emitting device (takt time) can be reduced, which can lead to increase in productivity.

Further, by applying the present invention, the thickness of the material layer formed over the first substrate is controlled, so that the thickness of a film to be deposited on the second substrate which is a deposition target substrate can be controlled. In other words, the thickness of the material layer is controlled in advance so that a film which is formed on the second substrate can have a desired thickness when all materials included in the material layer formed over the first substrate is deposited; therefore, a thickness monitor is not needed at the time of the deposition on the second substrate. Therefore, a user does not have to adjust the deposition rate with a thickness monitor, and the deposition process can be fully automated. Accordingly, productivity can be increased.

Further, application of the present invention makes it possible to uniformly deposit the material included in the material layer 103 formed over the first substrate. Even when the material layer 103 includes plural kinds of materials, a film containing the same materials at roughly the same weight ratio as those of the material layer 103 can be deposited on the second substrate which is the deposition target substrate. Therefore, in the deposition method of the present invention, even when deposition is performed using plural kinds of materials having different vaporization temperatures, unlike the case of co-evaporation, the evaporation rate of each material does not need to be controlled. Thus, without complicated control of the evaporation rate or the like, a desired layer including different kinds of materials can be deposited easily with high accuracy.

Embodiment Mode 2

In this embodiment mode, a deposition method using a deposition substrate having a structure different from the deposition substrate described in Embodiment Mode 1 will be described with reference to FIGS. 3A to 3C.

Figure 3A:
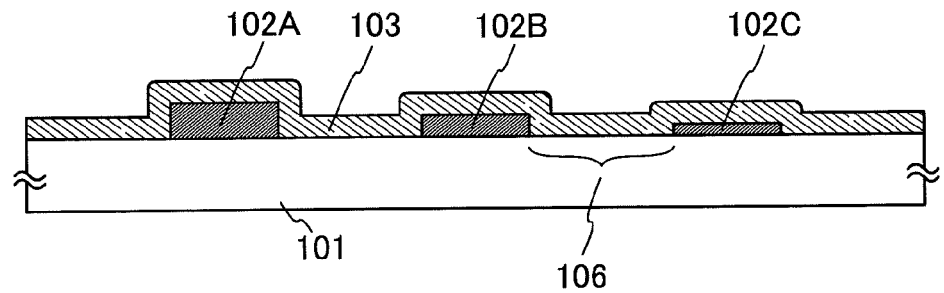
FIGS. 3A to 3C are views illustrating a deposition substrate and a deposition method in accordance with an embodiment mode of the present invention.

In a structure illustrated in FIG. 3A, light absorption layers 102A, 102B and 102C whose thicknesses are each different are formed over the first substrate 101. Moreover, the material layer 103 is formed so as to be in contact with the light absorption layers. In FIG. 3A, the material layer 103 is formed over the entire surface of the first substrate 101.

In FIG. 3A, the light absorption layer 102A has a thickness at which the irradiation light is not transmitted. At this time, the light absorption layer 102A absorbs the irradiation light by x %. The thickness of the light absorption layer 102B is smaller than that of the light absorption layer 102A and it is a thickness at which part of the irradiation light is transmitted. Accordingly, the light absorption layer 102B has lower absorptance than the light absorption layer 102A and absorbs the irradiation light by y % (note that x>y is satisfied). The thickness of the light absorption layer 102C is smaller than that of the light absorption layer 102B and it is a thickness at which part of the irradiation light is transmitted. Accordingly, the light absorption layer 102C has lower absorptance than the light absorption layer 102B and absorbs the irradiation light by z % of (note that x>y>z is satisfied). That is, the light absorption layers 102A, 102B and 102C have different absorptance of the irradiation light.

Figure 3B:
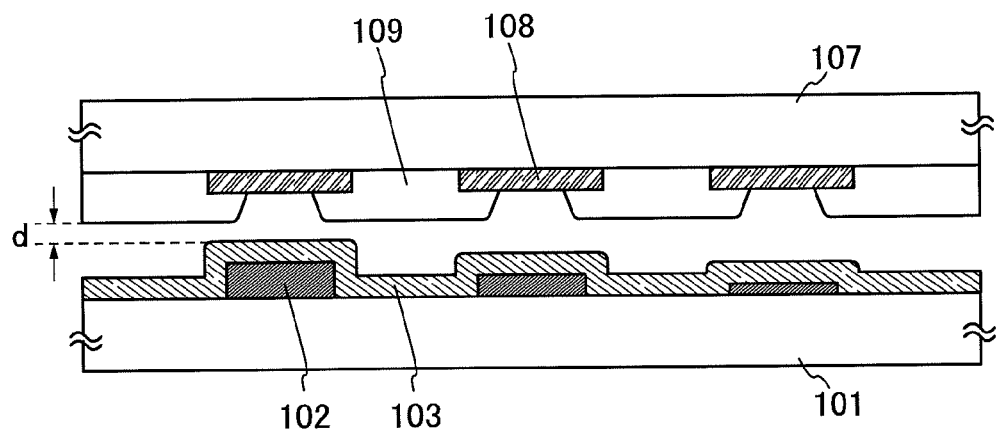
Figure 3C:
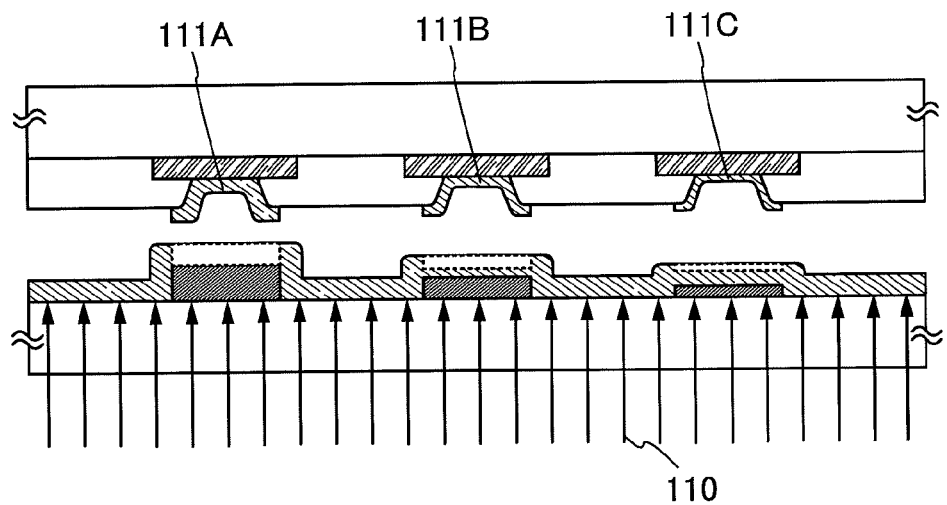

A deposition substrate having such a structure is prepared, and as illustrated in FIG. 3B, the first substrate 101 and the second substrate 107 is disposed to face each other so that regions where deposition is desired to be performed correspond to the light absorption layers. Then, as illustrated in FIG. 3C, when light irradiation is performed from the first substrate 101 side, EL layers 111A, 111B, and 111C whose thicknesses are each different are deposited depending on the thicknesses of the light absorption layers 102A, 102B and 102C, respectively.

That is, the light absorption layer 102A having a thickness at which the irradiation light is not transmitted (which absorbs the irradiation light by x %) converts all the absorbed light into heat and conducts the heat to the material layer 103. The light absorption layer 102B transmits part of the irradiation light, absorbs the transmitted light by y % (note that x>y is satisfied), and converts the absorbed light into heat. Accordingly, the amount of heat generated in the light absorption layer 102B is smaller than that generated in the light absorption layer 102A. As a result of this, the amount of heat conducted to the material layer 103 is also small, and thus the amount of the material to be deposited is also small. Therefore, the thickness of the EL layer 111B which is deposited is smaller than that of the EL layer 111A.

The light absorption layer 102C transmits part of the irradiation light, absorbs the transmitted light by z % (note that x>y>z is satisfied), and converts the absorbed light into heat. Accordingly, the amount of heat generated in the light absorption layer 102C is smaller than that generated in the light absorption layer 102B. As a result of this, the amount of heat conducted to the material layer 103 is also smaller, and thus the amount of the material to be deposited is also small. Therefore, the thickness of the EL layer 111C which is deposited is smaller than that of the EL layer 111B.

Accordingly, by making the light absorption layers 102A, 102B, and 102C have different thicknesses, films whose thicknesses are each different can be deposited in one deposition step. That is, the films whose thicknesses are each different can be deposited without increasing the number of deposition steps. Further, the thicknesses of the films to be deposited can be controlled without changing the thickness of the material layer 103. Furthermore, the thicknesses of the films to be deposited can be controlled without changing intensity of the irradiation light. Accordingly, the thicknesses of the films to be deposited can be controlled easily.

Accordingly, at the time of manufacturing a light-emitting device, with the use of the deposition method described in this embodiment mode, layers which are used in common in light-emitting elements of each emission color can have different thicknesses without increasing the number of deposition steps. More specifically, at the time of forming a hole-injecting layer, a hole-transporting layer, an electron injecting layer, and an electron transporting layer which are used in common in light-emitting elements of each emission color, the thicknesses thereof can be made different in the light emitting elements of each emission color. For example, in the case of a full-color light-emitting device, when the optical design of the light-emitting element is taken into consideration, optimal values of distances between light-emitting regions and reflective electrodes are different from each other depending on the emission wavelength. However, when layers between the light-emitting layers and the reflective electrodes are formed separately depending on each emission color in light-emitting elements of each emission color, the number of deposition steps is increased; therefore, time taken for manufacturing the light-emitting device is increased. Further, manufacturing cost of the light-emitting device is increased.

With the use of the deposition method described in this embodiment mode, layers containing the same material and whose thicknesses are each different can be deposited in one deposition step. Therefore, the number of steps can be reduced, so that manufacturing cost of the light-emitting device can be reduced. Further, time taken for manufacturing the light-emitting device (takt time) can be reduced.

Further, with the use of the deposition method described in this embodiment mode, in the light-emitting device having a plurality of light-emitting elements, structures of light-emitting elements of each emission color can be optimized easily. For example, at the time of manufacturing a full-color light-emitting device, in order to obtain a microcavity effect, the EL layers can be formed easily so as to have different thicknesses in light-emitting elements of each emission color of R, G and B.

Application of the present invention makes it possible to form a flat even film. In addition, such a film can be deposited on only a desired region, and thus a minute pattern can be formed.

Further, application of the present invention makes it possible to form a minute pattern, and thus a high-definition light-emitting device can be manufactured.

The deposition substrate of the present invention may be provided with the light absorption layer and the material layer; therefore, the deposition substrate is manufactured easily. Further, since the structure thereof is simple, the cost spent on manufacturing the deposition substrate can be reduced.

In the deposition substrate of the present invention, the material layer and the supporting substrate are in contact with the light absorption layer; therefore, at the time of the irradiation of the deposition substrate with light, diffusion of heat from the light absorption layer in the plane direction can be prevented. Accordingly, deformation which is pattern deposition except a desired pattern can be suppressed. In particular, a material having low thermal conductivity is used for the supporting substrate, so that deformation of a deposition pattern can be further suppressed.

In the deposition method of the present invention, deposition substrates in each of which the material layer is formed are prepared in advance and the deposition substrates are replaced, so that deposition can be performed on the deposition target substrate one after another. Accordingly, application of the present invention makes it possible to reduce the time taken for manufacture or the like of the light-emitting device (takt time), which can lead to increase in productivity.

The material layer of the deposition substrate which has been used for deposition once is removed and a new material layer is formed again, so that the deposition substrate can be used plural times. Accordingly, the cost spent on manufacturing a light-emitting device can be reduced. A glass substrate or a quartz substrate is used as a supporting substrate of the deposition substrate of the present invention. An impurity (moisture or the like) is not likely to be adsorbed or attached to these substrates, as compared to a film substrate or the like. Accordingly, the deposition substrate of the present invention is suitable for reuse.

In the present invention, unlike the case where the EL layer is formed by a wet process, it is not necessary to take into consideration solubility of the layer which has been formed, or the like; therefore, a material to be deposited can be chosen from a wider range. Further, the number of layers to be stacked can be set freely. Accordingly, a light-emitting device having a desired stacked structure can be manufactured using a desired material. Particularly when the size of a substrate is increased, it is important in terms of improvement in performance of the light-emitting device that a kind of a material to be used or a stacked structure can be set freely.

In the present invention, deposition is performed in a state where the distance between the deposition substrate and the deposition target substrate is short. Accordingly, most of the material layers which are formed over the deposition substrate are deposited on the deposition target substrate; therefore, the use efficiency of the material is high. Thus, a reduction in manufacturing cost can be achieved. Further, since deposition is performed in a state where the distance between the deposition substrate and the deposition target substrate is short, the material can be prevented from being attached to the inner wall of the deposition chamber, and maintenance of a deposition apparatus can be facilitated.

Further, in the present invention, laser light having a high output can be used as a light source, and thus deposition on a large area can be performed at a time. Thus, time taken for manufacturing the light-emitting device (takt time) can be reduced, which can lead to increase in productivity.

In this embodiment mode, the case where the second substrate 107 is positioned over the first substrate 101 is described; however, the present invention is not limited thereto. The orientation of the substrates can be set as appropriate. Note that when the first substrate 101 is formed by a wet process, it is not necessary to invert the first substrate 101 after the formation by a wet process; therefore, it is preferable to provide the second substrate 107 over the first substrate 101.

Note that a structure described in this embodiment mode can be used in combination with any of the structures described in other embodiment modes, as appropriate.

Embodiment Mode 3

In this embodiment mode, a deposition method using a deposition substrate having a structure different from the deposition substrate described in Embodiment Modes 1 and 2 will be described with reference to FIGS. 4A to 4C.

Figure 4A:
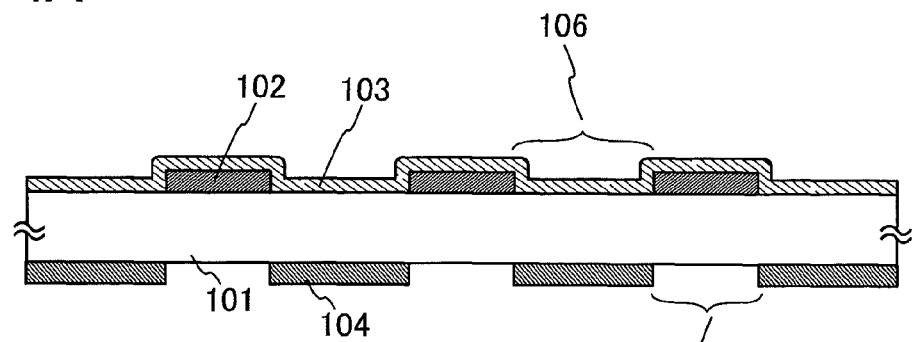
FIGS. 4A to 4C are views illustrating a deposition substrate and a deposition method in accordance with an embodiment mode of the present invention.

In the structure illustrated in FIG. 4A, a light absorption layer 102 is formed on the front surface (a first face) of a first substrate 101 which is a supporting substrate. The light absorption layers 102 are patterned so as to correspond to a region of a deposition target substrate on which deposition is desired to be performed. In FIG. 4A, the light absorption layers 102 are formed to have an opening 106. Then, a second light absorption layer 104 is formed on the rear surface (a second face) of the first substrate 101 so as to correspond to the opening 106 of the light absorption layer 102. In other words, the light absorption layer 102 is formed so as to correspond to an opening 105 of the second light absorption layer 104. The second light absorption layer 104 can be formed using a material which is similar to that of the light absorption layer 102 described in Embodiment Mode 1.

Then, a material layer 103 including a material deposited on the deposition target substrate is formed over the light absorption layer 102. In FIG. 4A, the material layer 103 is formed over the entire surface of the first substrate 101.

The deposition is performed using the deposition substrate illustrated in FIG. 4A. Then, as illustrated in FIG. 4B, a second substrate 107 which is a deposition target substrate is disposed in a position so as to face the front surface of the first substrate 101, namely the face (the first face) which is provided with the light absorption layer 102 and the material layer 103. Then, the first substrate 101 and the second substrate 107 are disposed so as to face each other in proximity; specifically, they are disposed close to face each other so that the distance d between the surface of the material layer 103 over the first substrate 101 and the surface of the second substrate 107 is greater than or equal to 0 mm and less than or equal to 2 mm, preferably greater than or equal to 0 mm and less than or equal to 0.05 mm, or more preferably greater than or equal to 0 mm and less than or equal to 0.03 mm.

Figure 4B:
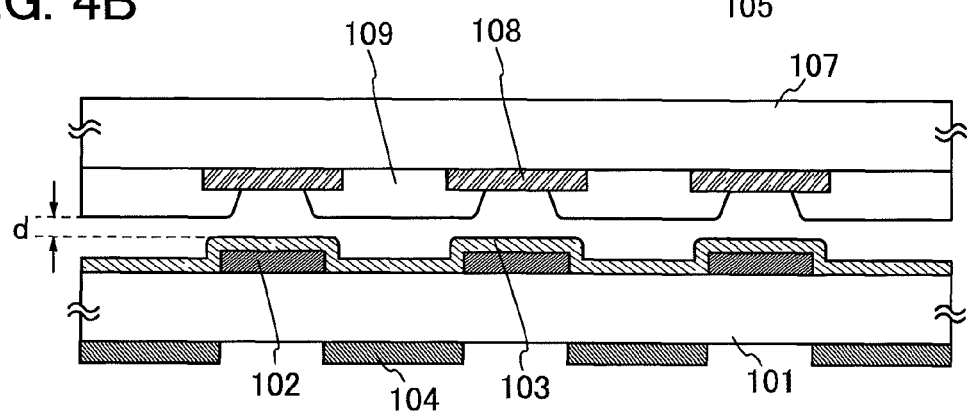
Figure 4C:
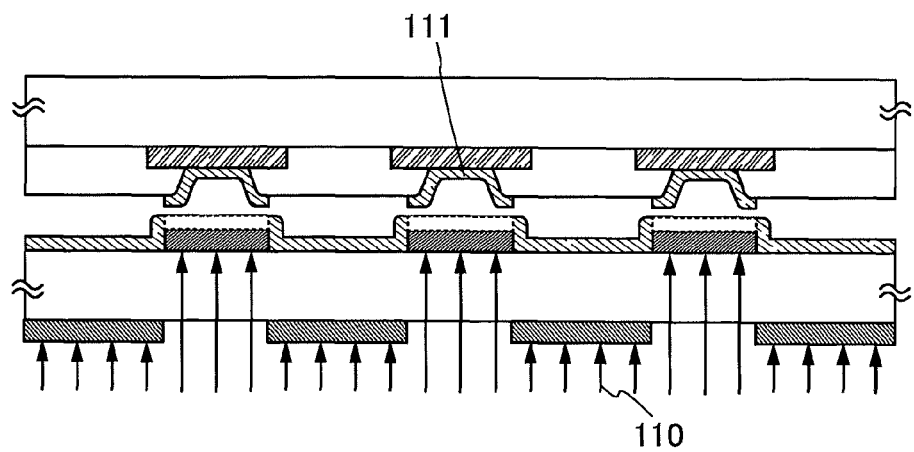

Then, as illustrated in FIG. 4C, irradiation with light 110 is performed from the side of the rear surface of the first substrate 101, namely the face (the second face) on which the light absorption layer 102 and the material layer 103 are not formed. At this time, the irradiation light is absorbed by the second light absorption layer 104 formed on the second face. The light with which the opening 105 of the second light absorption layer 104 is irradiated is transmitted through the first substrate 101 and absorbed by the light absorption layer 102. Then, the irradiation light is converted into heat by the light absorption layer 102, and the heat is delivered to the material included in the material layer 103 in the region which is in contact with the light absorption layer 102. After that, at least part of the material included in the material layer 103 is deposited on the first electrode 108 formed on the second substrate 107. Accordingly, an EL layer 111 of a light-emitting element is formed on the second substrate 107.

In the case of using the deposition method illustrated in FIGS. 4A to 4C, the light with which the deposition substrate is irradiated is absorbed by the light absorption layer 102 and the second light absorption layer 104 which are provided for the deposition substrate; therefore, the light does not reach the deposition target substrate. Thus, the deposition method described in this embodiment mode can be used even in the case where a structural object which is deteriorated or transformed due to the light irradiation is formed on the deposition target substrate. That is, even in the case where a structural object which is affected by the light is formed on the deposition target substrate, the deposition can be performed without adversely affecting the structural object on the deposition target substrate by using the deposition method described in this embodiment mode.

The deposition substrate illustrated in FIG. 4A can be formed through the following method.

Figure 5A:
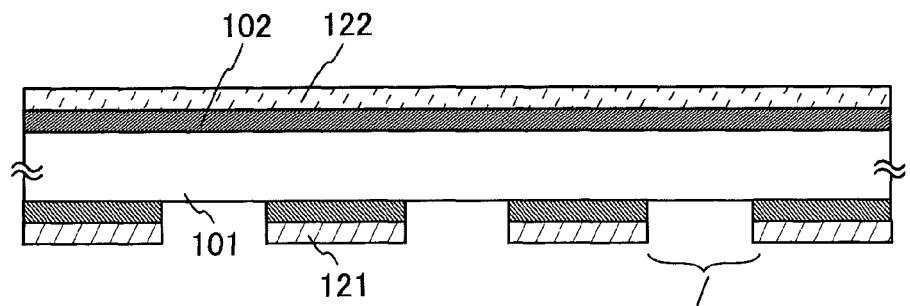
FIGS. 5A to 5D are views illustrating a method for forming a deposition substrate in accordance with an embodiment mode of the present invention.

First, as illustrated in FIG. 5A, a light absorption layer 102 is formed on the front surface (the first face) of the first substrate 101, and a thermosetting resin film 122 is formed over the light absorption layer 102. In addition, a second light absorption layer 104 is formed on the rear surface (the second face) of the first substrate 101. The second light absorption layer 104 is formed in a desired pattern using a variety of methods. For example, FIG. 5A illustrates the case where a photoresist 121 is patterned using a photomask and the second light absorption layer 104 is formed into a desired pattern by etching.

Figure 5B:
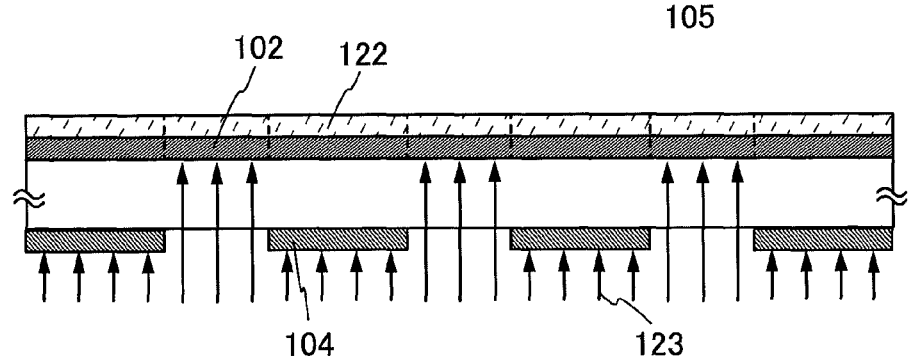
Figure 5C:
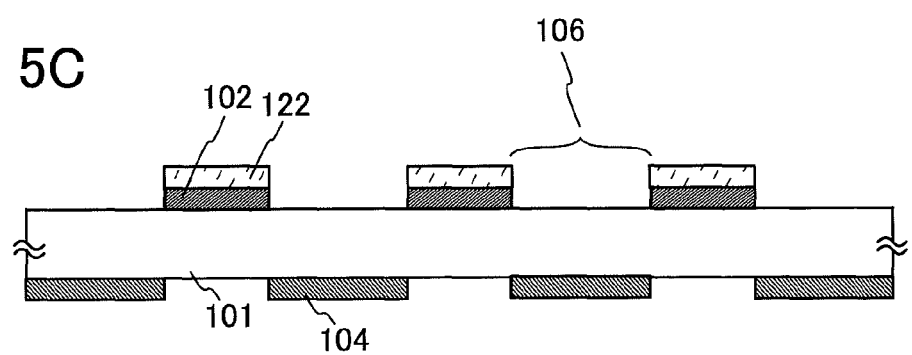

Next, as illustrated in FIG. 5B, irradiation with light 123 whose wavelength is absorbed by the light absorption layer 102 is performed from the side of the rear surface of the substrate 101, namely the face (the second face) on which the second light absorption layer 104 is formed. The irradiation light is absorbed by the second light absorption layer 104. The light with which the opening 105 of the second light absorption layer 104 is irradiated is transmitted through the first substrate 101 and absorbed by the light absorption layer 102. Then, the irradiation light is converted into heat by the light absorption layer 102, and the heat is delivered to the material included in the thermosetting resin film 122 in a region which is in contact with the light absorption layer 102. As a result, the thermosetting resin film 122 in the region which is in contact with the light absorption layer 102 is cured. Etching is performed using the cured thermosetting resin film 122 as a mask, so that the light absorption layer 102 can be patterned into a region corresponding to the opening 105 as illustrated in FIG. 5C.

Figure 5D:
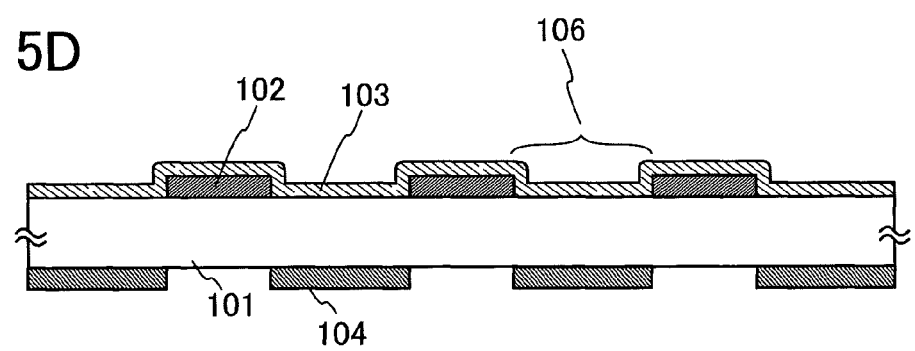

Then, as illustrated in FIG. 5D, the material layer 103 is formed after the thermosetting resin film 122 is removed, so that the deposition substrate illustrated in FIG. 4A can be formed.

In the method illustrated in FIGS. 5A to 5D, the light absorption layer 102 can be patterned in a self-aligned manner after the second light absorption layer 104 is patterned using the photomask once. Thus, the light absorption layer 102 and the second light absorption layer 104 can be formed with high precision. In addition, the deposition substrate illustrated in FIG. 4A can be formed without using a plurality of photomasks and without performing alignment of the photomask.

In addition, the deposition substrate illustrated in FIG. 4A can be formed also with a method which is illustrated in FIGS. 6A to 6D.

Figure 6A:
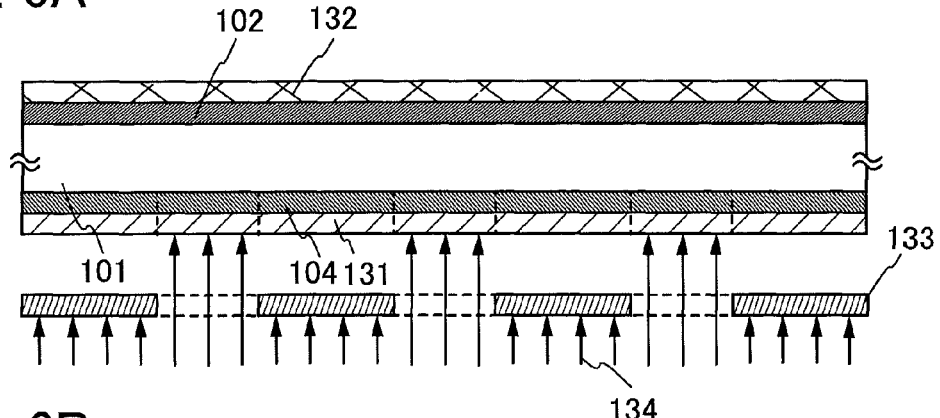
FIGS. 6A to 6D are views illustrating a method for forming a deposition substrate in accordance with an embodiment mode of the present invention.

First, as illustrated in FIG. 6A, a light absorption layer 102 is formed on the front surface (the first face) of the first substrate 101, and a negative photoresist 132 is formed over the light absorption layer 102. In addition, a second light absorption layer 104 is formed on the rear surface (the second face) of the first substrate 101, and a positive photoresist 131 is formed on the second light absorption layer 104. Then, irradiation with light 134 is performed from the side of the rear surface of the substrate 101, namely the face (the second face) on which the second light absorption layer 104 and the positive photoresist 131 are formed, using the photomask 133. The solubility of the positive photoresist 131 in the region irradiated with the light to a developer is increased. Thus, the second light absorption layer 104 can be patterned using the positive photoresist 131 in a region other than the region irradiated with the light, as a mask.

Figure 6B:
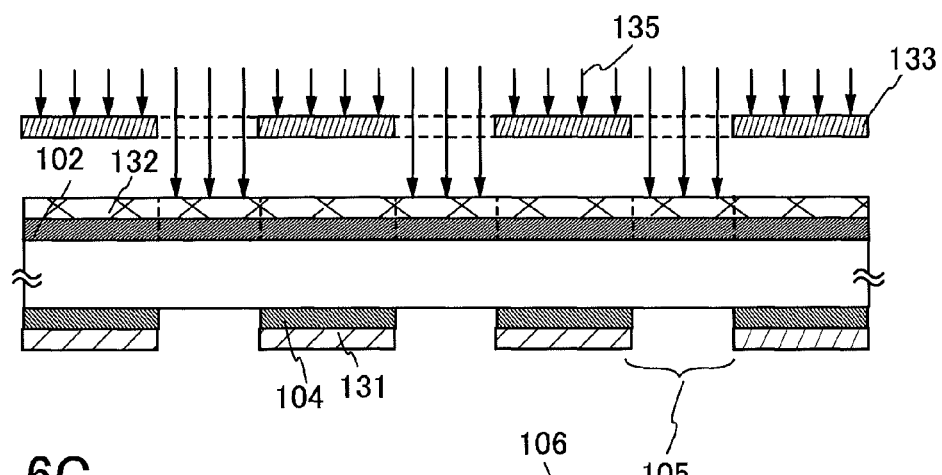
Figure 6C:
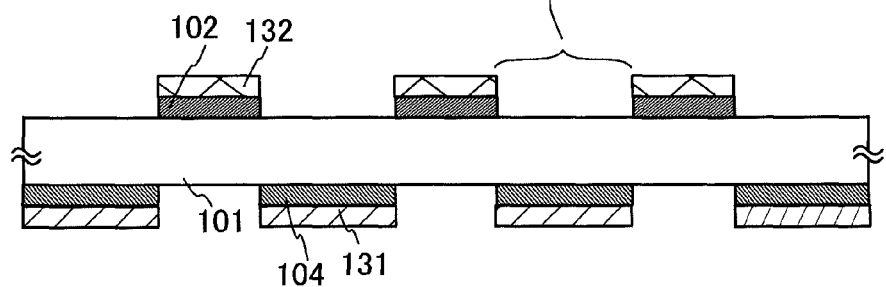

Next, as illustrated in FIG. 6B, irradiation with light 135 is performed from the side of the front surface of the substrate 101, namely the face (the first face) on which the light absorption layer 102 and the negative photoresist 132 are formed, using the photomask 133 used in FIG. 6A. The solubility of the negative photoresist 132 in the region irradiated with the light to a developer is decreased. Thus, as illustrated in FIG. 6C, the light absorption layer 102 can be patterned using the negative photoresist 132 in the region irradiated with the light, as a mask.

Figure 6D:
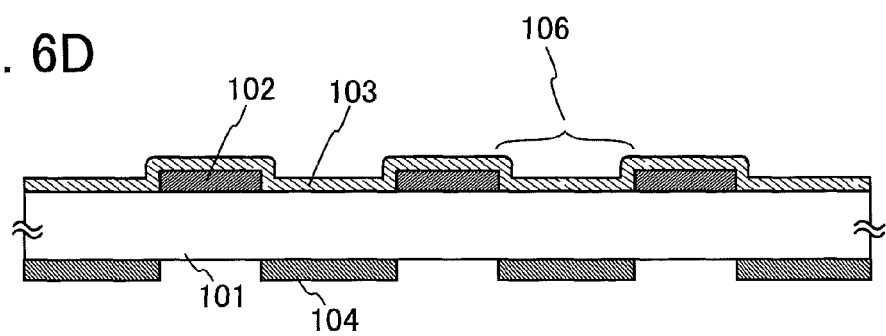

Then, as illustrated in FIG. 6D, the material layer 103 is formed after the positive photoresist 131 and the negative photoresist 132 are removed, so that the deposition substrate illustrated in FIG. 4A can be formed.

Note that FIGS. 6A to 6D illustrate the case where the positive photoresist 131 and the negative photoresist 132 are removed just before the material layer 103 is formed. However, the positive photoresist 131 and the negative photoresist 132 can be removed at any time after the light absorption layer 102 and the second light absorption layer 104 are patterned.

In addition, FIGS. 6A to 6D illustrates the case where the positive photoresist 131 is formed on the second light absorption layer 104 and the negative photoresist 132 is formed over the light absorption layer 102; however, the negative photoresist 132 may be formed on the second light absorption layer 104 and the positive photoresist 131 may be formed over the light absorption layer 102.

Through the method illustrated in FIGS. 6A to 6D, the second light absorption layer 104 and the light absorption layer 102 are patterned using the same photomask. Thus, the light absorption layer 102 and the second light absorption layer 104 can be formed with high precision. In addition, the deposition substrate illustrated in FIG. 4A can be formed without using a plurality of photomasks.

Embodiment Mode 4

In this embodiment mode, a method of manufacturing a light-emitting device which is capable of full-color display by forming an EL layer of a light-emitting element with a plurality of deposition substrates which are described in any of Embodiment Modes 1 to 3 will be described.

The case in which all the EL layers are formed using the same kind of material on the plurality of electrodes formed on a second substrate which is a deposition target substrate, through one deposition step, is described in any of Embodiment Modes 1 to 3. In this embodiment mode, the case in which three EL layers of a different color emission are formed on the plurality of electrodes formed on the second substrate will be described.

First, the deposition substrate described in any of Embodiment Modes 1 to 3 is prepared. For example, three deposition substrates illustrated in FIG. 1A are prepared. Note that a material layer for forming EL layers of a different emission color is formed in each deposition substrate. Specifically, a first deposition substrate having a material layer (R) for forming an EL layer exhibiting red light emission (an EL layer (R)), a second deposition substrate having a material layer (G) for forming an EL layer exhibiting green light emission (an EL layer (G)), and a third deposition substrate having a material layer (B) for forming an EL layer exhibiting blue light emission (an EL layer (B)) are prepared.

In addition, one deposition target substrate having a plurality of first electrodes illustrated in FIG. 1B in Embodiment Mode 1 is prepared. Note that since edges of the plurality of first electrodes formed on the deposition target substrate are covered with an insulator, a light-emitting region corresponds to part of the first electrode, which is exposed without being overlapped with the insulator.

First, the deposition target substrate and the first deposition substrate are superimposed on each other and aligned with each other for a first deposition process in a manner similar to that in FIG. 1B. Note that it is preferable that the deposition target substrate be provided with an alignment marker. The first deposition substrate is also preferably provided with the alignment marker. Note that since the first deposition substrate is provided with the light absorption layer, the light absorption layer which is near the alignment marker is preferably removed in advance. In addition, since the first deposition substrate is provided with the material layer (R), the material layer (R) which is near the alignment marker is also preferably removed in advance.

Then, light irradiation is performed from a rear surface (the surface on which the light absorption layer 102 and the material layer 103 which are illustrated in FIGS. 1A to 1C are not formed) side of the first deposition substrate. The light absorption layer absorbs the irradiation light and provides heat to the material layer (R) to heat the material included in the material layer (R). Thus, an EL layer (R) is formed on some of the first electrodes on the deposition target substrate. After the first deposition is completed, the first deposition substrate is moved away from the deposition target substrate.

Next, the deposition target substrate and the second deposition substrate are superimposed on each other and aligned with each other for a second deposition process. The second deposition substrate is provided with a light absorption layer in a position which is shifted by one pixel from the position of the light absorption layer of the first deposition substrate used in the first deposition.

Then, light irradiation is performed from a rear surface (the surface on which the light absorption layer 102 and the material layer 103 which are illustrated in FIGS. 1A to 1C are not formed) side of the second deposition substrate. The light absorption layer absorbs the irradiation light and provides heat to the material layer (G) to heat the material included in the material layer (G). Thus, an EL layer (G) is formed on part of the first electrodes on the deposition target substrate, which are next to the first electrodes on which the EL layer (R) is formed in the first deposition. After the second deposition is completed, the second deposition substrate is moved away from the deposition target substrate.

Next, the deposition target substrate and the third deposition substrate are superimposed on each other and aligned with each other for a third deposition process. The third deposition substrate is provided with a light absorption layer in a position which is shifted by two pixels from that of the first deposition substrate used in the first deposition.

Figure 7A:
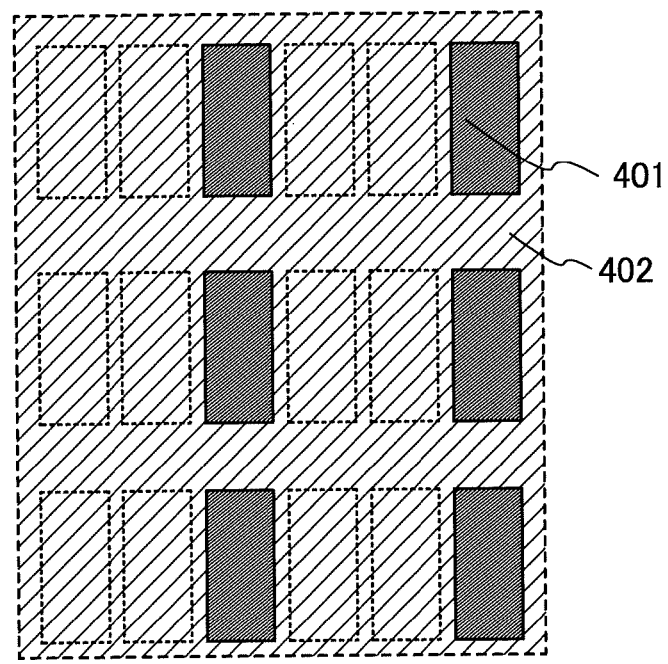
FIGS. 7A and 7B are views illustrating a method for manufacturing a light-emitting device in accordance with an embodiment mode of the present invention.

Then, light irradiation is performed from a rear surface (the surface on which the light absorption layer 102 and the material layer 103 which are illustrated in FIGS. 1A to 1C are not formed) side of the third deposition substrate. A state right before the third deposition corresponds to the top view of FIG. 7A. Note that in FIG. 7A, the material layer formed over the light absorption layer is omitted. In FIG. 7A, the light absorption layer 401 is formed in an island shape and has an opening 402. A region of the deposition target substrate which overlaps with the light absorption layer 401 of the third deposition substrate is provided with the first electrode. Note that below regions indicated by dotted lines in FIG. 7A, an EL layer (R) 411 formed through the first deposition and an EL layer (G) 412 formed through the second deposition are positioned.

Then, an EL layer (B) 413 is formed through the third deposition. The irradiation light for the deposition substrate is not absorbed by a region where the light absorption layer is not formed (the opening 402) and is transmitted through the material layer. On the other hand, in a region where the light absorption layer 401 is formed, the light absorption layer 401 absorbs the irradiation light and provides heat to the material layer (B) to heat the material included in the material layer (B). Thus, the EL layer (B) 413 is formed on part of the first electrodes on the deposition target substrate which are next to the first electrodes on which the EL layer (G) 412 is formed in the second deposition. After the third deposition is completed, the third deposition substrate is moved away from the deposition target substrate.

In this manner, the EL layer (R) 411, the EL layer (G) 412, and the EL layer (B) 413 can be formed at regular intervals on one deposition target substrate. Then, a second electrode is formed on these layers. Thus, light-emitting elements can be formed.

Through the above steps, light-emitting elements which exhibit light emission of a different color are formed on one substrate, so that a light-emitting device capable of full-color display can be formed.

Figure 7B:
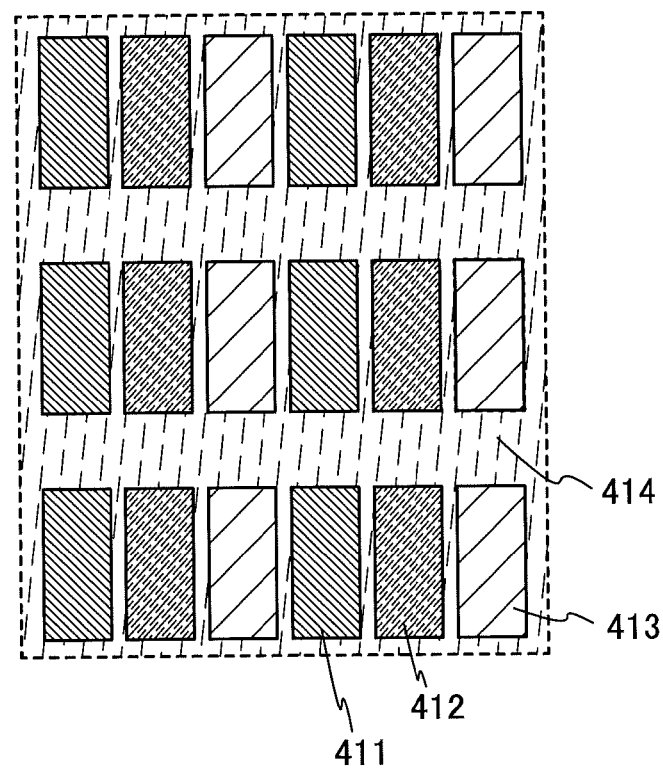

Although FIGS. 7A and 7B illustrate an example in which the light absorption layer 401 formed over the deposition substrate has a rectangular shape, there is no particular limitation and a stripe shape may be employed. In the case where a stripe shape is employed, deposition is also performed between light-emitting regions for emitting light of the same color; however, the deposition between light-emitting regions is performed on the insulator 414, and thus a portion overlapping with the insulator 414 does not serve as a light-emitting region.

Figure 8A:
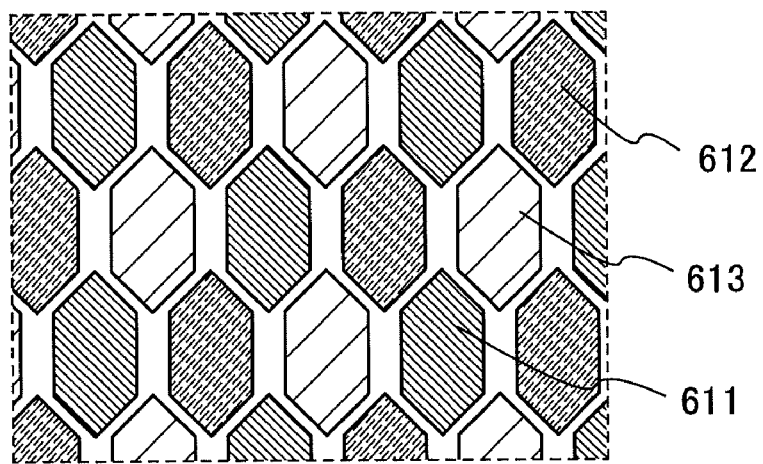
FIGS. 8A and 8B are views illustrating a method for manufacturing a light-emitting device in accordance with an embodiment mode of the present invention.
Figure 8B:
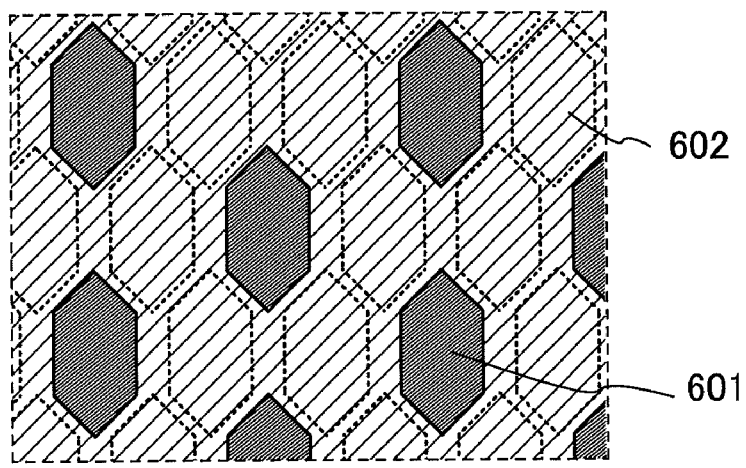

In a similar manner, there is no particular limitation on the arrangement of the pixels. The shape of each pixel may be a polygon, for example, a hexagon as illustrated in FIG. 8A, and a full-color light-emitting device can be realized by arrangement of an EL layer (R) 611, an EL layer (G) 612 and an EL layer (B) 613. In order to form polygonal pixels illustrated in FIG. 8A, deposition may be performed using a deposition substrate which includes a polygonal light absorption layer 601 and a region where the light absorption layer 601 is not formed (the opening 602) as illustrated in FIG. 8B.

In manufacturing the light-emitting device capable of full-color display described in this embodiment mode, application of the present invention makes it possible: to form a flat even film. Further, a minute pattern can be formed and deformation which is pattern deposition except a desired pattern can be suppressed. Accordingly, a high-definition light-emitting device can be obtained.

In a manufacturing method of a light-emitting device of the present invention, deposition substrates in each of which the material layer is formed are prepared in advance and the deposition substrates are replaced, so that deposition can be performed on the deposition target substrate one after another. Accordingly, application of the present invention makes it possible to reduce the time taken for manufacturing the light-emitting device (takt time), which can lead to increase in productivity.

The material layer of the deposition substrate which has been used for deposition once is removed and a new material layer is formed again, so that the deposition substrate can be used plural times. Accordingly, the cost spent on manufacturing a light-emitting device can be reduced. A glass substrate or a quartz substrate is used as a supporting substrate of the deposition substrate of the present invention. An impurity (moisture or the like) is not likely to be adsorbed or attached to these substrates, as compared to a film substrate or the like. Accordingly, the deposition substrate of the present invention is suitable for reuse.

In the present invention, unlike the case where the EL layer is formed by a wet process, it is not necessary to take into consideration solubility of the layer which has been formed, or the like; therefore, a material to be deposited can be chosen from a wider range. Further, the number of layers to be stacked can be set freely. Accordingly, a light-emitting device having a desired stacked structure can be manufactured using a desired material. It is important that a kind of a material to be used or a stacked structure can be set freely in terms of improvement in performance of the light-emitting device particularly when the size of a substrate is increased.

Moreover, in manufacture of a light-emitting device capable of full-color display which is described in this embodiment mode, application of the present invention makes it possible to deposit a desired material on the deposition target substrate without being wasted. Thus, use efficiency of a material is increased, so that manufacturing cost can be reduced. Moreover, materials can be prevented from being attached to an inner wall of a deposition chamber, and thus maintenance of the deposition apparatus can be facilitated.

Further, in the present invention, laser light having a high output can be used as a light source, and thus deposition on a large area can be performed at a time. Thus, time taken for manufacturing the light-emitting device (takt time) can be reduced, which can lead to increase in productivity.

In manufacture of a light-emitting device capable of full-color display which is described in this embodiment mode, the thickness of the film which is deposited on the deposition target substrate can be controlled by controlling the thickness of a material layer which is formed over the deposition substrate. In other words, since the thickness of the material layer is controlled in advance, a film which is formed on the deposition target substrate can have a desired thickness when all materials contained in the material layer which is formed over the deposition substrate is deposited; therefore, a thickness monitor is not needed at the time of deposition on the deposition target substrate. Therefore, a user does not have to adjust the deposition rate with a thickness monitor, and the deposition steps can be fully automated. Accordingly, productivity can be increased.

In addition, in manufacture of a light-emitting device capable of full-color display which is described in this embodiment mode, application of the present invention makes it possible to uniformly deposit a material included in the material layer which is formed over the deposition substrate. In the case where the material layer includes plural kinds of materials, a film containing the same materials at roughly the same weight ratio as the material layer can be deposited on the deposition target substrate. Therefore, in the deposition method of the present invention, when deposition is performed using plural kinds of materials having different vaporization temperatures, a desired layer including different kinds of materials can be deposited easily with high precision without complicated control of the evaporation rate or the like.

Further, in manufacture of a light-emitting device capable of full-color display which is described in this embodiment mode, in the case of using the deposition substrate described in Embodiment Mode 2, layers which include the same materials and have different thicknesses can be deposited in one deposition step. Accordingly, with the use of the deposition substrate described in Embodiment Mode 2, layers which are used in common in light-emitting elements of each emission color can have different thicknesses without increasing the number of deposition steps. More specifically, in forming a hole-injecting layer, a hole-transporting layer, an electron-injecting layer, and an electron-transporting layer which are used in common in light-emitting elements of each emission color, the thicknesses thereof can be made different in the light-emitting elements of each emission color and can be optimized. Therefore, performance (e.g. efficiency or color reproducibility) of the light-emitting device can be improved.

For example, at the time of manufacturing a full-color light-emitting device, in order to obtain a microcavity effect, the EL layers can be formed easily so as to have different thicknesses in light-emitting elements of each emission color of R, G and B.

Note that the structure described in this embodiment mode can be used in combination with any of the structures described in other embodiment modes, as appropriate.

Embodiment Mode 5

In this embodiment mode, an example of a deposition apparatus which performs deposition by irradiating a deposition substrate with laser light and a method of laser irradiation will be described.

Figure 9:
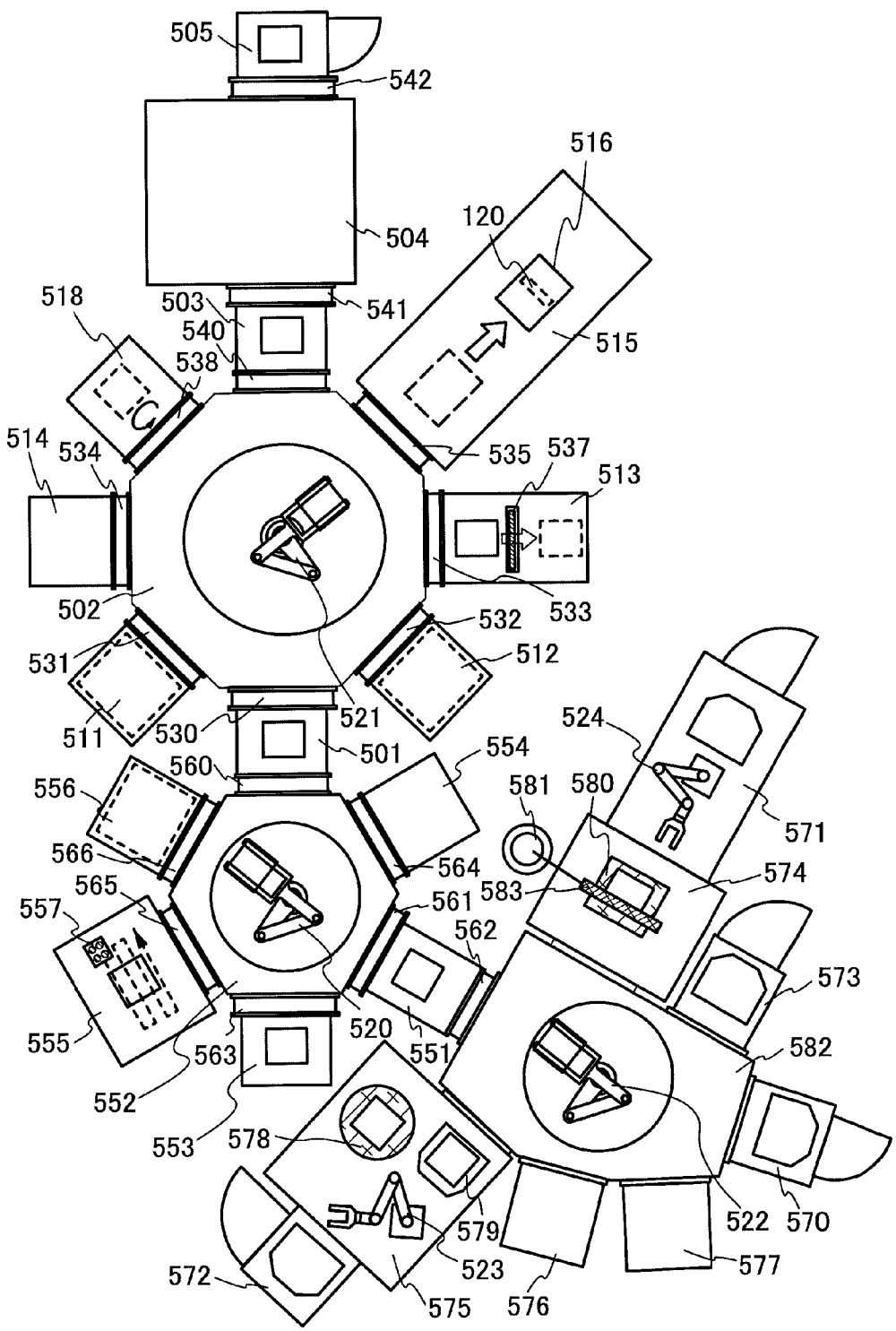
FIG. 9 is a view illustrating a deposition apparatus.

FIG. 9 illustrates a top view of an example of the manufacturing apparatus.

The manufacturing apparatus illustrated in FIG. 9 includes a first transfer chamber 582 and a second transfer chamber 552, which are connected to each other through a first delivery chamber 551. Further, the manufacturing apparatus includes a third transfer chamber 502, which is connected to the second transfer chamber 552 through a second delivery chamber 501. Furthermore, the manufacturing apparatus includes a sealing chamber 504, which is connected to the third transfer chamber 502 through a third delivery chamber 503.

The second transfer chamber 552, the third transfer chamber 502, and the sealing chamber 504 can each be connected to a vacuum evacuation treatment chamber and evacuated to a vacuum so that moisture or the like cannot enter the chamber, and after vacuum evacuation, insides thereof can also be made in the atmospheric pressure state by introducing an inert gas. For the vacuum evacuation treatment chamber, a magnetic levitation turbo molecular pump, a cryopump, or a dry pump is used. With such a pump, the ultimate vacuum in the transfer chambers connected to other chambers can be set to be $10^{-3}$ Pa to $10^{-6}$ Pa, and reverse diffusion of impurities from the pump side and from an exhaust system can be controlled.

First, a first substrate 101 which is a deposition substrate, is placed in a first cassette chamber 571, a second cassette chamber 572, or a third cassette chamber 573. One chamber is selected from the three cassette chambers according to a film which is formed on the deposition substrate. Note that light absorption layer 102 is selectively formed in advance on the first substrate 101 by a photolithography technique or the like.

In the case where material layers are selectively formed on the first substrate 101 with a droplet discharge apparatus, the first substrate 101 is set in a face-up mode in the first cassette chamber 571, and is transferred to a treatment chamber 574 having a droplet discharge apparatus with the use of a transfer unit 524 provided for the first cassette chamber 571, and droplets are discharged. The transfer unit 524 can turn a substrate upside down, and the substrate can be transferred upside down into the treatment chamber 574; therefore, the first substrate 101 may be set in a face-down mode in the first cassette chamber 571 in order to prevent dust from attaching on the light absorption layer on the first substrate 101.

The treatment chamber 574 is provided with a droplet discharge unit 583 having a head with a plurality of nozzles arranged in an axial direction, a control portion that controls the droplet discharge unit 583, a stage 580 that fixes a substrate and moves in X, Y, and θ directions, an ink bottle 581 that supplies the droplet discharge unit 583 with a composition, and the like.

The first substrate on which the droplets have been dripped is transferred to a bake chamber 576 using a transfer unit 522 of the first transfer chamber 582 connected to the treatment chamber 574, and drying or baking is performed. A plurality of substrates can be heated in the bake chamber 576, which can also function as a stock chamber for stocking the first substrate.

In the case where a material layer is formed over the entire surface of the first substrate 101 with a coating apparatus using a spin coating method, a spray method, or the like, the first substrate 101 is set in a face-up mode in the second cassette chamber 572, and is transferred to a treatment chamber 575 having a coating apparatus with the use of a transfer unit 523 provided for the treatment chamber 575, and application is performed. The transfer unit 523 can also turn a substrate upside down, and the substrate can be placed upside down onto a stage 578; therefore, the first substrate 101 may be set in a face-down mode in the second cassette chamber 572 in order to prevent dust from attaching to the light absorption layer on the first substrate 101.

The treatment chamber 575 is provided with a nozzle that drips a material liquid, the stage 578 that fixes a substrate and rotates, a control portion that controls the number of rotations of the stage, a table 579 on which a substrate coated with the material liquid is placed, a tank that supplies the nozzle with the material liquid, and the like.

The first substrate which has undergone application is transferred to the bake chamber 576 using the transfer unit 522 of the first transfer chamber 582 connected to the treatment chamber 575, and drying or baking is performed.

In the case where a material layer is formed on the first substrate by a resistive heating method, the first substrate 101 is set in a face-down mode in the third cassette chamber 573, and is transferred to the first delivery chamber 551 with the use of the transfer unit 522 of the first transfer chamber 582 connected to the third cassette chamber 573. Further, the first substrate 101 is transferred to a pretreatment chamber 553 using a transfer unit 520 provided for the second transfer chamber 552 connected to the first delivery chamber 551, and in order to remove moisture or gases contained in the substrate with great thoroughness, annealing for degasification is performed in a vacuum (less than or equal to $5 \times 10^{-3}$ Pa, preferably $10^{-4}$ Pa to $10^{-6}$ Pa). Then, the first substrate 101 is transferred to a treatment chamber 555 using the transfer unit 520, and evaporation is performed by a resistive heating method.

The treatment chamber 555 is provided with a means which moves an evaporation source 557 along a path indicated by a dotted line in the chamber, a means which fixes a substrate, a thickness monitor, a vacuum evacuation treatment chamber, and the like. A plurality of crucibles are provided for the evaporation source 557, and evaporation materials in the crucibles are heated by a resistive heating method. In the treatment chamber 555, the evaporation source is moved under the substrate set in a face-down mode, whereby evaporation is performed. In the case where films are formed selectively with an evaporation mask, an evaporation mask stocked in a treatment chamber 554 is transferred to the treatment chamber 555, and the evaporation mask is aligned with the substrate, and evaporation is performed.

The first substrate 101 that is set in the first cassette chamber 571, the second cassette chamber 572, or the third cassette chamber 573 and is provided with a material layer as appropriate in the treatment chamber is transferred to the third transfer chamber 502 and is further transferred to a laser irradiation chamber 515 using a transfer unit 521 provided for the third transfer chamber 502, with a surface provided with the material layer up, i.e., in a face-up mode. In the case where the material layer on the first substrate is formed by an evaporation method, the surface provided with the material layer faces down when the material layer has been formed; therefore, in such a case, the substrate is turned upside down with a substrate turning mechanism provided for a treatment chamber 518, and then is transferred to the laser irradiation chamber 515.

The treatment chamber 518 may be used not only for turning a substrate upside down but also for stocking a plurality of substrates. If the transfer unit 521 can turn a substrate upside down, it is not necessary to provide the substrate turning mechanism for the treatment chamber 518, and the treatment chamber 518 can be used for stocking a plurality of substrates.

Further, a second substrate which serves as a deposition target substrate is set in a face-down mode in a fourth cassette chamber 570, and is transferred to the first delivery chamber 551 using the transfer unit 522 of the first transfer chamber 582 connected to the fourth cassette chamber 570. Furthermore, the second substrate is transferred to the pretreatment chamber 553 using the transfer unit 520 provided for the second transfer chamber 552 connected to the first delivery chamber 551, and in order to remove moisture or gases contained in the second substrate with great thoroughness, annealing for degasification is performed in a vacuum. In particular, in the case where a TFT is formed on the second substrate, if an organic resin film is used for an interlayer insulating film or a partition, some organic resin materials adsorb moisture easily and degasification might be caused; thus, it is effective to perform vacuum heating in which adsorbed moisture is removed by performing heating at 100° C. to 350° C., preferably at 150° C. to 200° C. for, for example, 30 minutes or more and performing cooling down naturally for 30 minutes before a layer including an organic compound is formed.

If a passive matrix light-emitting device is manufactured, at least a first electrode in a stripe form is formed on the second substrate, in advance. In the case of manufacturing an active matrix light-emitting device, a first electrode and a switching element that is electrically connected to the first electrode, such as a thin film transistor in which an amorphous semiconductor film, a polycrystalline semiconductor film, a microcrystalline semiconductor film, or a single crystal semiconductor film functions as an active layer, are formed on the second substrate, in advance.

After that, the second substrate which serves as the deposition target substrate is transferred to the second delivery chamber 501 using the transfer unit 520, and is further transferred to the laser irradiation chamber 515 using the transfer unit 521 provided for the third transfer chamber 502 connected to the second delivery chamber 501, with a surface provided with the first electrode down, i.e., in a face-down mode.

The laser irradiation chamber 515 has a window 120 for introducing laser light emitted from a laser light source into the laser irradiation chamber, at a bottom portion.

After the first substrate is transferred to the laser irradiation chamber 515, the first substrate is aligned with the second substrate which serves as the deposition target substrate to face each other, and a distance d between the substrates is kept constant with a pair of substrate holding units 516. Then, the pair of substrates is irradiated with laser light, and a laser irradiation region is moved relatively to be scanned with the laser light.

Figure 10:
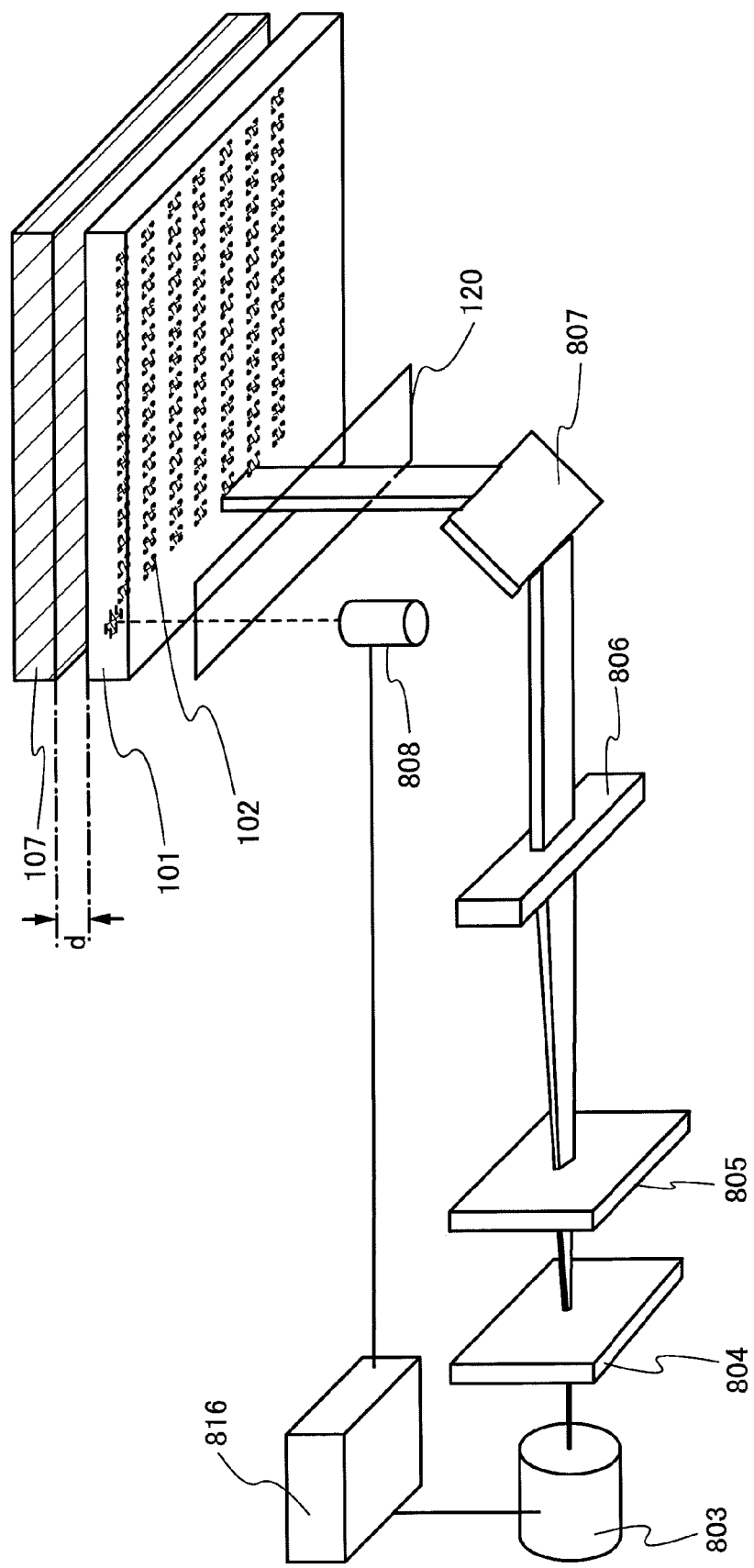
FIG. 10 is a view illustrating a deposition apparatus.

FIG. 10 is a schematic diagram illustrating a positional relation between the window 120 and a laser device 803 in forming films.

The emitted laser light is outputted from the laser device 803, passes through a first optical system 804 for changing a beam form into a rectangular shape, a second optical system 805 for shaping a beam, and a third optical system 806 for collimating a beam, and an optical path is inverted into a direction perpendicular to the first substrate 101 by using a reflecting mirror 807. Then, the laser beam passes through the window 120 for transmitting light and through the first substrate 101, so that the light absorption layer 102 is irradiated with the laser light. The window 120 may have a same or smaller size as/than a width of the laser beam, which can also be functioned as a slit.

The laser device 803 emits laser light having a repetition rate of greater than or equal to 10 MHz and a pulse width of greater than or equal to 100 fs and less than or equal to 10 ns. With the laser light having a repetition rate of greater than or equal to 10 MHz and a pulse width of greater than or equal to 100 fs and less than or equal to 10 ns, laser irradiation can be performed in a short time. Thus, heat diffusion can be suppressed, and the size of a region of the material layer which overlaps with the light absorption layer 102 before the laser irradiation can be almost the same as the size of a region of a film which is disposed on the second substrate after the laser light irradiation, so that a thin film can be formed around a film formation pattern and formation of a larger pattern than what a practitioner desires can be prevented. If the thin film is formed around the film formation pattern, an outline of the film formation pattern blurs; the laser light having a pulse width of greater than or equal to 100 fs and less than or equal to 10 ns can reduce the blur of the outline. There is no particular limitation on the wavelength of laser light, and laser light with a variety of wavelengths can be employed. For example, laser light having a wavelength of 355 nm, 515 nm, 532 nm, 1030 nm, 1064 nm, or the like can be employed.

It is preferable that a control device 816 be interlocked such that it can also control the pair of substrate holding units 516 that move the pair of substrates. Further, the control device 816 is preferably interlocked such that it can also control the laser device 803. Furthermore, it is preferable that the control device 816 work with a position alignment mechanism having an imaging element 808 for determining a position marker.

When the scanning with laser light is completed, the region of the material layer which overlaps with the light absorption layer 102 is disappeared from the first substrate 101 and a film is formed selectively on the second substrate 107 that faces the first substrate 101.

If the first substrate 101 which has undergone scanning with laser light is collected and the remaining material layer is removed therefrom, the first substrate 101 can be used again. The first substrate 101 which has undergone scanning with laser light is transferred to a cleaning chamber 577 in order to clean the first substrate which has undergone laser light irradiation, and the remaining material layer is removed.

Through the above procedure, the material layer with a single layer structure can be formed selectively on the second substrate 107. If a material layer with a stacked structure are formed, a third substrate is prepared in advance; the first substrate 101 which has undergone scanning with laser light is replaced with the third substrate; the third substrate is aligned with the second substrate 107 to face each other in the laser irradiation chamber 515; and the distance between the substrates is kept constant with the pair of substrate holding units 516. After that, the pair of substrates is irradiated with laser light, and second scanning with laser light is further performed with a laser irradiation region moved relatively.

The third substrate is provided with a light absorption layer. In a similar manner to the first substrate, the third substrate is set in the first cassette chamber 571, the second cassette chamber 572, or the third cassette chamber 573, and a material layer which serves as a second layer is formed as appropriate in the treatment chamber.

If a plurality of layers are stacked in the laser irradiation chamber 515, a fourth substrate is taken into the laser irradiation chamber 515 without taking the second substrate out of the laser irradiation chamber 515; the second substrate is aligned with the fourth substrate to face each other, and are irradiated with laser light; and third scanning with laser light is performed with a laser irradiation region moved relatively. Through a similar procedure, four or more layers can be stacked.

In the case where a film is formed with the use of the laser irradiation chamber 515, a material layer is formed on the first substrate, the third substrate, the fourth substrate, and the like and the substrates are stocked in the treatment chamber 518 in advance before the second substrate is taken into the laser light irradiation chamber 515; after the second substrate is taken into the laser light irradiation chamber 515, the deposition substrate is changed successively and a layer is stacked, so that the steps can proceed efficiently. In the deposition method in which a material layer that is formed in advance on a different substrate from the deposition target substrate is heated with laser light, the amount of the material which is necessary for performing deposition is suppressed and the amount of the material evaporated is reduced as compared to that in a conventional resistance heating method; thus, a plurality of transfer robots, alignment units, substrate move units, or the like can be provided for the laser irradiation chamber 515 for performing deposition. Further, the deposition method in which a material layer that is formed in advance on a different substrate from a deposition target substrate is heated with laser light can prevent different light-emitting materials from mixing even if a different light-emitting layer is formed in the same treatment chamber (in the laser irradiation chamber 515).

When five or more layers are formed as an EL layer included in a light-emitting element, it is possible to form all the layers of the EL layer with the use of the laser irradiation chamber 515; at least one layer is formed with the use of the laser irradiation chamber 515.

For example, after a hole-injecting layer and a hole-transporting layer are stacked on a first electrode with the use of the laser irradiation chamber 515, a red light-emitting layer and a green light-emitting layer can be formed selectively and a blue light-emitting layer may be formed in a treatment chamber 512 by a resistive heating method in which a substrate is rotated. If a blue light-emitting layer is formed selectively, an evaporation mask stocked in the treatment chamber 554 is transferred to the treatment chamber 512 and is aligned with the second substrate to perform evaporation. An evaporation source, a substrate rotating unit, a means for alignment with an evaporation mask, a thickness monitor, and the like are provided for the treatment chamber 512.

In the case where an electron-transporting layer or an electron-injecting layer is formed by a resistive heating method, it may be formed in a treatment chamber 513. A means for moving the second substrate in a direction indicated by an arrow over an evaporation source 537 in the chamber, a thickness monitor, a vacuum evacuation treatment chamber, and the like are provided for the treatment chamber 513. The evaporation source 537 has a long line form, and an evaporation material is heated by a resistive heating method. If a film is formed selectively, an evaporation mask stocked in the treatment chamber 554 is transferred to the treatment chamber 513, and is aligned with the second substrate; then, evaporation is performed with the second substrate and the evaporation mask moved.

In the case where a hole-injecting layer or a hole-transporting layer is formed by a resistive heating method, it may be formed in the treatment chamber 555.

In the case where a red light-emitting layer is formed by a resistive heating method, it may be formed in a treatment chamber 511. In the case where a green light-emitting layer is formed by a resistive heating method, it may be formed in a treatment chamber 556. An evaporation source, a substrate rotating unit, a thickness monitor, a means for alignment with an evaporation mask, a vacuum evacuation treatment chamber, and the like are provided for each of the treatment chambers 511 and 556. Although this embodiment mode gives an example in which light emitting layers of different emission colors are formed in their respective treatment chambers 556, 511, and 512, there is no particular limitation. For example, the red light-emitting layer may be formed in the treatment chamber 555 or 513, and a practitioner may select a chamber as appropriate. Further, needless to say, the hole-injecting layer, the hole-transporting layer, the electron-transporting layer, or the electron-injecting layer may be formed in the treatment chamber 556, 511, or 512.

An example is given here in which after the second substrate is set in the fourth cassette chamber 570, the second substrate is transferred to the second transfer chamber 552 without being transferred to another treatment chamber. However, before the second substrate is transferred to the second transfer chamber 552, a film may be formed on the second substrate in the treatment chamber 575 or 574, and the second substrate may be transferred to the laser irradiation chamber 515 to stack layers. In such a case, a macromolecule such as poly(3,4-ethylenedioxythiophene)/poly(styrenesulfonic acid) (PEDOT/PSS) can be used for the hole-injecting layer on the first electrode. As a substance having a high hole-transporting property which is used for the hole-injecting layer, any of a variety of compounds such as a macromolecular compound (an oligomer, a dendrimer, a polymer, and the like) can be used.

If a PEDOT/PSS film is formed by a spin coating method, the film is formed over the entire surface; thus, it is preferable to selectively remove the film at a side face or a periphery portion of the second substrate, a terminal portion, a region in which a cathode (the second electrode) and a lower wiring are connected, and the like using a mask by $O_2$ ashing or the like in the pretreatment chamber 553. A plasma producing unit is provided for the pretreatment chamber 553, and one or plural kinds of gases selected from Ar, H, F, or O are excited to produce plasma, thereby performing dry etching. With the use of a mask, only an unnecessary portion can be removed selectively. Further, a UV irradiation mechanism may be provided for the pretreatment chamber 553 so that ultraviolet ray irradiation can be performed as a surface treatment for an anode (the first electrode). As described above, preferably, not only vacuum heating but also other treatments such as a plasma treatment or a UV irradiation treatment can be performed in the pretreatment chamber 553.

After the EL layer is formed on the second substrate through any one of the film formation processes described above, an electrode which functions as the second electrode of the light-emitting element is formed. The second electrode is formed by a sputtering method, an electron beam method, or the like. If a sputtering method is employed, a plasma producing unit, a sputtering target, and a means for introducing a source gas are provided for a treatment chamber 514.

Since a film is formed in a face-down mode when a sputtering method or an electron beam method is employed, the second substrate can be transferred smoothly out of the laser irradiation chamber 515 or the treatment chamber in which a resistive heating method is used.

After the second electrode is formed, the second substrate is transferred to the third delivery chamber 503 through a gate valve 540 using the transfer unit 521, and further to the sealing chamber 504 through a gate valve 541. The substrate which has undergone sealing in the sealing chamber 504 is transferred to an unload chamber 505 through a gate valve 542, and can be taken out of the manufacturing apparatus. Through the above process, a light-emitting diode (also referred to as an EL element) can be manufactured.

In the manufacturing apparatus illustrated in FIG. 9, each treatment chamber and each transfer chamber in which the pressure is: reduced are provided with their respective gate valves 530 to 535, 538, and 560 to 566.

By using such a deposition apparatus, the light-emitting device can be manufactured. With the use of the deposition apparatus described in this embodiment mode, deposition substrates in each of which the material layer is formed are prepared in advance and the deposition substrates are replaced, so that deposition can be performed on the deposition target substrate one after another. Accordingly, the time taken for deposition (takt time) can be shortened, which can lead to increase in productivity.

Further, application of the present invention makes it possible to form a flat even film. Furthermore, a minute pattern can be formed and deformation which is pattern deposition except a desired pattern can be suppressed. Accordingly, a high-definition light-emitting device can be obtained.

In the present invention, unlike the case where the EL layer is formed by a wet process, it is not necessary to take into consideration solubility of the layer which has been formed, or the like; therefore, a material to be deposited can be chosen from a wider range. Further, the number of layers to be stacked can be set freely. Accordingly, a light-emitting device having a desired stacked structure can be manufactured using a desired material. It is important that a kind of a material to be used or a stacked structure can be set freely in terms of improvement in performance of the light-emitting device particularly when the size of a substrate is increased.

Moreover, in manufacture of a light-emitting device capable of full-color display which is described in this embodiment mode, application of the present invention makes it possible to deposit a desired material on the deposition target substrate without being wasted. Thus, use efficiency of a material is increased, so that manufacturing cost can be reduced. Moreover, materials can be prevented from being attached to an inner wall of a deposition chamber, and thus maintenance of the deposition apparatus can be facilitated.

Further, in the present invention, laser light having a high output can be used as a light source, and thus deposition on a large area can be performed at a time. Thus, time taken for manufacturing the light-emitting device (takt time) can be reduced, which can lead to increase in productivity.

Further, in the present invention, since a thickness of a film to be deposited on the deposition target substrate can be controlled by controlling the thickness of the material layer formed over the deposition substrate, a thickness monitor is not needed at the time of deposition on the deposition target substrate. Therefore, a user does not have to adjust the deposition rate with a thickness monitor, and the deposition steps can be fully automated. Accordingly, productivity can be increased.

In addition, application of the present invention makes it possible to uniformly deposit the material included in the material layer which is formed over the deposition substrate. In the case where the material layer includes plural kinds of materials, a film containing the same materials at roughly the same weight ratio as the material layer can be deposited on the deposition target substrate. Therefore, in the deposition method of the present invention, when deposition is performed using plural kinds of materials having different vaporization temperatures, a desired layer including different kinds of materials can be deposited easily with high precision without complicated control of the evaporation rate or the like.

Further, in the case of manufacturing a light-emitting device using the deposition substrate described in Embodiment Mode 2, layers which include the same material and have different thicknesses can be deposited in one deposition step. Accordingly, an optical design can be optimized in such a manner that layers which are used in common in light-emitting elements of each emission color are deposited so as to have different thicknesses without increasing the number of deposition steps. Therefore, performance of the light-emitting device (efficiency, color purity, or the like) can be improved.

Note that the structure described in this embodiment mode can be used in combination with any of structures described in other embodiment modes, as appropriate.

Embodiment Mode 6

In this embodiment mode, a manufacturing method of a light-emitting element and a light-emitting device by application of the present invention will be described.

Figure 11A:
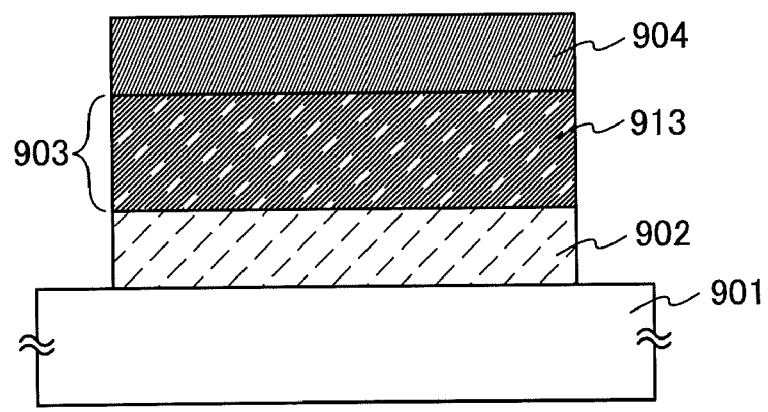
FIGS. 11A and 11B are views each illustrating a light-emitting element.
Figure 11B:
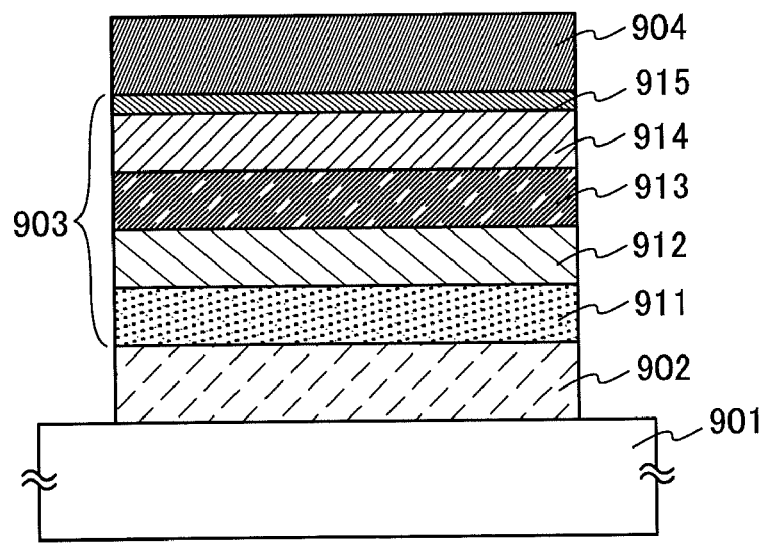

For example, light-emitting elements illustrated in FIGS. 11A and 11B can be manufactured by application of the present invention. In the light-emitting element illustrated in FIG. 11A, a first electrode 902, an EL layer 903 which includes only a light-emitting layer 913 and a second electrode 904 are stacked in that order over a substrate 901. One of the first electrode 902 and the second electrode 904 functions as an anode, and the other functions as a cathode. Holes injected from an anode and electrons injected from a cathode are recombined in the EL layer 903, so that light emission can be obtained. In this embodiment mode, the first electrode 902 functions as the anode and the second electrode 904 functions as the cathode.

In the light-emitting element illustrated in FIG. 11B, the EL layer 903 in FIG. 11A has a stacked structure including a plurality of layers. Specifically, a hole-injecting layer 911, a hole-transporting layer 912, the light-emitting layer 913, an electron-transporting layer 914, and an electron-injecting layer 915 are provided in that order from the first electrode 902 side. Note that the EL layer 903 functions by including at least the light-emitting layer 913 as illustrated in FIG. 11A; therefore, all of the above layers are not always necessary and may be selected as appropriate to be provided as needed.

As the substrate 901 illustrated in FIGS. 11A and 11B, a substrate having an insulating surface or an insulating substrate is employed. Specifically, any of a variety of glass substrates used for the electronics industry such as an aluminosilicate glass substrate, an aluminoborosilicate glass substrate, or a barium borosilicate glass substrate; a quartz substrate; a ceramic substrate; a sapphire substrate; or the like can be used.

For the first electrode 902 and the second electrode 904, any of various types of metals, alloys, electrically conductive compounds, mixtures thereof, or the like can be used. Specific examples are given below: indium tin oxide (ITO), indium tin oxide containing silicon or silicon oxide, indium zinc oxide (IZO), indium oxide containing tungsten oxide and zinc oxide, and the like. In addition, gold (Au), platinum (Pt), nickel (Ni), tungsten (W), chromium (Cr), molybdenum (Mo), iron (Fe), cobalt (Co), copper (Cu), palladium (Pd), nitride of a metal material (such as titanium nitride), and the like can be given.

A film of any of those materials is generally formed by a sputtering method. For example, a film of indium zinc oxide can be formed by a sputtering method using a target in which zinc oxide is added to indium oxide at 1 wt % to 20 wt %. A film of indium oxide containing tungsten oxide and zinc oxide can be formed by a sputtering method using a target in which tungsten oxide and zinc oxide are added to indium oxide at 0.5 wt % to 5 wt % and 0.1 wt % to 1 wt %, respectively. Further, a film of any of those materials may be formed by an inkjet method, a spin coating method, or the like by application of a sol-gel process or the like.

Furthermore, aluminum (Al), silver (Ag), an alloy including aluminum, or the like can be used.

Moreover, any of the following materials having a low work function can be used: elements which belong to Group 1 or Group 2 of the periodic table, that is, an alkali metal such as lithium (Li) or cesium (Cs), an alkaline earth metal such as magnesium (Mg), calcium (Ca), or strontium (Sr), or an alloy thereof (an alloy of aluminum, magnesium, and silver, or an alloy of aluminum and lithium); a rare earth metal such as europium (Eu) or ytterbium (Yb) or an alloy thereof; or the like.

A film of an alkali metal, an alkaline earth metal, and an alloy thereof can be formed by a vacuum evaporation method. A film of an alloy including an alkali metal or an alkaline earth metal can be formed by a sputtering method. Further, a film of a silver paste or the like can be formed by an inkjet method or the like. The first electrode 902 and the second electrode 904 are not limited to a single layer film and can be formed as a stacked film.

Note that in order to extract light emitted from the EL layer 903 to the outside, one of or both the first electrode 902 and the second electrode 904 are formed so as to transmit light. For example, one of or both the first electrode 902 and the second electrode 904 are formed using a conductive material having a light-transmitting property, such as indium tin oxide, or formed using silver, aluminum, or the like with a thickness of several nanometers to several tens of nanometers. Alternatively, one of or both the first electrode 902 and the second electrode 904 can have a stacked structure including a thin film of a metal such as silver or aluminum with a reduced thickness and a thin film of a conductive material having a light-transmitting property, such as an ITO film.

The EL layer 903 (the hole-injecting layer 911, the hole-transporting layer 912, the light-emitting layer 913, the electron-transporting layer 914, or the electron-injecting layer 915) of the light-emitting element in this embodiment mode can be formed by application of the deposition method described in any of Embodiment Modes 1 to 3. In addition, the electrode can also be formed by application of the deposition method described in any of Embodiment Modes 1 to 3.

For example, in the case where the light-emitting element illustrated in FIG. 11A is formed, a material layer of the deposition substrate described in Embodiment Mode 1 is formed using a material which forms the EL layer 903, and the EL layer 903 is formed over the first electrode 902 over the substrate 901 using the deposition substrate. Then, the second electrode 904 is formed over the EL layer 903, whereby the light-emitting element illustrated in FIG. 11A can be obtained.

Any of a variety of materials can be used for the light-emitting layer 913. For example, a fluorescent compound which exhibits fluorescence or a phosphorescent compound which exhibits phosphorescence can be used.

Examples of a phosphorescent compound which is used for the light-emitting layer 913 are given below. As a material for blue light emission, bis[2-(4',6'-difluorophenyl)pyridinato-N,C$^{2'}$]iridium(III)tetrakis(1-pyrazolyl)borate (abbreviation: FIr6), bis[2-(4',6'-difluorophenyl)pyridinato-N,C$^{2'}$]iridium(III)picolinate (abbreviation: FIrpic), bis[2-(3',5'bistrifluoromethylphenyl)pyridinato-N,C$^{2'}$]iridium(III)picolinate (abbreviation: Ir(CF$_3$ ppy)$_2$(pic)), bis[2-(4',6'-difluorophenyl)pyridinato-N, C$^{2'}$]iridium(III)acetylacetonate (abbreviation: FIr(acac)), and the like can be given. As a material for green light emission, tris(2-phenylpyridinato-N, C$^{2'}$)iridium(III) (abbreviation: Ir(ppy)$_3$), bis[2-phenylpyridinato-N,C$^{2'}$]iridium(III)acetylacetonate (abbreviation: Ir(ppy)$_2$(acac)), bis(1,2-diphenyl-1H-benzimidazolato)iridium(III)acetylacetonate (abbreviation: Ir(pbi)$_2$(acac)), bis(benzo[h]quinolinato)iridium(III)acetylacetonate (abbreviation: Ir(bzq)$_2$(acac)), and the like can be given. As a material for yellow light emission, bis(2,4-diphenyl-1,3-oxazolato-N, C$^{2'}$)iridium(III) acetylacetonate (abbreviation: Ir(dpo)$_2$(acac)), bis[2-(4'-perfluorophenylphenyl)pyridinato]iridium(III)acetylacetonate (abbreviation: Ir(p-PF-ph)$_2$(acac)), bis(2-phenylbenzothiazolato-N, C$^{2'}$)iridium(III)acetylacetonate (abbreviation: Ir(bt)$_2$(acac)), and the like can be given. As a material for orange light emission, tris(2-phenylquinolinato-N,C$^{2'}$)iridium(III) (abbreviation: Ir(pq)$_3$), bis(2-phenylquinolinato-N, C$^{2'}$)iridium(III)acetylacetonate (abbreviation: Ir(pq)$_2$(acac)), and the like can be given. As a material for red light emission, organometallic complex such as bis[2-(2'-benzo[4,5-α]thienyl)pyridinato-N,C$^{3'}$]iridium(III) acetylacetonate (abbreviation: Ir(btp)$_2$(acac)), bis(1-phenylisoquinolinato-N, C$^{2'}$)iridium(III)acetylacetonate (abbreviation: Ir(piq)$_2$(acac)), (acetylacetonato)bis[2,3-bis(4-fluorophenyl)quinoxalinato]iridium(III) (abbreviation: Ir(Fdpq)$_2$(acac)), or (2,3,7,8,12,13,17,18-octaethyl-21H,23H-porphyrinato)platinum(II) (abbreviation: PtOEP) can be given. In addition, a rare earth metal complex such as tris(acetylacetonato)(monophenanthroline)terbium(III) (abbreviation: Tb(acac)$_3$(Phen)), tris(1,3-diphenyl-1,3-propanedionato)(monophenanthroline)europium(III) (abbreviation: Eu(DBM)$_3$(Phen)), or tris[1-(2-thenoyl)-3,3,3-trifluoroacetonato](monophenanthroline)europium(III) (abbreviation: Eu(TTA)$_3$(Phen)) performs light emission (electron transition between different multiplicities) from a rare earth metal ion; therefore, such a rare earth metal complex can be used as a phosphorescent compound.

Examples of a fluorescent compound which is used for the light-emitting layer 913 are given below. As a material for blue light emission, N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), and the like can be given. As a material for green light emission, N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), N,N,9-triphenylanthracen-9-amine (abbreviation: DPhAPhA), and the like can be given. As a material for yellow light emission, rubrene, 5,12-bis(1,1'-biphenyl-4-yl)-6,11-diphenyltetracene (abbreviation: BPT), and the like can be given. As a material for red light emission, N,N,N',N'-tetrakis(4-methylphenyl)tetracene-5,11-diamine (abbreviation: p-mPhTD), 7,13-diphenyl-N,N,N',N'-tetrakis(4-methylphenyl)acenaphtho[1,2-a]fluoranthene-3,10-diamine (abbreviation: p-mPhAFD), and the like can be given.

The light-emitting layer 913 may have a structure in which a substance having a high light-emitting property (dopant material) is dispersed in another substance (host material), whereby crystallization of the light-emitting layer can be suppressed. In addition, concentration quenching which results from high concentration of the substance having a high light-emitting property can be suppressed.

As the substance in which the substance having a high light-emitting property is dispersed, when the substance having a high light-emitting property is a fluorescent compound, a substance having higher singlet excitation energy (the energy difference between a ground state and a singlet excited state) than the fluorescent compound is preferably used. When the substance having a high light-emitting property is a phosphorescent compound, a substance having higher triplet excitation energy (the energy difference between a ground state and a triplet excited state) than the phosphorescent compound is preferably used.

Examples of host materials used for the light-emitting layer 913 are given below: 4,4'-bis[N-(1-naphthyl)-N-phenylamino]biphenyl (abbreviation: NPB), tris(8-quinolinolato)aluminum(III) (abbreviation: Alq), 4,4'-bis[N-(9,9-dimethylfluoren-2-yl)-N-phenylamino]biphenyl (abbreviation: DFLDPBi), bis(2-methyl-8-quinolinolato)(4-phenylphenolato)aluminum(III) (abbreviation: BAlq), 4,4'-di(9-carbazolyl)biphenyl (abbreviation: CBP), 2-tert-butyl-9,10-di(2-naphthyl)anthracene (abbreviation: t-BuDNA), 9-[4-(9-carbazolyl)phenyl]-10-phenylanthracene (abbreviation: CzPA), and the like.

As the dopant material, any of the above-mentioned phosphorescent compounds or fluorescent compounds can be used.

When the light-emitting layer 913 has a structure in which a substance having a high light-emitting property (dopant material) is dispersed in another substance (host material), a mixed layer of a host material and a guest material is formed as the material layer over the deposition substrate. Alternatively, the material layer over the deposition substrate may have a structure in which a layer including a host material and a layer including a dopant material are stacked. By forming the light-emitting layer 913 using a deposition substrate with the material layer having such a structure, the light-emitting layer 913 includes a substance in which a light-emitting material is dispersed (host material) and a substance having a high light-emitting property (dopant material), and has a structure in which the substance having a high light-emitting property (dopant material) is dispersed in the substance in which a light-emitting material is dispersed (host material). Note that for the light-emitting layer 913, two or more kinds of host materials and a dopant material may be used, or two or more kinds of dopant materials and a host material may be used. Alternatively, two or more kinds of host materials and two or more kinds of dopant materials may be used.

In the case where the light-emitting element illustrated in FIG. 11B is formed, the deposition substrate described in any of Embodiment Modes 1 to 3, which has a material layer formed using a material for forming each layer in the EL layer 903 (the hole-injecting layer 911, the hole-transporting layer 912, the light-emitting layer 913, the electron-transporting layer 914, and the electron-injecting layer 915) is prepared, and deposition of each layer is performed using a different deposition substrate by the method described in any of Embodiment Modes 1 to 3, whereby the EL layer 903 can be formed over the first electrode 902 over the substrate 901. Then, the second electrode 904 is formed over the EL layer 903; thus, the light-emitting element illustrated in FIG. 11B can be formed. Note that although all the layers in the EL layer 903 can also be formed by the method described in any of Embodiment Modes 1 to 3 in this case, only part of the layers in the EL layer 903 may be formed by the method described in any of Embodiment Modes 1 to 3. Note that since the method described in any of Embodiment Modes 1 to 3 is capable of forming a minute pattern, it is preferable to apply the method to a light-emitting layer in the case of manufacturing a full-color display device. In addition, it is preferable that the method described in any of Embodiment Modes 1 to 3 be applied to a low molecular organic compound.

For example, the hole-injecting layer 911 can be formed using molybdenum oxide, vanadium oxide, ruthenium oxide, tungsten oxide, manganese oxide, or the like. Alternatively, the hole-injecting layer 911 can be formed using a phthalocyanine-based compound such as phthalocyanine (abbreviation: $H_2Pc$) or copper phthalocyanine (abbreviation: CuPc), a macromolecular compound such as poly(3,4-ethylenedioxythiophene)/poly(styrenesulfonic acid) (PEDOT/PSS), or the like.

As the hole-injecting layer 911, a layer which includes a substance having a high hole-transporting property and a substance having an electron-accepting property can be used. The layer which includes a substance having a high hole-transporting property and a substance having an electron-accepting property has high carrier density and an excellent hole-injecting property. When the layer which includes a substance having a high hole-transporting property and a substance having an electron-accepting property is used as a hole-injecting layer which is in contact with an electrode that functions as an anode, any of a variety of metals, alloys, electrically conductive compounds, mixtures thereof, or the like can be used for the electrode regardless of the magnitude of work function of a material of the electrode which functions as an anode.

The layer which includes a substance having a high hole-transporting property and a substance having an electron-accepting property can be formed using, for example, a deposition substrate having a material layer which is a stack of a layer which includes a substance having a high hole-transporting property and a layer which includes a substance having an electron-accepting property.

Examples of the substance having an electron-accepting property which is used for the hole-injecting layer 911 are given below: 7,7,8,8-tetracyano-2,3,5,6-tetrafluoroquinodimethane (abbreviation: $F_4$-TCNQ), chloranil, and the like. Other examples are transition metal oxides. Still other examples are oxide of metal belonging to Group 4 to Group 8 of the periodic table. Specifically, vanadium oxide, niobium oxide, tantalum oxide, chromium oxide, molybdenum oxide, tungsten oxide, manganese oxide, and rhenium oxide are preferable because of their high electron-accepting properties. Among them, molybdenum oxide is especially preferable because it is stable also in the atmosphere, has a low hygroscopic property, and can be easily handled.

As the substance having a high hole-transporting property used for the hole-injecting layer 911, any of various compounds such as an aromatic amine compound, a carbazole derivative, an aromatic hydrocarbon, and a macromolecular compound (such as an oligomer, a dendrimer, or a polymer) can be used. Note that it is preferable that the substance having a high hole-transporting property used for the hole-injecting layer be a substance having a hole mobility of greater than or equal to $10^{-6}$ $cm^2/Vs$. Note that any other substances which have a hole-transporting property higher than an electron-transporting property may be used. Specific examples of the substance having a high hole-transporting property which can be used for the hole-injecting layer 911 are given below.

Examples of an aromatic amine compound which can be used for the hole-injecting layer 911 are given below: 4,4'-bis[N-(1-naphthyl)-N-phenylamino]biphenyl (abbreviation: NPB), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB). Other examples are as follows: N,N-bis(4-methylphenyl)(p-tolyl)-N,N'-diphenyl-p-phenylenediamine (abbreviation: DTDPPA), 4,4'-bis[N-(4-diphenylaminophenyl)-N-phenylamino]biphenyl (abbreviation: DPAB), 4,4'-bis(N-{4-[N'-(3-methylphenyl)-N'-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), and the like.

Specific examples of a carbazole derivative which can be used for the hole-injecting layer 911 are given below: 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of a carbazole derivative which can be used for the hole-injecting layer 911 are given below: 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthryl)phenyl]-9H-carbazole (abbreviation: CZPA), 1,4-bis[4-(N-carbazolyl)phenyl]-2,3,5,6-tetraphenylbenzene, and the like.

Examples of an aromatic hydrocarbon which can be used for the hole-injecting layer 911 are given below: 2-tert-butyl-9,10-di(2-naphthyl)anthracene (abbreviation: t-BuDNA), 2-tert-butyl-9,10-di(1-naphthyl)anthracene; 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butyl-anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides, pentacene, coronene, or the like can also be used. As these aromatic hydrocarbons listed here, it is preferable that an aromatic hydrocarbon having a hole mobility of greater than or equal to $1 \times 10^{-6}$ $cm^2/Vs$ and having 14 to 42 carbon atoms be used.

Note that an aromatic hydrocarbon which can be used for the hole-injecting layer 911 may have a vinyl skeleton. Examples of an aromatic hydrocarbon having a vinyl group are given below: 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

The hole-injecting layer 911 can be formed by using a deposition substrate having a material layer which is a stack of a layer which includes a substance having a high hole-transporting property and a layer which includes a substance having an electron-accepting property. When metal oxide is used as the substance having an electron-accepting property, it is preferable that a layer which includes metal oxide be formed after the layer which includes a substance having a high hole-transporting property be formed over a supporting substrate which is a deposition substrate. This is because, in many cases, metal oxide has a higher temperature at which evaporation can be performed than a substance having a high hole-transporting property. The deposition substrate with such a structure makes it possible to efficiently deposit a substance having a high hole-transporting property and metal oxide. In addition, local non-uniformity of the concentration in a film deposited can be suppressed. Further, there are few kinds of solvents which allow both a substance having a high hole-transporting property and metal oxide to be dissolved or dispersed therein, and a mixed solution is not easily formed; therefore, it is difficult to directly form a mixed layer by a wet process. However, the use of the deposition method of the present invention makes it possible to easily form a mixed layer which includes a substance having a high hole-transporting property and metal oxide.

In addition, the layer which includes a substance having a high hole-transporting property and a substance having an electron-accepting property is excellent in not only a hole-injecting property but also a hole-transporting property, and thus the above-described hole-injecting layer 911 may be used as the hole-transporting layer.

The hole-transporting layer 912 is a layer which includes a substance having a high hole-transporting property. Examples of the substance having a high hole-transporting property are given below: an aromatic amine compound such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), and 4,4'-bis[N-(spiro-9,9'-bifluoren-2-yl)-N-phenylamino]biphenyl (abbreviation: BSPB). Most of the substances mentioned here have a hole mobility of greater than or equal to $10^{-6}$ cm$^2$/Vs. Note that any other materials which have a hole-transporting property higher than an electron-transporting property may be used. Note that the layer which includes a substance having a high hole-transporting property is not limited to a single layer and may be a stacked layer of two or more layers formed using the above-mentioned substances.

The electron-transporting layer 914 is a layer which includes a substance having a high electron-transporting property. Examples thereof are given below: metal complexes having a quinoline skeleton or a benzoquinoline skeleton, such as tris(8-quinolinolato)aluminum (abbreviation: Alq), tris(4-methyl-8-quinolinolato)aluminum (abbreviation: Almq$_3$), bis(10-hydroxybenzo[h]quinolinato)beryllium (abbreviation: BeBq$_2$), and bis(2-methyl-8-quinolinolato)(4-phenylphenolato)aluminum (abbreviation: BAlq). Other examples are metal complexes having an oxazole-based ligand or a thiazole-based ligand, such as bis[2-(2-hydroxyphenyl)benzoxazolato]zinc (abbreviation: Zn(BOX)$_2$) and bis[2-(2-hydroxyphenyl)benzothiazolato]zinc (abbreviation: Zn(BTZ)$_2$). Besides metal complexes, other examples are given below: 2-(4-biphenylyl)-5-(4-tert-butylphenyl)-1,3,4-oxadiazole (abbreviation: PBD), 1,3-bis[5-(4-tert-butylphenyl)-1,3,4-oxadiazol-2-yl]benzene (abbreviation: OXD-7), 3-(4-biphenylyl)-4-phenyl-5-(4-tert-butylbiphenyl)-1,2,4-triazole (abbreviation: TAZ01), bathophenanthroline (abbreviation: BPhen), bathocuproine (abbreviation: BCP), and the like. Most of the substances mentioned here have an electron mobility of greater than or equal to $10^{-6}$ cm$^2$/Vs. Note that any other materials which have an electron-transporting property higher than a hole-transporting property may be used for the electron-transporting layer. The electron-transporting layer is not limited to a single layer and may be a stacked layer of two or more layers formed using the above-mentioned substances.

The electron-injecting layer 915 can be formed using an alkali metal compound or an alkaline earth metal compound, such as lithium fluoride (LiF), cesium fluoride (CsF), or calcium fluoride (CaF$_2$). Further, a layer in which a substance having an electron-transporting property is combined with an alkali metal or an alkaline earth metal can be employed. For example, a layer of Alq containing magnesium (Mg) can be used. Note that it is preferable that the layer in which a substance having an electron-transporting property is combined with an alkali metal or an alkaline earth metal be used as the electron-injecting layer because electrons are efficiently injected from the second electrode 904.

Note that there is no particular limitation on a stacked structure of layers of the EL layer 903. The EL layer 903 may be formed by an appropriate combination of a light-emitting layer with a layer formed using a substance having a high electron-transporting property, a substance having a high hole-transporting property, a substance having a high electron-injecting property, a substance having a high hole-injecting property, a bipolar substance (a substance having high electron-transporting and hole-transporting properties), or the like.

Light emission from the EL layer 903 is extracted to the outside through one of or both the first electrode 902 and the second electrode 904. Therefore, one of or both the first electrode 902 and the second electrode 904 are an electrode having a light-transmitting property. In the case where only the first electrode 902 is an electrode having a light-transmitting property, light is extracted from the substrate 901 side through the first electrode 902. In the case where only the second electrode 904 is an electrode having a light-transmitting property, light is extracted from the side opposite to the substrate 901 through the second electrode 904. In the case where both the first electrode 902 and the second electrode 904 are electrodes having a light-transmitting property, light is extracted from both the substrate 901 side and the side opposite to the substrate 901 through the first electrode 902 and the second electrode 904.

Note that although FIGS. 11A and 11B illustrate the structure in which the first electrode 902 functioning as an anode is provided on the substrate 901 side, the second electrode 904 functioning as a cathode may be provided on the substrate 901 side.

The EL layer 903 may be formed by the deposition method described in any of Embodiment Modes 1 to 3 or may be formed by a combination of the deposition method described in any of Embodiment Modes 1 to 3 with another deposition method. Further, each electrode and each layer may be formed by a different deposition method. Examples of a dry method include a vacuum evaporation method, an electron beam evaporation method, a sputtering method, and the like. Examples of a wet process include a spin coating method, a spray coating method, an ink-jet method, a dip coating method, a casting method, a die coating method, a roll coating method, a blade coating method, a bar coating method, a gravure coating method, a printing method, and the like.

In the light-emitting element of this embodiment mode, an EL layer to which the present invention is applied can be formed. Accordingly, application of the present invention makes it possible to easily form an EL layer included in a light-emitting element and to manufacture a light-emitting device including the light-emitting element.

Further, application of the present invention makes it possible to deposit a flat even film; therefore, a light-emitting device with excellent performance can be manufactured with high productivity.

Furthermore, application of the present invention makes it possible to form a minute pattern and to suppress deformation which is pattern deposition except a desired pattern; therefore, a high-definition light-emitting device can be manufactured.

In the present invention, unlike the case where the EL layer is formed by a wet process, it is not necessary to take into consideration solubility or the like of the layer which has been formed; therefore, a material to be deposited can be chosen from a wider range. Further, the number of layers to be stacked can be set freely. Accordingly, a light-emitting device having a desired stacked structure can be manufactured using a desired material.

Application of the present invention makes it possible to deposit a desired material on the deposition target substrate without being wasted; therefore, use efficiency of a material is increased, and manufacturing cost can be reduced. Moreover, materials can be prevented from being attached to an inner wall of a deposition chamber, and thus maintenance of the deposition apparatus can be facilitated.

Further, in the present invention, laser light having a high output can be used as a light source, and thus deposition on a large area can be performed at a time. Thus, time taken for manufacturing a light-emitting device (takt time) can be reduced, which can lead to increase in productivity.

Further, in the present invention, since the thickness of a film to be deposited on the deposition target substrate can be controlled by controlling the thickness of the material layer formed over the deposition substrate, a thickness monitor is not needed at the time of deposition on the deposition target substrate. Therefore, a user does not have to adjust the deposition rate with a thickness monitor, and the deposition steps can be fully automated. Accordingly, productivity can be increased.

In addition, application of the present invention makes it possible to uniformly deposit the material included in the material layer which is formed over the deposition substrate. In the case where the material layer includes plural kinds of materials, a film containing the same materials at roughly the same weight ratio as the material layer can be deposited on the deposition target substrate. Therefore, in the deposition method of the present invention, when deposition is performed using plural kinds of materials having different vaporization temperatures, a desired layer including different kinds of materials can be deposited easily with high precision without complicated control of the evaporation rate or the like.

Further, in the case of manufacturing a light-emitting device using the deposition substrate described in Embodiment Mode 2, layers which include the same material and have different thicknesses can be deposited in one deposition step. Accordingly, an optical design can be optimized in such a manner that layers which are used in common in light-emitting elements of each emission color are deposited so as to have different thicknesses without increasing the number of deposition steps. Therefore, performance of the light-emitting device (efficiency, color purity, or the like) can be improved.

Note that the structure described in this embodiment mode can be used in combination with any of the structures described in other embodiment modes, as appropriate.

Embodiment Mode 7

In this embodiment mode, a light-emitting device which is formed using the light-emitting element described in Embodiment Mode 6 will be described.

First, a passive-matrix light-emitting device will be described with reference to FIGS. 12A to 12C and FIG. 13.

In a passive-matrix (also called simple-matrix) light-emitting device, a plurality of anodes arranged in stripes (in strip form) are provided to be perpendicular to a plurality of cathodes arranged in stripes. A light-emitting layer is interposed at each intersection. Therefore, a pixel at an intersection of an anode which is selected (to which a voltage is applied) and a cathode which is selected emits light.

Figure 12A:
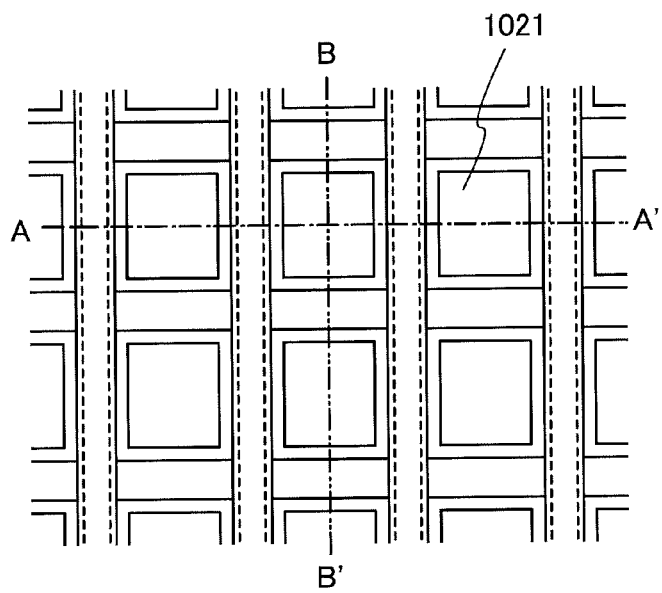
FIGS. 12A to 12C are views illustrating a passive matrix light-emitting device.
Figure 12C:
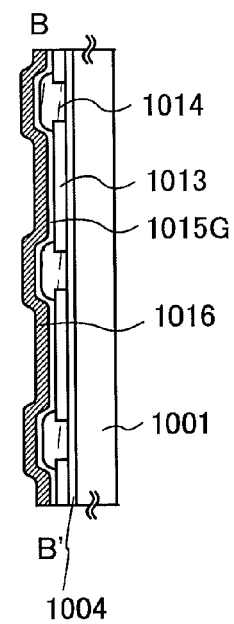
Figure 12B:
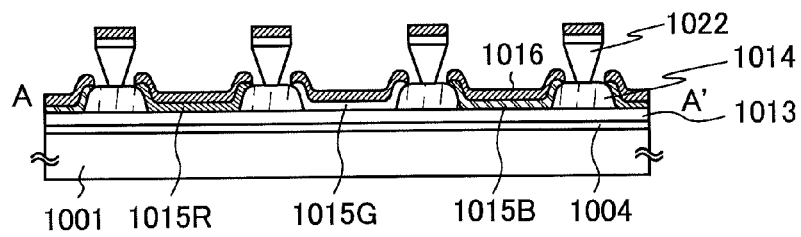

FIG. 12A illustrates a top view of a pixel portion before sealing. FIG. 12B illustrates a cross-sectional view taken along a dashed line A-A' in FIG. 12A. FIG. 12C illustrates a cross-sectional view taken along a dashed line B-B'.

Over a substrate 1001, an insulating layer 1004 is formed as a base insulating layer. Note that the base insulating layer is not necessarily provided if not necessary. A plurality of first electrodes 1013 are arranged in stripes at regular intervals over the insulating layer 1004. A partition wall 1014 having openings each corresponding to a pixel is provided over the first electrodes 1013. The partition wall 1014 having openings is formed using an insulating material (a photosensitive or nonphotosensitive organic material (polyimide, acrylic, polyamide, polyimide amide, or benzocyclobutene) or an SOG film (such as a $SiO_x$ film including an alkyl group)). Note that each opening corresponding to a pixel is a light-emitting region 1021.

Over the partition wall 1014 having openings, a plurality of inversely tapered partition walls 1022 which are parallel to each other are provided to intersect with the first electrodes 1013. The inversely tapered partition walls 1022 are formed by a photolithography method using a positive-type photosensitive resin, of which portion unexposed to light remains as a pattern, in which the amount of light exposure or the length of development time is adjusted so that a lower portion of a pattern is etched more.

The total thickness of the partition wall 1014 having openings and the inversely tapered partition wall 1022 is set to be larger than the total thickness of an EL layer and a second electrode 1016. Accordingly, an EL layer which is divided into plural regions, specifically an EL layer (R) (1015R) formed using a material which exhibits red light emission, an EL layer (G) (1015G) formed using a material which exhibits green light emission, and an EL layer (B) (1015B) formed using a material which exhibits blue light emission; and the second electrode 1016 are formed. Note that the plurality of separated regions are electrically isolated from each other.

The second electrodes 1016 are electrodes in stripes which are parallel to each other and extended along a direction intersecting with the first electrodes 1013. Note that the EL layer and part of a conductive layer which forms the second electrode 1016 are also formed over the inversely tapered partition walls 1022; however, they are separated from the EL layer (R) (1015R), the EL layer (G) (1015G), the EL layer (B) (1015B), and the second electrodes 1016. Note that the EL layer in this embodiment mode is a layer including at least a light-emitting layer and may include a hole-injecting layer, a hole-transporting layer, an electron-transporting layer, an electron-injecting layer, or the like, in addition to the light-emitting layer.

Here, an example is described in which the EL layer (R) (1015R), the EL layer (G) (1015G), and the EL layer (B) (1015B) are selectively formed to form a light-emitting device capable of performing full color display where three kinds of light emission (red (R), green (G), and blue (B)) can be provided. The EL layer (R) (1015R), the EL layer (G) (1015G), and the EL layer (B) (1015B) are formed into stripes parallel to each other. These EL layers may be formed by the deposition method described in any of Embodiment Modes 1 to 3.

Furthermore, if necessary, sealing is performed using a sealant such as a sealant can or a glass substrate for sealing. Here, a glass substrate is used as a sealing substrate, and a substrate and the sealing substrate are attached to each other with an adhesive material such as a sealant to seal a space surrounded by the adhesive material such as a sealant. The space that is sealed is filled with a filler or a dry inert gas. In addition, a desiccant or the like may be put between the substrate and the sealant so that reliability of the light-emitting device is increased. A small amount of moisture is removed by the desiccant, so that sufficient drying is performed. The desiccant may be a substance which absorbs moisture by chemical adsorption, such as oxide of an alkaline earth metal as typified by calcium oxide or barium oxide. Note that a substance which adsorbs moisture by physical adsorption such as zeolite or silica gel may alternatively be used.

Note that if the sealant is provided covering and in contact with the light-emitting element to sufficiently block the outside air, the desiccant is not necessarily provided.

Figure 13:
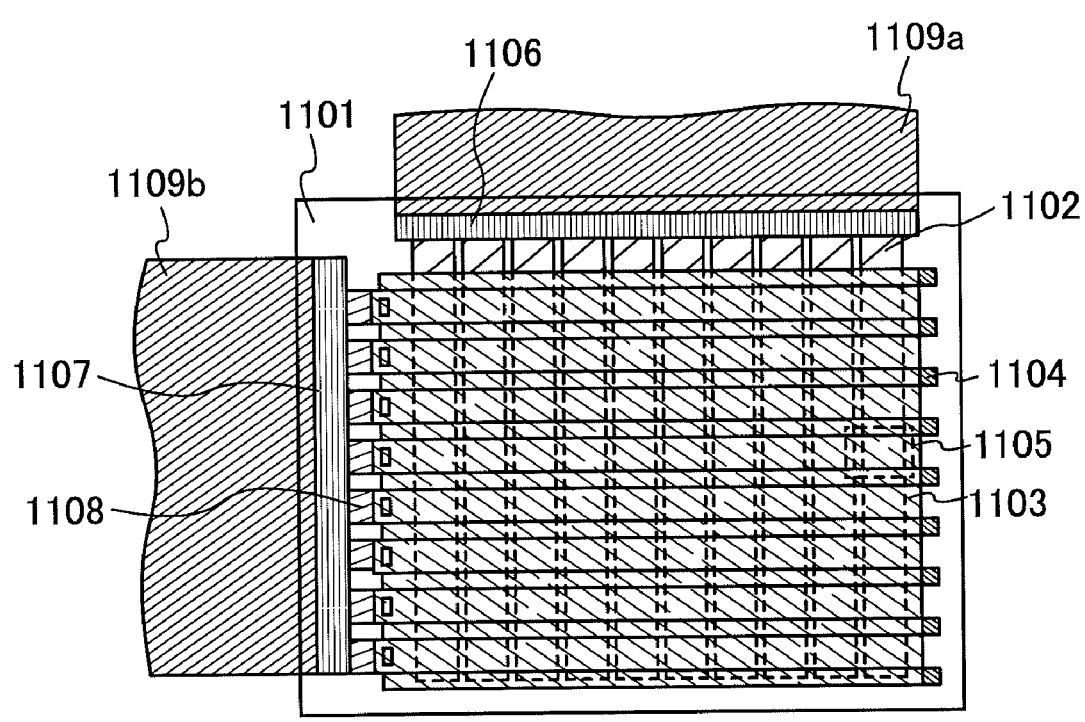
FIG. 13 is a view illustrating a passive matrix light-emitting device.

Next, FIG. 13 illustrates a top view of the case in which the passive-matrix light-emitting device in FIGS. 12A to 12C is mounted with an FPC or the like.

In FIG. 13, scan lines and data lines perpendicularly intersect with each other in a pixel portion for displaying images.

Here, the substrate 1001 in FIGS. 12A to 12C corresponds to a substrate 1101 in FIG. 13; the first electrodes 1013 correspond to scan lines 1103; the second electrodes 1016 correspond to data lines 1102; and the inversely tapered partition walls 1022 correspond to partition walls 1104. EL layers are sandwiched between the data lines 1102 and the scan lines 1103, and an intersection portion indicated by a region 1105 corresponds to one pixel.

Note that the scan line 1103 is electrically connected at the end to a connection wiring 1108, and the connection wiring 1108 is connected to an FPC 1109b through an input terminal 1107. The data line 1102 is connected to an FPC 1109a through an input terminal 1106.

If necessary, a polarizing plate, a circularly polarizing plate (including an elliptically polarizing plate), a retardation plate (a quarter-wave plate or a half-wave plate), or an optical film such as a color filter may be provided as appropriate on a light-emitting surface. Further, the polarizing plate or the circularly polarizing plate may be provided with an anti-reflection film. For example, an anti-glare treatment may be performed by which reflected light can be diffused by surface roughness so as to reduce glare.

Although FIG. 13 illustrates the example in which a driver circuit is not provided over the substrate, the present invention is not particularly limited to this example. An IC chip including a driver circuit may be mounted on the substrate.

In the case where an IC chip is mounted, a data line side IC and a scan line side IC in each of which a driver circuit for transmitting signals to the pixel portion is formed are mounted on the periphery of (outside of) the pixel portion by a COG method. The mounting may be performed using a TCP or a wire bonding method other than a COG method. A TCP is a TAB tape mounted with an IC, and the TAB tape is connected to a wiring over an element forming substrate for mounting the IC. Each of the data line side IC and the scan line side IC may be formed using a silicon substrate. Alternatively, a driver circuit may be formed using TFTs over a glass substrate, a quartz substrate, or a plastic substrate. Although described here is an example in which a single IC is provided on one side, a plurality of ICs may be provided on one side.

Next, an example of an active-matrix light-emitting device is described with reference to FIGS. 14A and 14B. Note that FIG. 14A is a top view illustrating a light-emitting device and FIG. 14B is a cross-sectional view taken along a dashed line A-A' in FIG. 14A. The active-matrix light-emitting device of this embodiment mode includes a pixel portion 1202 provided over an element substrate 1210, a driver circuit portion (a source-side driver circuit) 1201, and a driver circuit portion (a gate-side driver circuit) 1203. The pixel portion 1202, the driver circuit portion 1201, and the driver circuit portion 1203 are sealed, with a sealant 1205, between the element substrate 1210 and a sealing substrate 1204.

In addition, over the element substrate 1210, a lead wiring 1208 for connecting an external input terminal is provided through which a signal (e.g., a video signal, a clock signal, a start signal, a reset signal, or the like) or an electric potential is transmitted to the driver circuit portion 1201 and the driver circuit portion 1203. Here, an example is described in which a flexible printed circuit (FPC) 1209 is provided as the external input terminal. Note that only the FPC is illustrated here; however, the FPC may be provided with a printed wiring board (PWB). The light-emitting device in this specification includes not only the light-emitting device itself, but also the light-emitting device with an FPC or a PWB attached thereto.

Then, a cross-sectional structure is described with reference to FIG. 14B. While the driver circuit portion and the pixel portion are provided over the element substrate 1210, FIG. 14B only illustrates the driver circuit portion 1201 which is the source side driver circuit and the pixel portion 1202.

An example is illustrated in which a CMOS circuit which is a combination of an n-channel TFT 1223 and a p-channel TFT 1224 is formed as the driver circuit portion 1201: Note that a circuit included in the driver circuit portion may be formed using various CMOS circuits, PMOS circuits, or NMOS circuits. In this embodiment mode, a driver-integrated type in which a driver circuit is formed over a substrate where a pixel portion is formed is described; however, it is not necessarily to have such a structure, and a driver circuit can be formed not over but outside the substrate where a pixel portion is formed.

The pixel portion 1202 includes a plurality of pixels, each of which includes a switching TFT 1211, a current-controlling TFT 1212, and a first electrode 1213 which is electrically connected to a wiring (a source electrode or a drain electrode) of the current-controlling TFT 1212. Note that an insulator 1214 is formed covering an end portion of the first electrode 1213. Here, the insulator 1214 is formed using a positive photosensitive acrylic resin.

The insulator 1214 is preferably formed so as to have a curved surface with curvature at an upper end portion or a lower end portion in order to obtain favorable coverage by a film which is to be stacked over the insulator 1214. For example, in the case of using a positive photosensitive acrylic resin as a material for the insulator 1214, the insulator 1214 is preferably formed so as to have a curved surface with a curvature radius (0.2 μm to 3 μm) at the upper end portion thereof. Note that either a negative photosensitive material which becomes insoluble in an etchant by light irradiation or a positive photosensitive material which becomes soluble in an etchant by light irradiation can be used for the insulator 1214. As the insulator 1214, without limitation to an organic compound, either or both an organic compound and an inorganic compound such as silicon oxide or silicon oxynitride can be used.

An EL layer 1200 and a second electrode 1216 are stacked over the first electrode 1213. Note that when an ITO film is used as the first electrode 1213, and a stacked film of a titanium nitride film and a film containing aluminum as its main component or a stacked film of a titanium nitride film, a film containing aluminum as its main component, and a titanium nitride film is used as the wiring of the current-controlling TFT 1212 which is connected to the first electrode 1213, resistance of the wiring is low and favorable ohmic contact with the ITO film can be obtained. Note that although not illustrated, the second electrode 1216 is electrically connected to the FPC 1209 which is an external input terminal.

In the EL layer 1200, at least the light-emitting layer is provided, and in addition to the light-emitting layer, a hole-injecting layer, a hole-transporting layer, an electron-transporting layer, or an electron-injecting layer is provided as appropriate. The first electrode 1213, the EL layer 1200, and the second electrode 1216 are stacked, whereby a light-emitting element 1215 is formed.

Although the cross-sectional view in FIG. 14B illustrates only one light-emitting element 1215, a plurality of light-emitting elements are arranged in matrix in the pixel portion 1202. Light-emitting elements which provide three kinds of light emissions (R, G, and B) are formed in the pixel portion 1202, so that a light-emitting device capable of full color display can be formed. Alternatively, a light-emitting device capable of full color display may be formed by a combination with color filters.

Furthermore, the sealing substrate 1204 and the element substrate 1210 are attached to each other with the sealant 1205, whereby the light-emitting element 1215 is provided in a space 1207 surrounded by the element substrate 1210, the sealing substrate 1204, and the sealant 1205. Note that the space 1207 may be filled with the sealant 1205 or with an inert gas (such as nitrogen or argon).

Note that an epoxy-based resin is preferably used for the sealant 1205. It is preferable that such a material transmit as little moisture and oxygen as possible. As a material used for the sealing substrate 1204, a plastic substrate made of fiber-glass-reinforced plastics (FRP), polyvinyl fluoride (PVF), polyester, acrylic, or the like can be used besides a glass substrate or a quartz substrate.

As described above, a light-emitting device can be obtained by applying the present invention. Manufacturing cost of an active-matrix light-emitting device per substrate tends to increase as compared to that of a passive-matrix light-emitting device because TFTs are manufactured; however, application of the present invention makes it possible to reduce manufacturing cost of a light-emitting device.

Application of the present invention makes it possible to easily form an EL layer included in a light-emitting element and to manufacture a light-emitting device including the light-emitting element.

Further, application of the present invention makes it possible to deposit a flat even film; therefore, a light-emitting device with excellent performance can be manufactured with high productivity.

Furthermore, application of the present invention makes it possible to form a minute pattern and to suppress deformation which is pattern deposition except a desired pattern; therefore, a high-definition light-emitting device can be manufactured.

In the present invention, unlike the case where the EL layer is formed by a wet process, it is not necessary to take into consideration solubility or the like of the layer which has been formed; therefore, a material to be deposited can be chosen from a wider range. Further, the number of layers to be stacked can be set freely. Accordingly, a light-emitting device having a desired stacked structure can be manufactured using a desired material.

Application of the present invention makes it possible to deposit a desired material on the deposition target substrate without being wasted; therefore, use efficiency of a material is increased, and manufacturing cost can be reduced. Moreover, materials can be prevented from being attached to an inner wall of a deposition chamber, and thus maintenance of the deposition apparatus can be facilitated.

Further, in the present invention, laser light having a high output can be used as a light source, and thus deposition on a large area can be performed at a time. Thus, time taken for manufacturing the light-emitting device (takt time) can be reduced, which can lead to increase in productivity.

Further, in the present invention, since the thickness of a film to be deposited on the deposition target substrate can be controlled by controlling the thickness of the material layer formed over the deposition substrate, a thickness monitor is not needed at the time of deposition on the deposition target substrate. Therefore, a user does not have to adjust the deposition rate with a thickness monitor, and the deposition steps can be fully automated. Accordingly, productivity can be increased.

In addition, application of the present invention makes it possible to uniformly deposit the material included in the material layer which is formed over the deposition substrate. In the case where the material layer includes plural kinds of materials, a film containing the same materials at roughly the same weight ratio as the material layer can be deposited on the deposition target substrate. Therefore, in the deposition method of the present invention, when deposition is performed using plural kinds of materials having different vaporization temperatures, a desired layer including different kinds of materials can be deposited easily with high precision without complicated control of the evaporation rate or the like.

Further, in the case of manufacturing a light-emitting device using the deposition substrate described in Embodiment Mode 2, layers which include the same material and have different thicknesses can be deposited in one deposition step. Accordingly, an optical design can be optimized in such a manner that layers which are used in common in light-emitting elements of each emission color are deposited so as to have different thicknesses without increasing the number of deposition steps. Therefore, performance of the light-emitting device (efficiency, color purity, or the like) can be improved.

Note that the structure described in this embodiment mode can be used in combination with any of the structures described in other embodiment modes, as appropriate.

Embodiment Mode 8

In this embodiment mode, various electronic devices completed using the light-emitting device manufactured according to the present invention will be described with reference to FIGS. 15A to 15E.

Examples of electronic devices manufactured using the light-emitting device according to the present invention include a television, a camera such as a video camera or a digital camera, a goggle type display (head mounted display), a navigation system, an audio reproducing device (such as a car audio and an audio component), a laptop computer, a game machine, a portable information terminal (such as a mobile computer, a cellular phone, a portable game machine, and an electronic book reader), an image reproducing device provided with a recording medium (specifically, a device for reproducing a recording medium such as a digital video disc (DVD) and having a display device for displaying the reproduced image), a lighting device, and the like. Specific examples of these electronic devices are illustrated in FIGS. 15A to 15E.

Figure 15A:
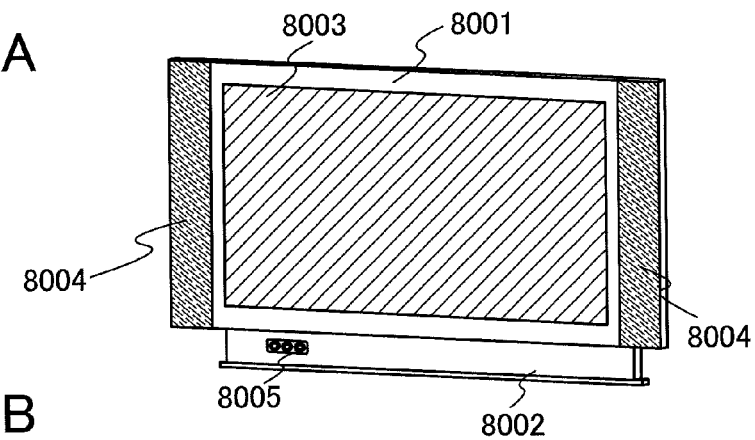
FIGS. 15A to 15E are views each illustrating an electronic device.

FIG. 15A illustrates a display device, which includes a chassis 8001, a support 8002, a display portion 8003, a speaker portion 8004, a video input terminal 8005, and the like. This display device is manufactured using, for the display portion 8003, a light-emitting device which is formed according to the present invention. Note that the display device includes all devices for displaying information in its category, such as for a computer, for receiving TV broadcasting, and for displaying an advertisement. According to the present invention, use efficiency of a material and manufacturing efficiency can be improved mainly in a deposition process of a light-emitting device, and performance of the light-emitting device can also be improved. Accordingly, manufacturing cost can be reduced and productivity can be increased in manufacturing a display device; thus, an inexpensive display device can be provided.

Figure 15B:
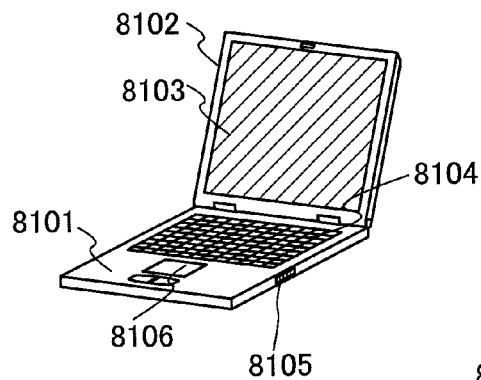

FIG. 15B illustrates a computer, which includes a main body 8101, a chassis 8102, a display portion 8103, a keyboard 8104, an external connecting port 8105, a pointing device 8106, and the like. This computer is manufactured using, for the display portion 8103, a light-emitting device which is formed according to the present invention. According to the present invention, use efficiency of a material and manufacturing efficiency can be improved mainly in a deposition process of a light-emitting device, and performance of the light-emitting device can also be improved. Accordingly, manufacturing cost can be reduced and productivity can be increased in manufacturing a computer; thus, an inexpensive computer can be provided.

Figure 15C:
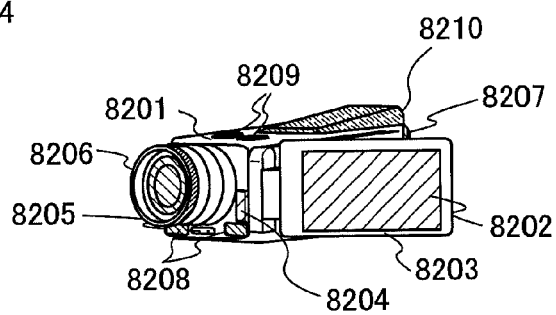

FIG. 15C illustrates a video camera, which includes a main body 8201, a display portion 8202, a chassis 8203, an external connecting port 8204, a remote control receiving portion 8205, an image receiving portion 8206, a battery 8207, an audio input portion 8208, operation keys 8209, an eye piece portion 8210, and the like. This video camera is manufactured using, for the display portion 8202, a light-emitting device which is formed according to the present invention. According to the present invention, use efficiency of a material and manufacturing efficiency can be improved mainly in a deposition process of a light-emitting device, and performance of the light-emitting device can also be improved. Accordingly, manufacturing cost can be reduced and productivity can be increased in manufacturing a video camera; thus, an inexpensive video camera can be provided.

Figure 15D:

FIG. 15D illustrates a desk lamp, which includes a lighting portion 8301, a shade 8302, an adjustable arm 8303, a support 8304, a base 8305, a power supply switch 8306, and the like. This desk lamp is manufactured using, for the lighting portion 8301, a light-emitting device which is formed according to the present invention. Note that a lamp includes a ceiling light, a wall light, and the like in its category. According to the present invention, use efficiency of a material and manufacturing efficiency can be improved mainly in a deposition process of a light-emitting device, and performance of the light-emitting device can also be improved. Accordingly, manufacturing cost can be reduced and productivity can be increased in manufacturing a desk lamp; thus, an inexpensive desk lamp can be provided.

Figure 15E:
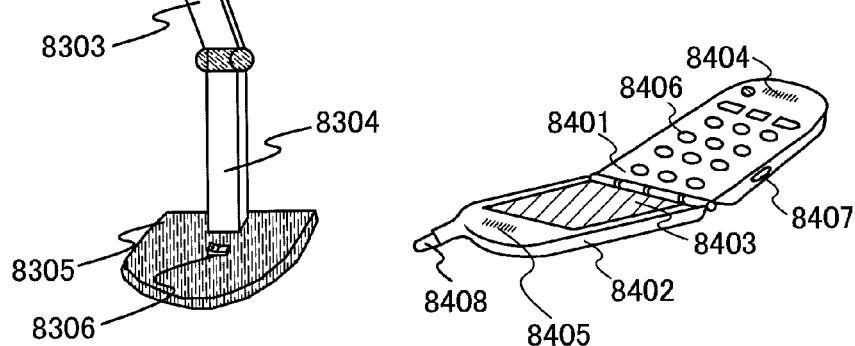

FIG. 15E illustrates a cellular phone, which includes a main body 8401, a chassis 8402, a display portion 8403, an audio input portion 8404, an audio output power portion 8405, operation keys 8406, an external connecting port 8407, an antenna 8408, and the like. This cellular phone is manufactured using, for the display portion 8403, a light-emitting device which is formed according to the present invention. According to the present invention, use efficiency of a material and manufacturing efficiency can be improved mainly in a deposition process of a light-emitting device, and performance of the light-emitting device can also be improved. Accordingly, manufacturing cost can be reduced and productivity can be increased in manufacturing a cellular phone; thus, an inexpensive cellular phone can be provided.

Figure 16A:
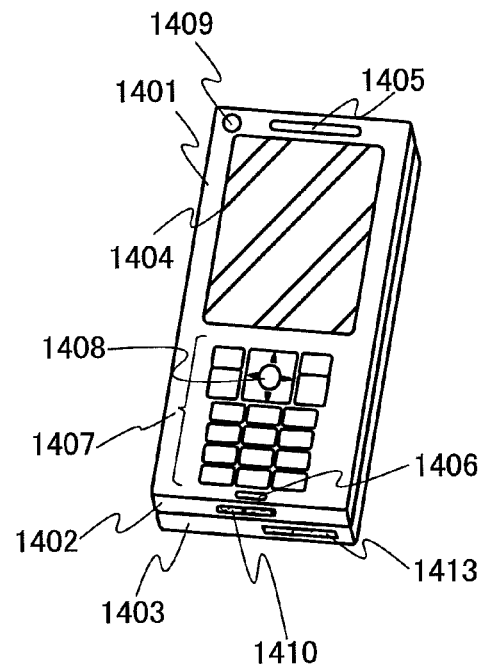
FIGS. 16A to 16C are views illustrating an electronic device.
Figure 16B:
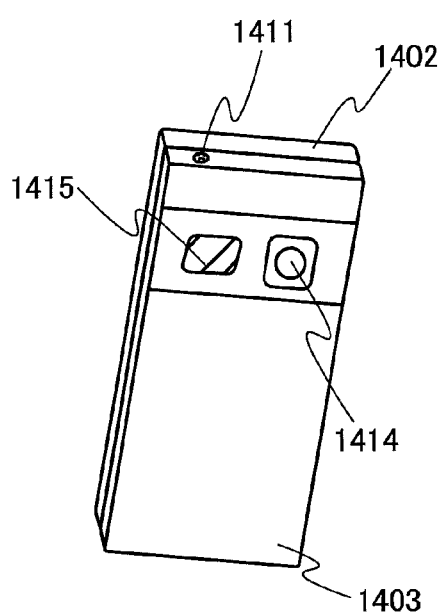
Figure 16C:
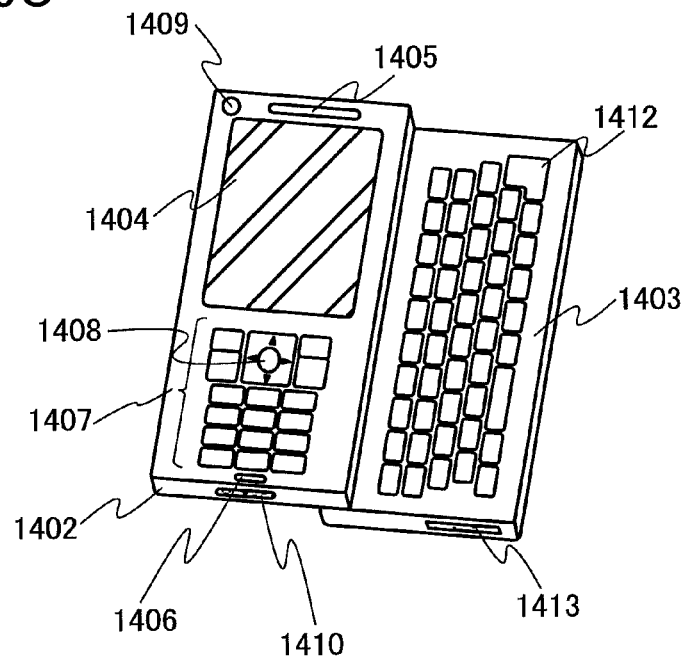

FIGS. 16A to 16C also illustrate a cellular phone and FIG. 16A is a front view, FIG. 16B is a rear view, and FIG. 16C is a development view. A main body 1401 is a so-called smartphone which has both functions of a cellular phone and a portable information terminal, and incorporates a computer and can process a variety of data processing in addition to voice calls.

The main body 1401 has two chassis, a chassis 1402 and a chassis 1403. The chassis 1402 includes a display portion 1404, a speaker 1405, a microphone 1406, operation keys 1407, a pointing device 1408, a camera lens 1409, an external connection terminal 1410, an earphone terminal 1411, and the like, while the chassis 1403 includes a keyboard 1412, an external memory slot 1413, a camera lens 1414, a light 1415, and the like. In addition, an antenna is incorporated in the chassis 1402.

Further, in addition to the above-described structure, the smartphone may incorporate a non-contact IC chip, a small size memory device, or the like.

The light-emitting device described in any of the above embodiment modes can be incorporated in the display portion 1404, and a display orientation can be changed as appropriate according to a usage pattern. Because the camera lens 1409 is provided in the same plane as the display portion 1404, the smartphone can be used as a videophone. Further, a still image and a moving image can be taken with the camera lens 1414 and the light 1415, using the display portion 1404 as a viewfinder. The speaker 1405 and the microphone 1406 can be used for video calling, recording, playback, and the like without being limited to voice calls.

With operation keys 1407, making and receiving calls, inputting simple information such as e-mails, scrolling the screen, moving the cursor, and the like are possible. Furthermore, the chassis 1402 and the chassis 1403 (FIG. 16A) which are overlapped with each other are slid to expose the chassis 1403 as illustrated in FIG. 16C, and can be used as a portable information terminal. At this time, smooth operation can be conducted using the keyboard 1412 and the pointing device 1408. The external connection terminal 1410 can be connected to an AC adaptor and various types of cables such as a USB cable, and charging, data communication with a computer, or the like is possible. Furthermore, a large amount of data can be stored and moved by inserting a recording medium into the external memory slot 1413.

In addition to the above-described functions, the smartphone may have an infrared communication function, a television receiver function, or the like.

Note that the above-described cellular phone is manufactured using, for the display portion 1404, a light-emitting device which is formed according to the present invention. According to the present invention, use efficiency of a material and manufacturing efficiency can be improved mainly in a deposition process of a light-emitting device, and performance of the light-emitting device can also be improved. Accordingly, manufacturing cost can be reduced and productivity can be increased in manufacturing a cellular phone; thus, an inexpensive cellular phone can be provided.

As described above, an electronic device or a lighting device can be obtained by using the light-emitting device according to the present invention. The range of application of the light-emitting device according to the present invention is so wide that the light-emitting device can be applied to electronic devices of various fields.

Note that the structure described in this embodiment mode can be used in combination with any of the structures described in other embodiment modes, as appropriate.

This application is based on Japanese Patent Application serial no. 2008-068542 filed with Japan Patent Office on Mar. 17, 2008, the entire contents of which are hereby incorporated by reference.

What is claimed is:

1. A deposition method comprising the steps of:
   providing a first light absorption layer on a first surface of a first substrate;
   providing a material layer over and in contact with the first light absorption layer and the first surface of the first substrate,
   providing a second light absorption layer on a second surface opposite to the first surface of the first substrate;
   making the first surface of the first substrate and a deposition target surface of a second substrate face to each other; and
   depositing part of the material layer on the deposition target surface of the second substrate in such a manner that irradiation with laser light having a repetition rate of greater than or equal to 10 MHz and a pulse width of greater than or equal to 100 fs and less than or equal to 10 ns is performed in a direction from the second surface of the first substrate to the first surface of the first substrate through the first substrate to selectively heat part of the material layer which overlaps with the first light absorption layer,
   wherein the first light absorption layer comprises metal nitride.

2. The deposition method according to claim 1, wherein the first light absorption layer has a reflectance of less than or equal to 70% with respect to light.

3. The deposition method according to claim 1, wherein a film thickness of the first light absorption layer is greater than or equal to 10 nm and less than or equal to 600 nm.

4. The deposition method according to claim 1, wherein the metal nitride is any of titanium nitride, tantalum nitride, molybdenum nitride, tungsten nitride, or chromium nitride.

5. The deposition method according to claim 1, wherein a ratio of the content of nitrogen atoms to metal atoms in the first light absorption layer is greater than or equal to 0.1 and less than or equal to 1.3, when the number of metal atoms is considered to be 1.

6. The deposition method according to claim 1, wherein the first light absorption layer is formed in an island-like shape.

7. The deposition method according to claim 1, wherein the first light absorption layer is formed in a stripe shape.

8. The deposition method according to claim 1, wherein the material layer is formed by a wet method.

9. The deposition method according to claim 1, wherein the material layer includes an organic compound.

10. The deposition method according to claim 1, wherein the laser light is shaped into linear or rectangular light.

11. A method for manufacturing a light-emitting device using the deposition method according to claim 1, wherein part of the material layer is deposited over a first electrode which is formed on the deposition target surface of the second substrate.

12. The method for manufacturing a light-emitting device according to claim 11, wherein the material layer includes one of or both a light-emitting material and a carrier-transporting material.

13. A deposition method comprising the steps of:
   providing a light absorption layer on a first surface of a first substrate;
   providing a material layer over and in contact with the light absorption layer and the first surface of the first substrate;
   making the first surface of the first substrate and a deposition target surface of a second substrate face to each other; and
   depositing part of the material layer on the deposition target surface of the second substrate in such a manner that irradiation with laser light having a repetition rate of greater than or equal to 10 MHz and a pulse width of greater than or equal to 100 fs and less than or equal to 10 ns is performed in a direction from a second surface opposite to the first surface of the first substrate to the first surface of the first substrate through the first substrate to selectively heat part of the material layer which overlaps with the light absorption layer,
   wherein the light absorption layer comprises chromium nitride.

14. The deposition method according to claim 13, wherein the light absorption layer has a reflectance of less than or equal to 70% with respect to light.

15. The deposition method according to claim 13, wherein a film thickness of the light absorption layer is greater than or equal to 10 nm and less than or equal to 600 nm.

16. The deposition method according to claim 13, wherein a ratio of the content of nitrogen atoms to chromium atoms in the light absorption layer is greater than or equal to 0.1 and less than or equal to 1.3, when the number of metal atoms is considered to be 1.

17. The deposition method according to claim 13, wherein the light absorption layer is formed in an island-like shape.

18. The deposition method according to claim 13, wherein the light absorption layer is formed in a stripe shape.

19. The deposition method according to claim 13, wherein the material layer is formed by a wet method.

20. The deposition method according to claim 13, wherein the material layer includes an organic compound.

21. The deposition method according to claim 13, wherein the laser light is shaped into linear or rectangular light.

22. A method for manufacturing a light-emitting device using the deposition method according to claim 13, wherein part of the material layer is deposited over a first electrode which is formed on the deposition target surface of the second substrate.

23. The method for manufacturing a light-emitting device according to claim 22, wherein the material layer includes one of or both a light-emitting material and a carrier-transporting material.

* * * * *